United States Patent
Chang et al.

(10) Patent No.: US 11,842,927 B2
(45) Date of Patent: Dec. 12, 2023

(54) SEMICONDUCTOR STRUCTURE

(71) Applicant: TAIWAN SEMICONDUCTOR MANUFACTURING COMPANY LTD., Hsinchu (TW)

(72) Inventors: I-Ming Chang, Hsinchu (TW); Chung-Liang Cheng, Changhua County (TW); Hsiang-Pi Chang, New Taipei (TW); Hung-Chang Sun, Kaohsiung (TW); Yao-Sheng Huang, Kaohsiung (TW); Yu-Wei Lu, Taipei (TW); Fang-Wei Lee, Hsinchu (TW); Ziwei Fang, Hsinchu (TW); Huang-Lin Chao, Hillsboro, OR (US)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 129 days.

(21) Appl. No.: 17/330,272

(22) Filed: May 25, 2021

(65) Prior Publication Data
US 2021/0280468 A1 Sep. 9, 2021

Related U.S. Application Data

(62) Division of application No. 16/373,235, filed on Apr. 2, 2019, now Pat. No. 11,031,291.
(Continued)

(51) Int. Cl.
*H01L 27/088* (2006.01)
*H01L 21/8234* (2006.01)
(Continued)

(52) U.S. Cl.
CPC ........... *H01L 21/823431* (2013.01); *H01L 21/02532* (2013.01); *H01L 21/324* (2013.01);
(Continued)

(58) Field of Classification Search
CPC .......... H01L 27/0924; H01L 27/0886; H01L 21/823821; H01L 29/161; H01L 29/66795; H01L 29/785
See application file for complete search history.

(56) References Cited

U.S. PATENT DOCUMENTS 7,018,901 B1 3/2006 Thean et al.
9,425,196 B1 * 8/2016 Cheng ............ H01L 21/823431
(Continued)

FOREIGN PATENT DOCUMENTS

CN 1665000 A 9/2005
CN 103187297 A 7/2013
(Continued)

OTHER PUBLICATIONS

Office Action and Cited References dated Jul. 6, 2021 issued by the Korean Intellectual Property Office for the Korean Counterpart Application No. 10-2021-0085625.
(Continued)

*Primary Examiner* — Tucker J Wright
(74) *Attorney, Agent, or Firm* — WPAT LAW; Anthony King

(57) ABSTRACT

A semiconductor structure includes a substrate including a first region and a second region, a first channel layer disposed in the first region and a second channel layer disposed in the second region, a first dielectric layer disposed on the first channel layer and a second dielectric layer disposed on the second channel layer, and a first gate electrode disposed on the first dielectric layer and a second gate electrode disposed on the second dielectric layer. The first channel layer in the first region includes Ge compound of a first Ge concentration, the second channel layer in the second region includes Ge compound of a second Ge concentration. The first Ge concentration in the first channel layer is greater than the second Ge concentration in the second channel layer.

20 Claims, 45 Drawing Sheets

Related U.S. Application Data

(60) Provisional application No. 62/772,338, filed on Nov. 28, 2018.

(51) Int. Cl.
| | |
|---|---|
| *H01L 21/324* | (2006.01) |
| *H01L 21/768* | (2006.01) |
| *H01L 29/66* | (2006.01) |
| *H01L 29/78* | (2006.01) |
| *H01L 29/161* | (2006.01) |
| *H01L 21/02* | (2006.01) |
| *H01L 29/423* | (2006.01) |
| *H01L 21/8238* | (2006.01) |

(52) U.S. Cl.
CPC ......... *H01L 21/76832* (2013.01); *H01L 21/823418* (2013.01); *H01L 21/823437* (2013.01); *H01L 21/823462* (2013.01); *H01L 21/823857* (2013.01); *H01L 27/0886* (2013.01); *H01L 29/161* (2013.01); *H01L 29/42392* (2013.01); *H01L 29/66545* (2013.01); *H01L 29/66795* (2013.01); *H01L 29/785* (2013.01)

(56) References Cited

U.S. PATENT DOCUMENTS

| | | | |
|---|---|---|---|
| 9,484,266 | B1 | 11/2016 | Balakrishnan et al. |
| 9,564,435 | B2 | 2/2017 | Chung et al. |
| 2015/0137268 | A1* | 5/2015 | Fung .................. H01L 29/785 |
| | | | 438/299 |
| 2016/0013308 | A1* | 1/2016 | Lee .................. H01L 29/785 |
| | | | 257/401 |
| 2016/0351673 | A1 | 12/2016 | Lai et al. |
| 2017/0040227 | A1 | 2/2017 | Balakrishnan et al. |
| 2017/0154958 | A1 | 6/2017 | Fung et al. |

FOREIGN PATENT DOCUMENTS

| | | |
|---|---|---|
| CN | 106876275 A | 6/2017 |
| CN | 107017205 A | 8/2017 |
| CN | 108110059 A | 6/2018 |
| CN | 108807271 A | 11/2018 |
| CN | 104009086 B | 12/2019 |
| KR | 20160043455 A | 4/2016 |
| KR | 10-2016-0140313 A | 12/2016 |

OTHER PUBLICATIONS

US20160351673A1 Corresponds to KR 10-2016-0140313 A.
U.S. Pat. No. 9,564,435B2 corresponds to KR20160043455A.
US 2020/0357795 A1 is the US counterpart of CN 108110059 A.
U.S. Pat. No. 10,297,505 B2 is the US counterpart of CN 108807271 A.
U.S. Pat. No. 10,069,010 B2 is the US counterpart of CN 104009086 B.
U.S. Pat. No. 7,060,539 B2 is the US counterpart of CN 1665000 A.
U.S. Pat. No. 9,583,399 B1 is the US counterpart of CN 107017205 A.
English Abstract of CN103187297A.
U.S. Pat. No. 9,627,540 B1 is the US counterpart of CN 106876275 A.

\* cited by examiner

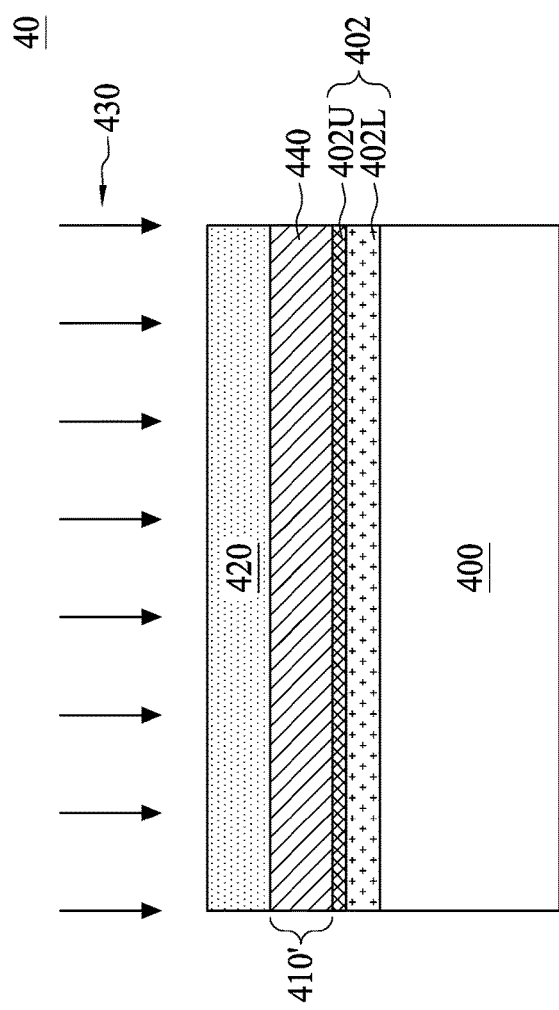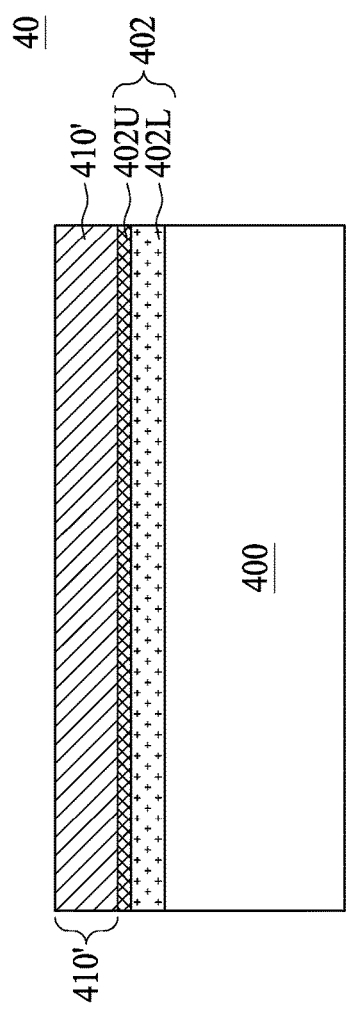

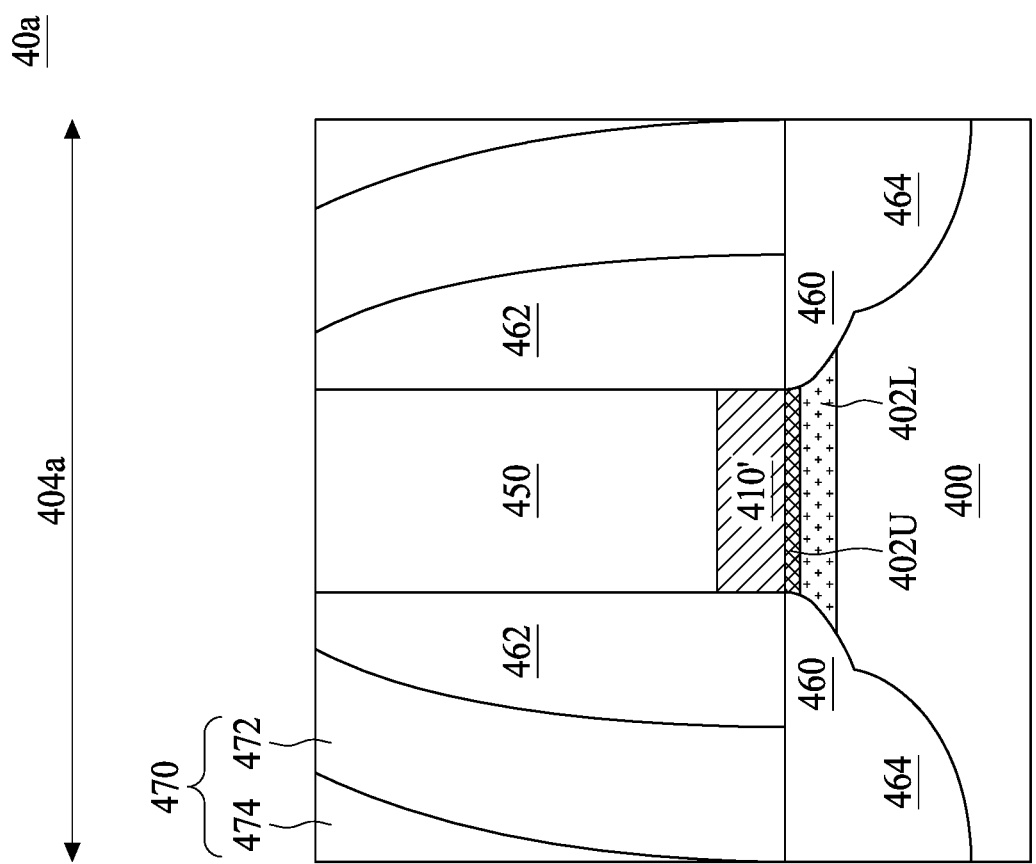

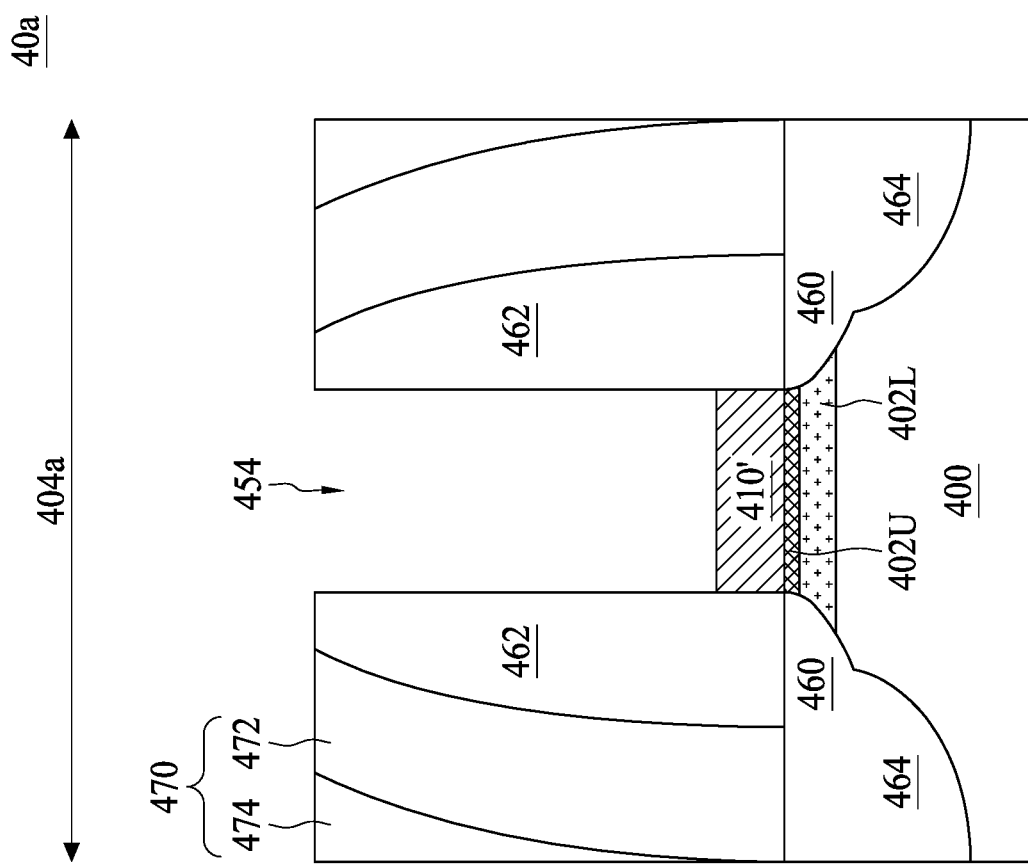

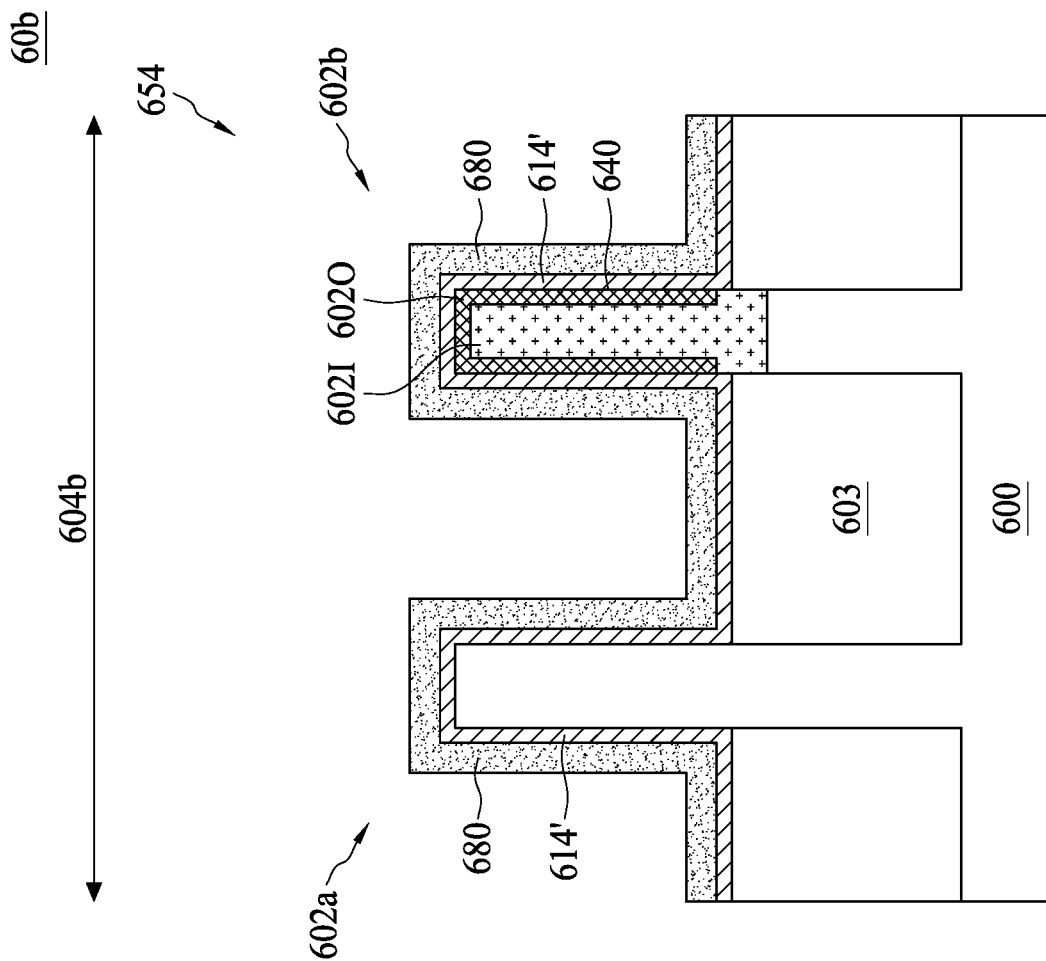

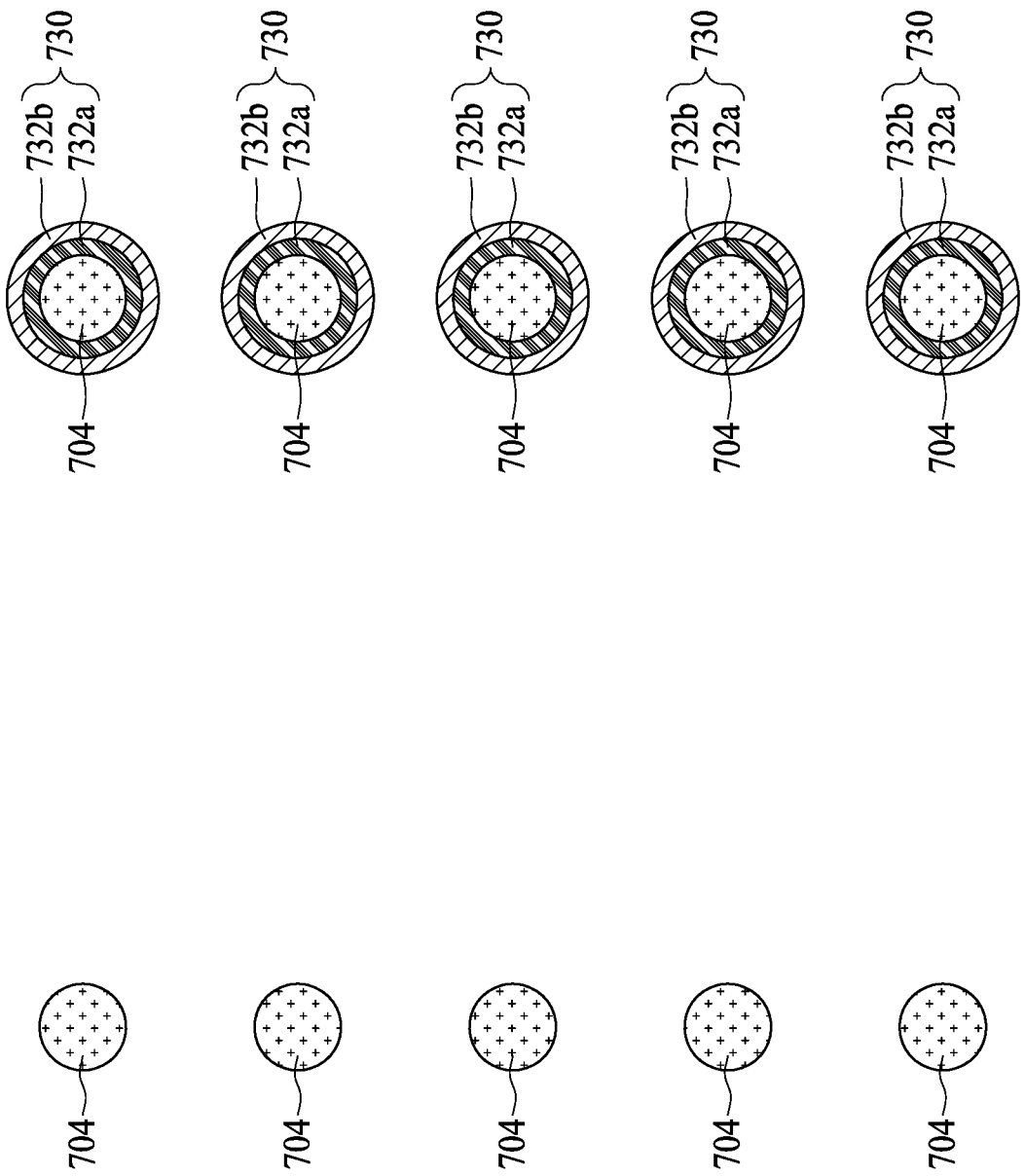

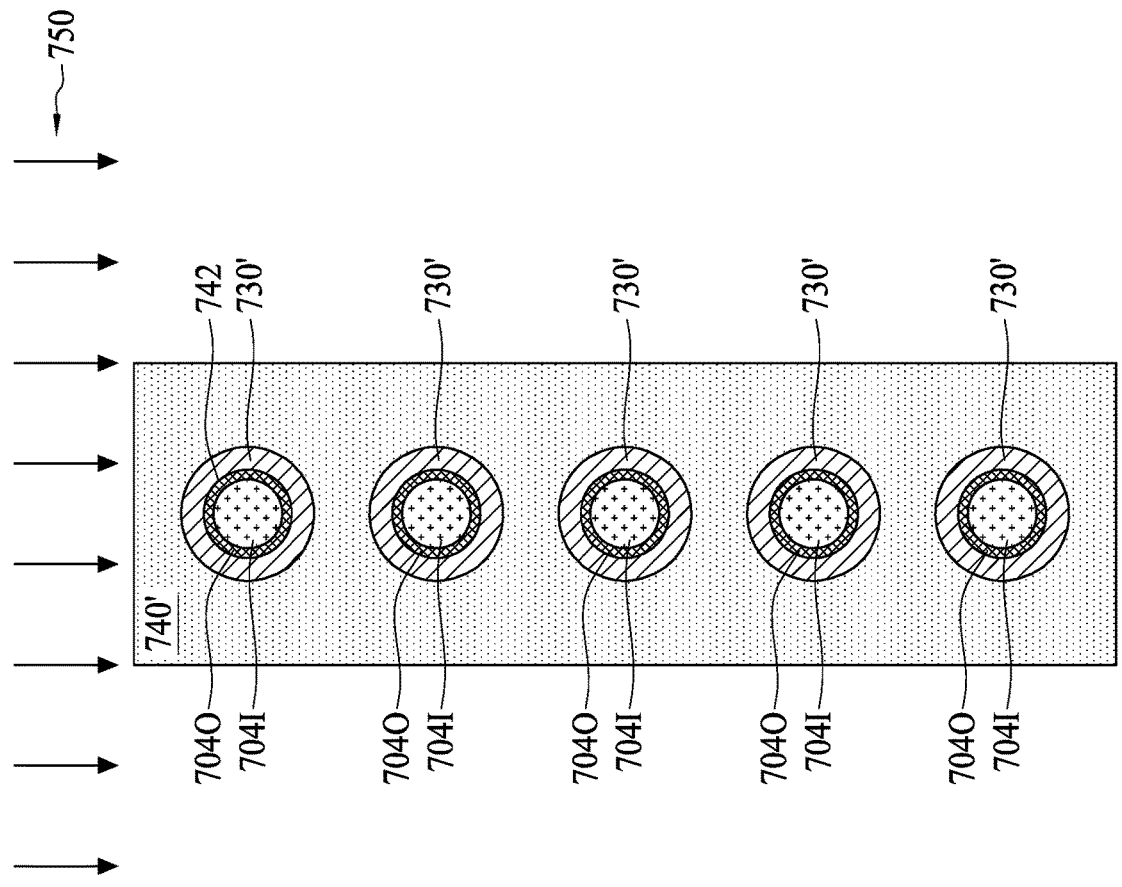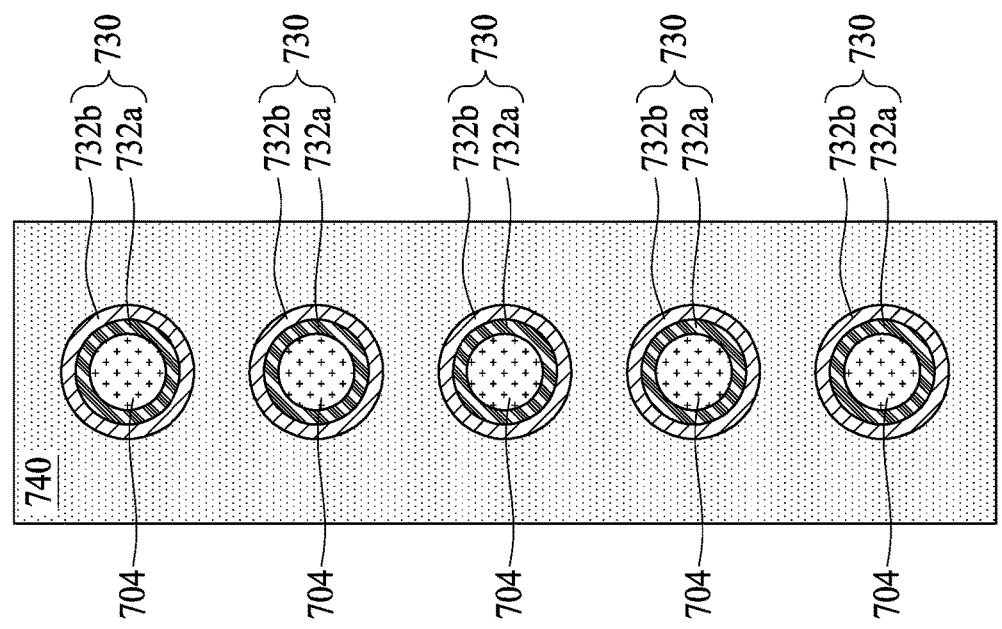

SEMICONDUCTOR STRUCTURE

PRIORITY DATA

This patent is a divisional application of U.S. patent application Ser. No. 16/373,235 filed Apr. 2, 2019, which claims the benefit of U.S. Provisional Patent Application Ser. No. 62/772,338 filed Nov. 28, 2018, the entire disclosure of which is hereby incorporated by reference.

BACKGROUND

In the semiconductor art, it is desirable to improve transistor performance even as devices become smaller with ongoing reductions in scale. Strain-induced band structure modification and mobility enhancement, which are used to increase drive current, are an attractive approach to improving transistor performance. For example, enhanced electron mobility in silicon would improve performance of an n-type metal-oxide-semiconductor (nMOS) device while enhanced hole mobility in silicon germanium (SiGe) would improve performance of a p-type MOS (pMOS) device.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 4A to 4F are schematic drawings illustrating a semiconductor structure at various fabrication stages constructed according to aspects of the present disclosure in one or more embodiments.

FIGS. 6A to 6D are schematic drawings illustrating a semiconductor structure at various fabrication stages constructed according to aspects of the present disclosure in one or more embodiments.

FIGS. 14A to 14H are schematic drawings illustrating a semiconductor structure at various fabrication stages constructed according to aspects of the present disclosure in one or more embodiments.

FIGS. 17A to 17F are cross-sectional views taken along a line I-I' of FIG. 16 illustrating a semiconductor structure at various fabrication stages constructed according to aspects of the present disclosure in one or more embodiments.

DETAILED DESCRIPTION

Figure 1:
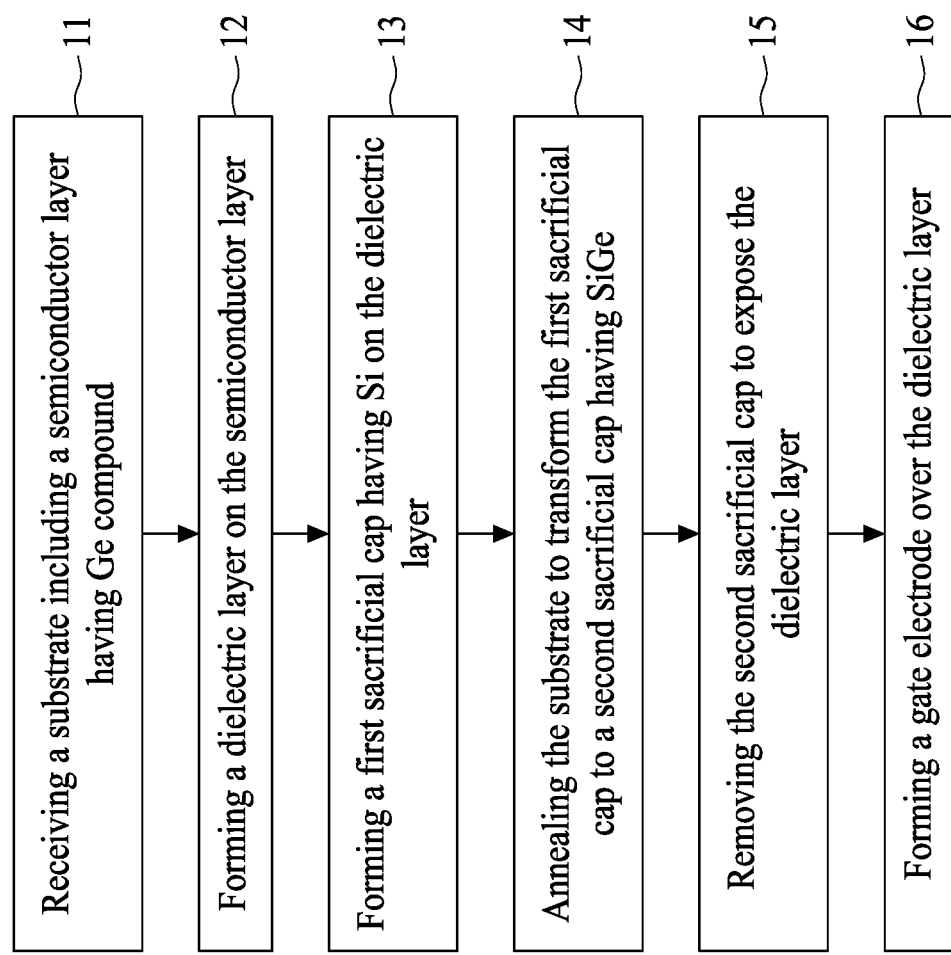
FIG. 1 is a flow diagram of some embodiments of a method of forming a dielectric layer.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature on or over a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of brevity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, regions, layers and/or sections, but these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

SiGe is a semiconductor material that has a band gap smaller than that of silicon and can be controlled by varying Ge content. SiGe used in combination with silicon produces a heterojunction that provides low junction leakage and high mobility. In some embodiments, metal oxide semiconductor field effect transistor (MOSFET) devices have a SiGe channel that extends between a source region and a drain region. A gate electrode, configured to control the flow of charge carriers from the source region to the drain region, is separated from the SiGe channel by a gate dielectric layer. It is found that when the SiGe channel and the gate dielectric layer abut one another, Ge atoms may diffuse into the gate dielectric layer from the SiGe channel layer. Consequently, gate leakage current (Jg) is increased and reliability is reduced.

To mitigate this problem different approaches are developed. For example, a thicker gate dielectric layer is formed on the SiGe channel layer in some comparative embodiments, but a SiGe loss issue is raised. Further, the oxidation of the SiGe layer will form a silicon germanium oxide layer having a high interface trap density (Dit) that captures mobile charge carriers and results in low mobility. In other comparative embodiments, a thick gate dielectric layer is deposited on the SiGe channel layer, but such approach suffers from high interface state density. It is found that the interface between the deposited gate dielectric layer and the SiGe layer generally has unsatisfied bonds that act as interface charging centers, causing the "interface states". The high density of such interface states indicates low quality of the deposited gate dielectric material and results in carrier mobility degradation.

In still other comparative embodiments, a thin silicon cap layer may be formed between the SiGe channel layer and the gate dielectric layer. The silicon cap layer prevents diffusion of Ge atoms from the SiGe channel layer to the gate dielectric layer. However, it is found that if the silicon cap layer is not formed to an optimum thickness, the benefits of the SiGe channel layer are reduced. For example, when the silicon cap layer is too thin, Ge atoms may be able to diffuse into the silicon cap layer, and thus the silicon cap layer is transformed into a SiGe layer. The silicon cap layer therefore provides no function. Alternatively, if the silicon cap layer is too thick, the silicon cap layer becomes a part of the channel resulting in a high effective oxide thickness (EOT) and partial or full carrier spill over the silicon cap layer that reduces mobility. In advanced technology nodes, even a silicon cap layer formed to meet the optimal thickness is not able to meet the balance between an EOT scaling (e.g., below 1 nm) and a high mobility. Additionally, the use of the silicon cap layer increases process cost.

Accordingly, the present disclosure provides a cap-free design for a gate dielectric layer on a SiGe channel layer. According to the cap-free design of the present disclosure, a dielectric layer is formed over a SiGe layer where a channel is to be formed, and a sacrificial semiconductor layer is formed on the dielectric layer. An anneal is subsequently performed. During the anneal, Ge atoms may diffuse from the SiGe layer, pass the first dielectric layer, and stay in the sacrificial semiconductor layer. The sacrificial semiconductor layer including the Ge atoms is then removed. Further, an interface between the SiGe layer and the dielectric layer can be improved during the anneal. Consequently, a dielectric layer having low interface trap density is obtained without SiGe loss. The dielectric layer used in a pMOS device having the SiGe layer where the channel is to be formed reduces gate leakage current and thus improves reliability. Accordingly, the cap-free design for the gate dielectric layer on a SiGe channel layer offers an opportunity to achieve high mobility and improve transistor performance.

It should be noted that the cap-free dielectric design can be integrated in planar transistor devices and non-planar transistor devices, such as tri-gate, FinFET and gall-all-around (GAA) architectures. It should also be noted that the present disclosure presents embodiments in the form of multi-gate transistors or fin-type multi-gate transistors referred to herein as FinFET devices. The FinFET devices may be GAA devices, Omega-gate (a-gate) devices, Pi-gate (H-gate) devices, dual-gate devices, tri-gate devices, bulk devices, silicon-on-insulator (SOI) devices, and/or other configurations. One of ordinary skill may recognize other examples of semiconductor devices that may benefit from aspects of the present disclosure.

Further, the cap-free dielectric design of the present disclosure can also be integrated in gate-last approach or a replacement-gate (RPG) approach.

FIG. 1 is a flow diagram of some embodiments of a method of forming a dielectric layer, and FIGS. 2A to 2D are schematic drawings illustrating the method of forming the dielectric layer at various fabrication stages. In some embodiments, a method of forming a dielectric layer 10 is provided. The method 10 includes a number of operations (11, 12, 13, 14, 15 and 16).

Figure 2B:
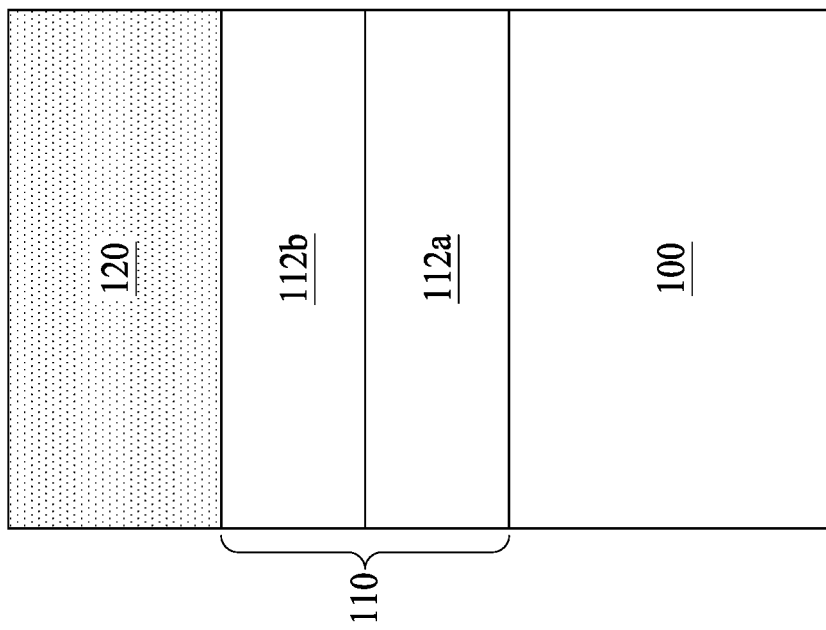
FIGS. 2A to 2D are schematic drawings illustrating the method of forming the dielectric layer at various fabrication stages.
Figure 2A:
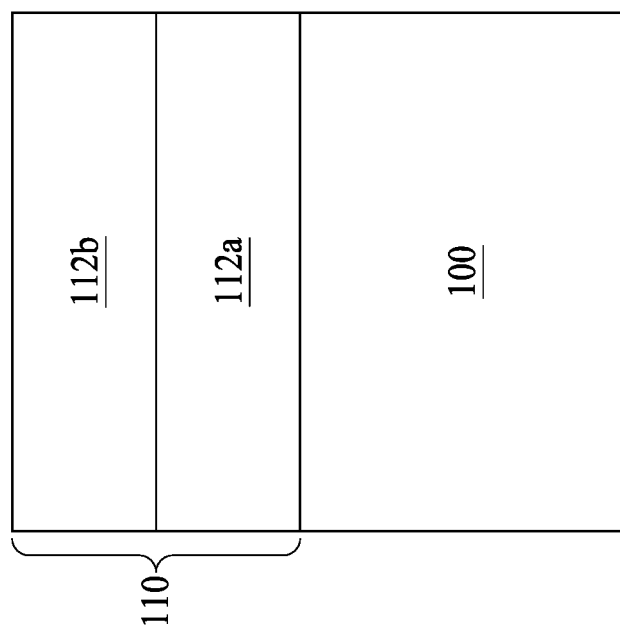

Referring to FIGS. 1 and 2A, a substrate including a semiconductor layer 100 including a germanium (Ge) compound is received in operation 11. In some embodiments, the semiconductor layer 100 includes at least two semiconductor materials having different lattice constants. For example but not limited thereto, the semiconductor layer 100 may include silicon germanium ($Si_{1-x}Ge_x$), wherein the germanium content, x, ranges from 0 to 1. In some embodiments, the Ge content may be greater than 0.3, but the disclosure is not limited thereto. The Ge content in the semiconductor layer 100 will be discussed in more detail in the following description. In some embodiments, the semiconductor layer 100 may include gallium arsenide (GaAs), indium phosphide (InP), aluminum gallium arsenide (AlGaAs), indium arsenide (InAs), or any other similar III-V material. In some embodiments, the semiconductor layer 100 is formed within the substrate. In some embodiments, at least a fin structure is disposed over the substrate and protrudes from the substrate. Further, the fin structure includes the semiconductor layer 100. In some embodiments, a plurality of nanowires is disposed over the substrate. Further, each nanowire includes the semiconductor layer 100.

In operation 12, a dielectric layer 110 is formed on the semiconductor layer 100. In some embodiments, the dielectric layer 110 can include a semiconductor oxide. For example, the dielectric layer 110 may include a silicon oxide ($SiO_x$) layer, such as a silicon dioxide ($SiO_2$) layer, but the disclosure is not limited thereto. In some embodiments, the dielectric layer 110 may include a first dielectric layer 112a and a second dielectric layer 112b. As shown in FIG. 2A, the first dielectric layer 112a is sandwiched between the second dielectric layer 112b and the semiconductor layer 100. In some embodiments, the first dielectric layer 112a may be a III-V compound semiconductor oxide layer. For example but not limited thereto, the first dielectric layer 112a may be a silicon germanium oxide ($Si_xGe_yO$) layer, wherein x is between approximately 0.6 and approximately 1, and y is between approximately 0.4 and approximately 0. In some embodiments, the III-V compound semiconductor oxide layer may be a native oxide layer that is spontaneously grown on a surface of the semiconductor layer 100. For example, the first dielectric layer 112a may be a native silicon germanium oxide layer spontaneously grown on a surface of the semiconductor layer 100. The second dielectric layer 112b may be a silicon oxide layer. In some embodiments, the second dielectric layer 112b (i.e., the silicon oxide layer) may be a chemical oxide layer, and the second dielectric layer 112b can be formed by suitable thermal oxidation or deposition. In some embodiments, the second dielectric layer 112b can be formed by ozone ($O_3$) and $H_2O$. In some embodiments, the second dielectric layer 112b can be formed by an ozone assisted sub-atmospheric pressure thermal chemical vapor deposition (SACVD), but the disclosure is not limited thereto. In some embodiments, the second dielectric layer 112b can be formed by $H_2SO_4$ and $H_2O$. In some embodiments, both of the first and second dielectric layers 112a and 112b can be formed by $O_3$ and $H_2O$ or by $H_2SO_4$ and $H_2O$, but the disclosure is not limited thereto. In some embodiments, the second dielectric layer 112b can be formed by thermal oxidation and deposition. For example, the second dielectric layer 112b can be formed by a thermal oxidation and a plasma-enhanced atomic layer deposition (PEALD). In some embodiments, both of the first and second dielectric layers 112a and 112b can be formed by thermal oxidation and deposition. In some embodiments, bis(diethylamino)silane ($SiH_2(NEt_2)_2$, SAM 24), N,N-diisopropylaminosilane (DIPAS, LTO520), tetrakis-dimethylaminosilane ($SiH(NMe_2)_3$, TDMAS), $Si_2C_{16}$, silane ($SiH_4$), disilane ($Si_2H_6$), nitrogen ($N_2$), oxygen ($O_2$), nitrous oxide ($N_2O$) and ozone can be used in the PEALD. In some embodiments, a thickness of the dielectric layer 110 is between approximately 10 angstroms (Å) and approximately 50 Å, but the disclosure is not limited thereto. In other embodiments, a thickness of the dielectric layer 110 is less than 20 Å, but the disclosure is not limited thereto.

Referring to FIGS. 1 and 2B, a first sacrificial cap 120 including silicon is formed on the dielectric layer 110 in operation 13. In some embodiments, the first sacrificial cap 120 may include an amorphous silicon layer or a polysilicon layer. In some embodiments, a thickness of the first sacrificial cap 120 is greater than 20 Å, but the disclosure is not limited thereto. In some embodiments, the first sacrificial cap 120 can be formed by silane, disilane, trisilane ($Si_3H_8$), LTO520, tetrasilane ($Si_4H_{10}$) and $N_2$, but the disclosure is not limited thereto.

Figure 2D:
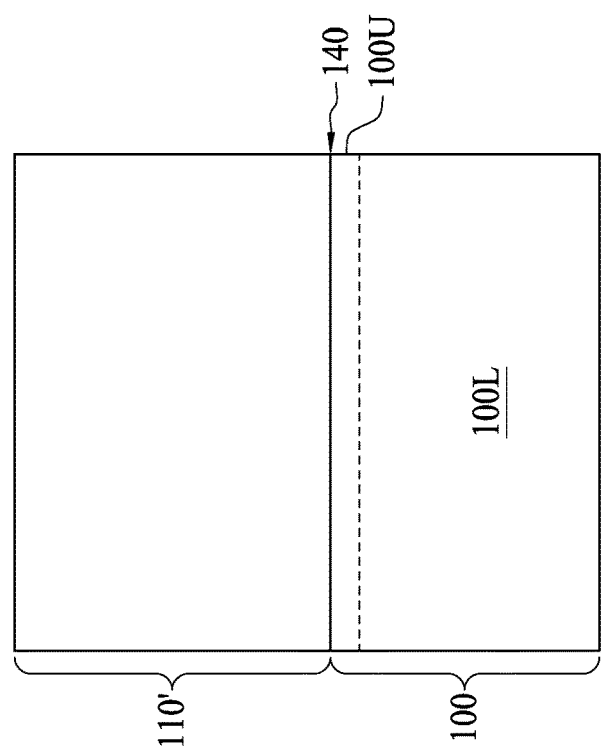
Figure 2C:
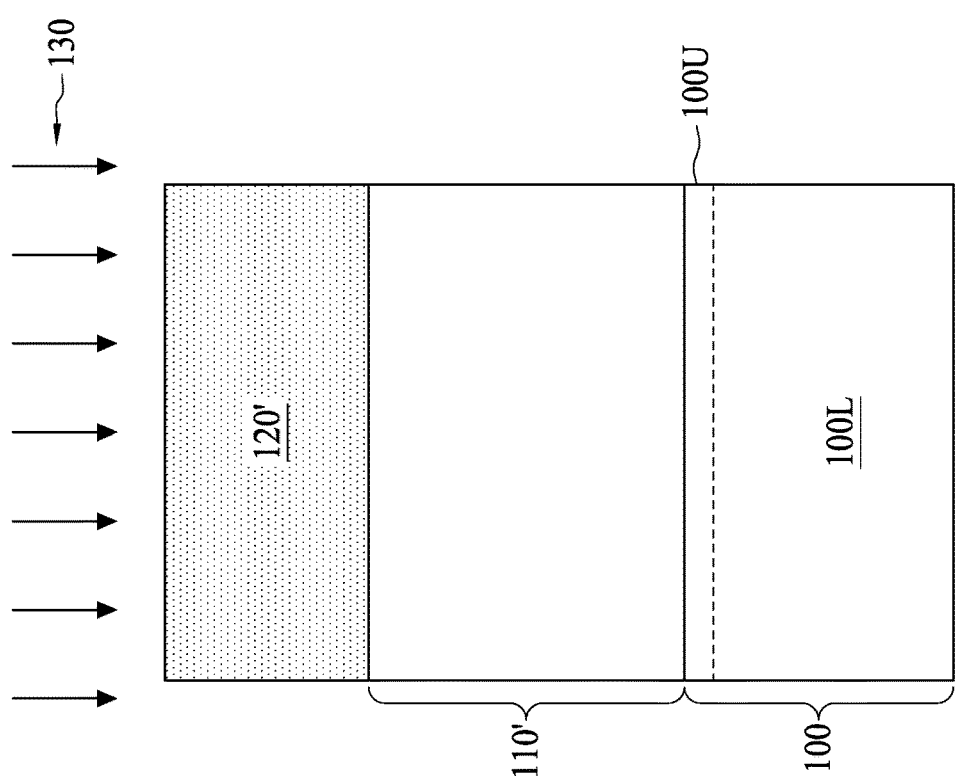

Referring to FIGS. 1 and 2C, the substrate is annealed to transform the first sacrificial cap 120 into a second sacrificial cap 120' including SiGe in operation 14. In some embodiments, an anneal 130 is performed with $N_2$, hydrogen ($H_2$), argon (Ar) and oxygen ($O_2$). In some embodiments, the anneal 130 is performed at a temperature between approximately 300° C. and approximately 1100° C., but the disclosure is not limited thereto. During the anneal 130, Ge atoms diffuse from the semiconductor layer 100 and from the first dielectric layer 112a. Further, Ge atoms may diffuse upwardly and pass the second dielectric layer 112b, and stay with Si atoms in the first sacrificial cap 120. Accordingly, the first sacrificial cap 120 including silicon is transformed into the second sacrificial cap 120' including silicon germanium. The second sacrificial cap 120' may include Ge atoms from the semiconductor layer 100 and from the first dielectric layer 112a. It should be noted that the thickness of the first sacrificial cap 120 (now the second sacrificial cap 120') is greater than 20 Å in order to provide sufficient accommodations for the Ge atoms.

As described above, Ge atoms may diffuse from the semiconductor layer 100. Accordingly, a portion of the semiconductor layer 100 may lose Ge atoms. In some embodiments, it is observed that a portion, usually an upper portion, of the semiconductor layer 100 is likely to exhibit Ge diffusion. Accordingly, the portion having a lower Ge concentration is recognized and defined as a first portion 100U while the other portion, usually a portion lower than the first portion 100U, having the Ge concentration greater than that of the first portion 100U, is recognized and defined as a second portion 100L. In some embodiments, the Ge concentration in the second portion 100L may be substantially equal to an original Ge concentration in the semiconductor layer 100. The first portion 100U of the semiconductor layer 100 has a first Ge concentration prior to annealing of the substrate and a second Ge concentration after the annealing of the substrate. In some embodiments, the first Ge concentration in the first portion 100U is substantially equal to the Ge concentration in the second portion 100L, which is the original Ge concentration. The second Ge concentration in the first portion 100U is lower than the first Ge concentration in the first portion 100U and the Ge concentration in the second portion 100L. For example but not limited thereto, the first Ge concentration in the first portion 100U and the Ge concentration in the second portion 100L may be greater than approximately 30%, while the second Ge concentration in the first portion 100U may be less than approximately 25%. Accordingly, a Ge concentration in an interface 140 between the dielectric layer 110 and the semiconductor layer 100 is reduced from greater than approximately 30% to less than approximately 25%, but the disclosure is not limited thereto.

Further, Ge atoms in the first dielectric layer 112a may also diffuse into the first sacrificial cap 120, and thus the first dielectric layer 112a, which includes a silicon germanium oxide layer, may be transformed into a silicon oxide layer. Accordingly, a dielectric layer 110' including silicon oxide may be formed after operation 14. In some embodiments, the dielectric layer 110' includes the original second dielectric layer 112b including silicon oxide and the first dielectric layer 112a previously including silicon germanium oxide and now including silicon oxide. In some embodiments, the Ge concentration in the dielectric layer 110' is less than 3%. In some embodiments, the Ge concentration in the dielectric layer 110' is less than 1.5%.

Referring to FIGS. 1 and 2D, the second sacrificial cap 120' is removed to expose the dielectric layer 110' in operation 15. In some embodiments, a gate electrode is formed over the dielectric layer 110' in operation 16. In some embodiments, the dielectric layer 110' serves as a gate dielectric layer for a transistor device, and the thickness of the dielectric layer 110' may be between approximately 10 Å and approximately 50 Å, but the disclosure is not limited thereto. In such embodiments, the gate electrode can include a semiconductor material. In other embodiments, the dielectric layer 110' serves as an interfacial layer (IL) in an RPG approach, and the thickness of the dielectric layer 110' is less than 20 Å, but the disclosure is not limited thereto. In such embodiments, the gate electrode can include metal materials, and a high-k gate dielectric layer is sandwiched between the dielectric layer 110' and the metal gate electrode. The operation 16 will be discussed in more detail in the following description.

According to the method of forming the dielectric layer 10, the first sacrificial cap 120 is formed to provide accommodations for Ge atoms diffused from the dielectric layer (i.e., the first dielectric layer 112a) including silicon germanium oxide and from the semiconductor layer 100 in the anneal 130. Further, because the second sacrificial cap 120' (transformed from the first sacrificial cap 120) is removed, the method 10 provides a cap-free dielectric design. According to the method 10, the Ge concentration in the dielectric layer 110' is less than 3% or even less than 1.5%. Consequently, gate leakage current (Jg) is reduced by the dielectric layer 110' and thus device reliability is improved.

Further, there are two interface issues causing carrier mobility degradation as mentioned in reference to the comparative embodiments: interface trap density (Dit) caused by SiGe oxidation and high density of interface states caused by dielectric deposition. The SiGe oxidation will form a silicon germanium oxide layer having a high interface trap density (Dit) that captures mobile charge carriers and results in low mobility, while the high density of interface states indicates low quality of the deposited gate dielectric material and results in carrier mobility degradation. Both of the two interface issues are mitigate by the method 10. It should be noted that because there are at least three layers (i.e., the first sacrificial cap 120, the second dielectric layer 112b and the first dielectric layer 110) formed over the semiconductor layer 100 including a Ge compound, oxygen can be blocked by the three layers during the forming of the second dielectric layer 112b and/or the annealing of the first sacrificial cap 120. In other words, SiGe oxidation in the semiconductor layer 100 can be avoided by the three layers. Accordingly, interface trap density (Dit) caused by SiGe oxidation is reduced. Further, the interface 140 is formed between the dielectric layer 110' and the semiconductor layer 100. Specifically, the interface 140 is formed between the previously first dielectric layer 112a (now a portion of the dielectric layer 110') and the semiconductor layer 100. As described above, the first dielectric layer 112a may be a native oxide layer, instead of a chemical oxide layer that is formed by deposition. Therefore, the density of interface states, which is created by deposition, is reduced. Accordingly, carrier mobility degradation is mitigated.

Figure 3:
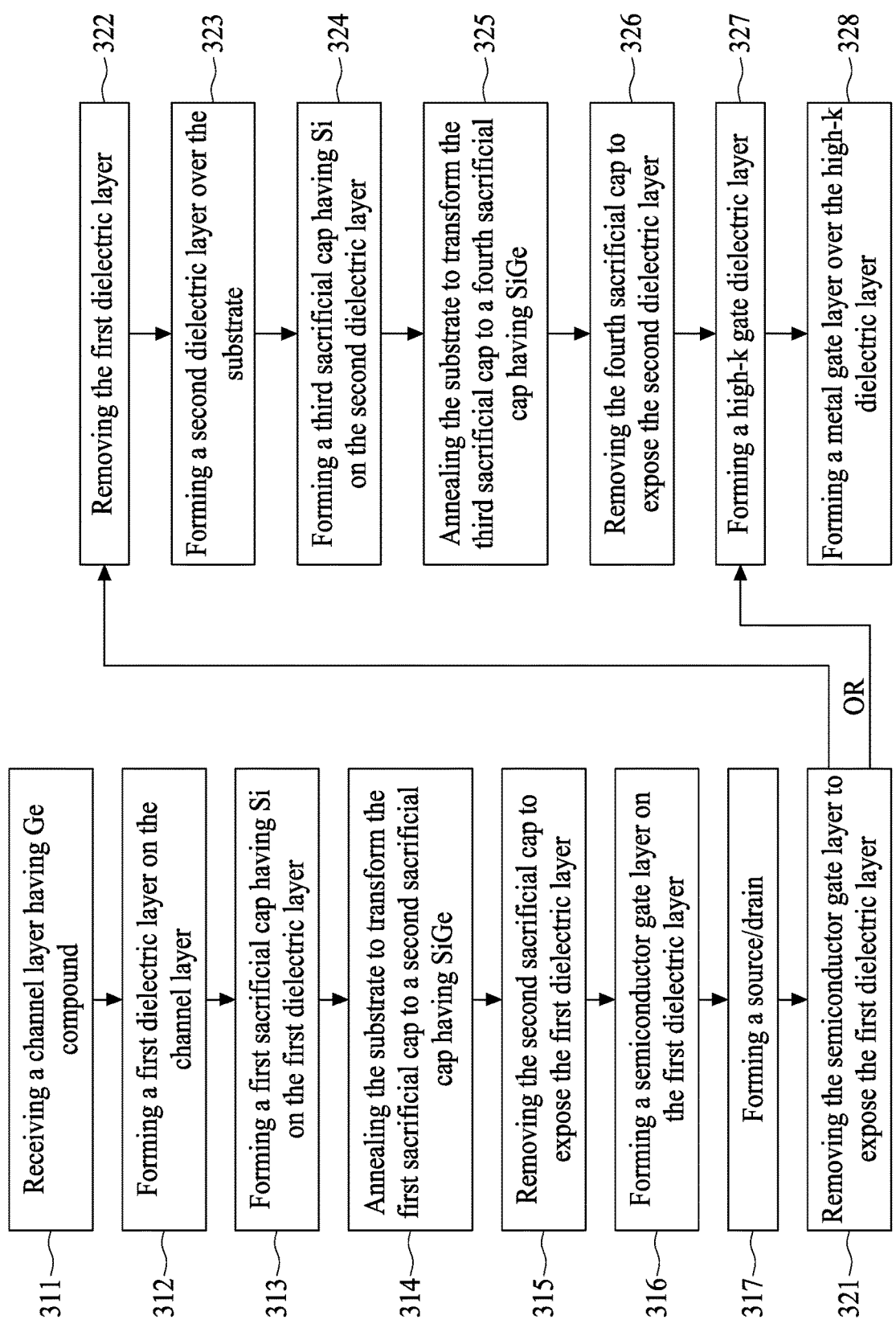
FIG. 3 is a flow diagram of some embodiments of a method of forming a semiconductor structure.

In some embodiments, the cap-free dielectric design described above can be integrated in planar transistor devices. FIG. 3 is a flow diagram of some embodiments of a method of forming a semiconductor structure, and FIGS. 4A to 4F are schematic drawings illustrating a semiconductor structure at various fabrication stages constructed according to aspects of the present disclosure in one or more embodiments. In some embodiments, a method of forming a semiconductor structure 30 is provided, and the method 30 includes a number of operations (311, 312, 313, 314, 315, 316 and 317).

Figure 4A:
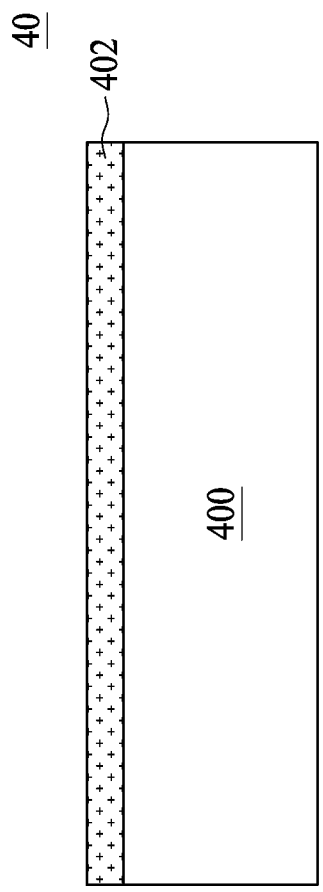

Referring to FIGS. 3 and 4A, a substrate 400 including a channel layer 402 is received in operation 311. The substrate 400 can include a bulk silicon substrate, a single crystalline silicon substrate (doped or undoped), or a semiconductor-on-insulator (SOI) substrate. In some embodiments, the substrate 400 may have a doping type (e.g., an n-type doping). In some embodiments, the substrate 400 may include a doped epitaxial layer disposed on a semiconductor body including a bulk silicon. In some embodiments, isolation structures (not shown) such as shallow trench isolation (STI) structures may be formed in the substrate 400 to define regions where devices to be formed and to electrically isolate the devices to be formed.

Sill referring to FIG. 4A, in some embodiments, a SiGe MOSFET device is to be formed over the substrate 400 to take advantage of the low junction leakage and high mobility provided by SiGe and Si hetero-junction. Accordingly, a semiconductor layer is formed to serve as the channel layer 402. The channel layer 402 may include a Ge compound. For example, the channel layer 402 may include $Si_{1-x}Ge_x$ alloy, wherein the germanium content, x, ranges from 0 to 1. In some embodiments, the germanium content may be greater than 0.3, but the disclosure is not limited thereto. In some embodiments, the Ge content may be greater than 0.35, but the disclosure is not limited thereto. In other embodiments, the channel layer 402 can include other III-V semiconductor materials having alloy including a combination of group III material (i.e., group 13 in the periodic table) and group V material (i.e., group 15 in the periodic table). For example, in some embodiments, the channel layer 402 can include GaAs, InP, AlGaAs, InAs, or any other similar material.

Figure 4B:
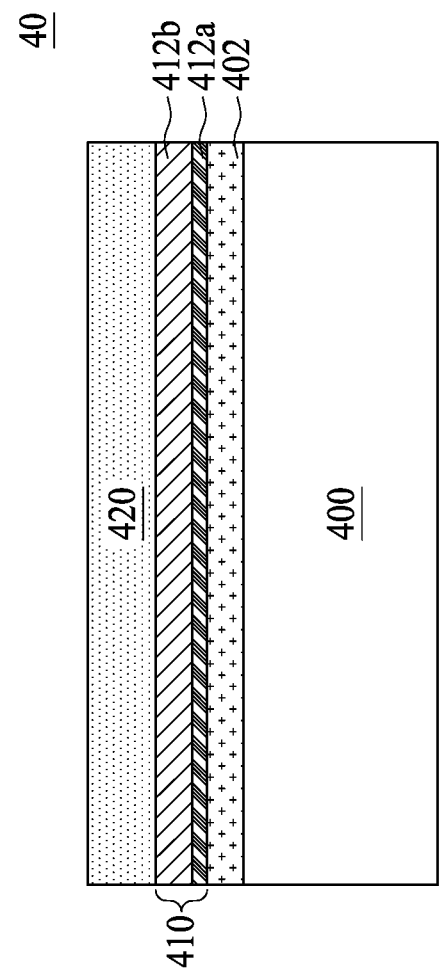

Referring to FIGS. 3 and 4B, a dielectric layer 410 is formed on the channel layer 402 in operation 312. The dielectric layer 410 can include a semiconductor oxide. For example, the dielectric layer 410 may include a silicon oxide layer, but the disclosure is not limited thereto. In some embodiments, the dielectric layer 410 may include a first dielectric layer 412a and a second dielectric layer 412b. As shown in FIG. 4B, the first dielectric layer 412a is sandwiched between the second dielectric layer 412b and the channel layer 402. In some embodiments, the first dielectric layer 412a may be a III-V compound semiconductor oxide layer. For example but not limited thereto, the first dielectric layer 412a may be a $Si_xGe_yO$ layer, wherein x is between approximately 0.6 and approximately 1, and y is between approximately 0.4 and approximately 0. In some embodiments, the III-V compound semiconductor oxide layer may be a native oxide layer that is spontaneously grown on a surface of the channel layer 402. For example, the first dielectric layer 412a may be a native silicon germanium oxide layer spontaneously grown on a surface of the channel layer 402. In some embodiments, the second dielectric layer 412b may include a silicon oxide layer. In some embodiments, the second dielectric layer 412b may be a chemical oxide layer, and the second dielectric layer 412b can be formed by suitable thermal oxidation or deposition. The method of forming the second dielectric layer 412b can be similar to methods described above; therefore, similar details are omitted in the interest of brevity. In some embodiments, a thickness of the dielectric layer 410 is between approximately 10 Å and approximately 50 Å, but the disclosure is not limited thereto. In other embodiments, the thickness of the dielectric layer 410 is less than 20 Å, but the disclosure is not limited thereto.

Still referring to FIGS. 3 and 4B, a first sacrificial cap 420 including Si is formed on the dielectric layer 110 in operation 313. In some embodiments, the first sacrificial cap 420 may include an amorphous silicon layer or a polysilicon layer. In some embodiments, a thickness of the first sacrificial cap 420 is greater than 20 Å, but the disclosure is not limited thereto. The method of forming the first sacrificial cap 420 can be similar to methods described above; therefore, similar details are omitted in the interest of brevity.

Referring to FIGS. 3 and 4C, the substrate 400 is annealed to transform the first sacrificial cap 420 into a second sacrificial cap 420' including SiGe in operation 314. In some embodiments, an anneal 430 is performed, wherein the details of the anneal 430 can be similar to those of anneals described above; therefore, similar details are omitted in the interest of brevity. During the anneal 430, Ge atoms diffuse from the channel layer 402 and from the first dielectric layer 412a. Further, Ge atoms may diffuse upwardly and pass the second dielectric layer 412b, and stay with Si atoms in the first sacrificial cap 420. Accordingly, the first sacrificial cap 420 including silicon is transformed into the second sacrificial cap 420' including silicon germanium. In other words, the second sacrificial cap 420' may include Ge atoms from the channel layer 402 and from the first dielectric layer 412a. It should be noted that the thickness of the first sacrificial cap 420 (now the second sacrificial cap 420') is greater than 20 Å in order to provide sufficient accommodations for Ge atoms.

As described above, Ge atoms may diffuse from the channel layer 402. Accordingly, a portion of the semiconductor layer 402 may lose Ge atoms. In some embodiments, it is observed that a portion of the channel layer 402, usually an upper portion, is likely to exhibit Ge diffusion. Accordingly, the portion having lower Ge concentration is recognized and defined as a first portion 402U while the other portion, usually a portion lower than the first portion 402U, having the Ge concentration greater than that of the first portion 402U is recognized and defined as a second portion 402L. In some embodiments, the Ge concentration in the second portion 402L may be substantially equal to an original Ge concentration in the channel layer 402. The first portion 402U of the channel layer 402 has a first Ge concentration prior to the annealing of the substrate 400 and a second Ge concentration after the annealing of the substrate 400. In some embodiments, the first Ge concentration in the first portion 402U is substantially equal to the Ge concentration in the second portion 402L, which is the original Ge concentration. The second Ge concentration in the first portion 402U is lower than the first Ge concentration in the first portion 402U and the Ge concentration in the second portion 402L. For example but not limited thereto, the first Ge concentration in the first portion 402U and the Ge concentration in the second portion 402L may be greater than approximately 30%, while the second Ge concentration in the first portion 402U may be less than approximately 25%. Accordingly, a Ge concentration in an interface 440 between the dielectric layer 410 and the channel layer 402 is reduced from greater than approximately 30% to less than approximately 25%, but the disclosure is not limited thereto.

Further, Ge atoms in the first dielectric layer 412a may also diffuse into the first sacrificial cap 420, and thus the first dielectric layer 412a, which includes a silicon germanium oxide layer, may be transformed into a silicon oxide layer. Accordingly, a dielectric layer 410' including silicon oxide may be formed after operation 314. In some embodiments, the dielectric layer 410' includes the original second dielectric layer 412b including silicon oxide and the first dielectric layer 412a previously including silicon germanium oxide and now including silicon oxide. In some embodiments, the Ge concentration in the dielectric layer 410' is less than 3%. In some embodiments, the Ge concentration in the dielectric layer 410' is less than 1.5%.

Figure 4E:
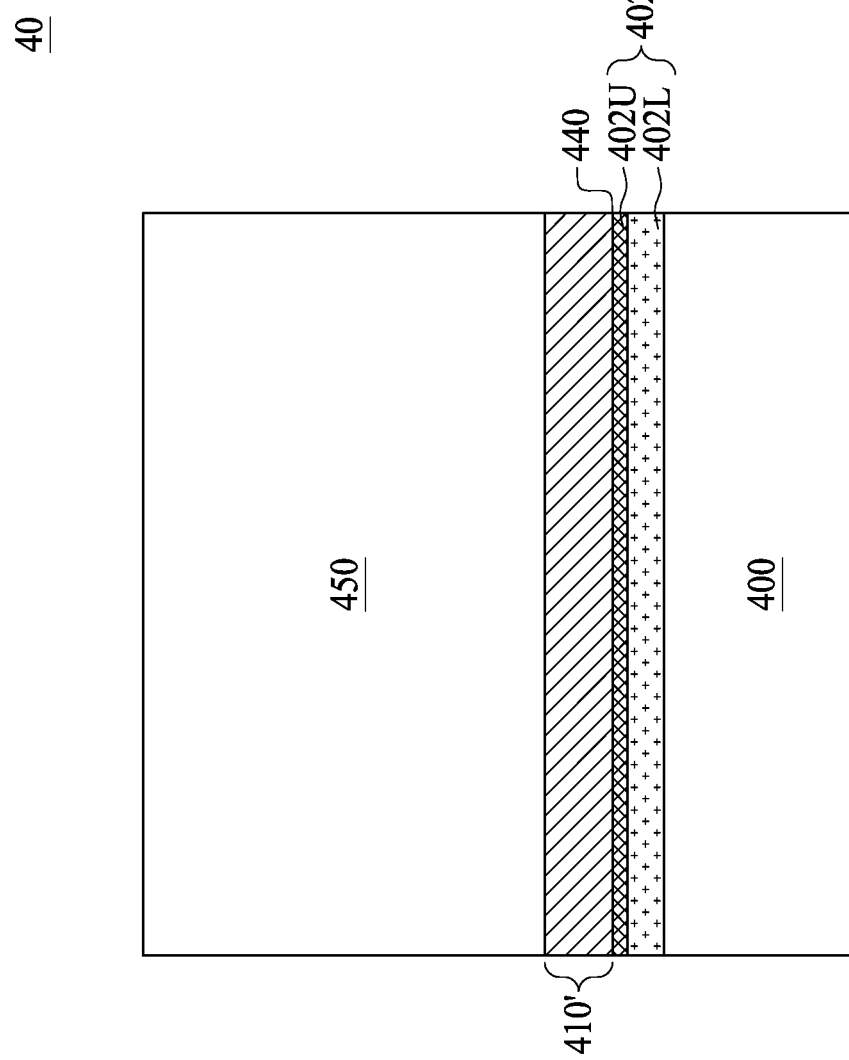

Referring to FIGS. 3 and 4D, the second sacrificial cap 420' is removed to expose the dielectric layer 410' in operation 315. Referring to FIGS. 3 and 4E, a semiconductor gate layer 450 is formed over the dielectric layer 410' in operation 316. In some embodiments, the dielectric layer 410' serves as a gate dielectric layer for a transistor device, and a thickness of the dielectric layer 410' may be between approximately 10 Å and approximately 50 Å, but the disclosure is not limited thereto. In such embodiments, the gate layer can include a semiconductor material; for example, a doped polysilicon is formed to serve as the semiconductor gate layer 450.

Figure 4F:
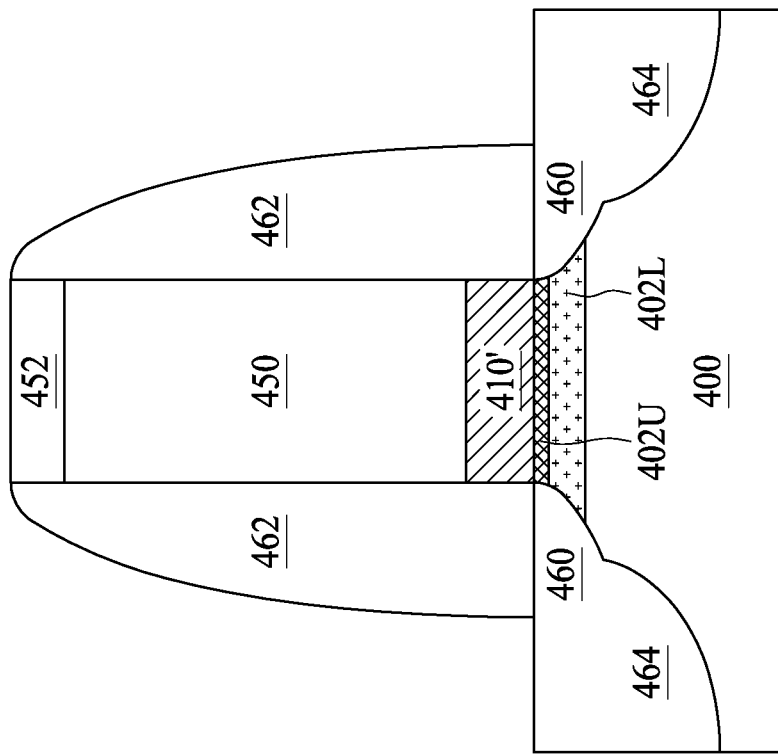

Referring to FIG. 4F, in some embodiments, a patterned hard mask 452 is formed on the semiconductor gate layer 450, and the semiconductor gate layer 450 is patterned through the patterned hard mask 452, such that a gate structure including the semiconductor gate layer 450 and the dielectric layer 410' is obtained. In some embodiments, source/drain extension regions 460 can be formed in the substrate 400 at two sides of the gate structure, spacers 462 can be formed on sidewalls of the gate structure, and a source/drain 464 can be formed in operation 317. The source/drain 464 is formed in the substrate 400 at two sides of the gate structure and the spacers 462. In some embodiments, the source/drain 464 can be a strained source/drain (S/D) structure. The strained S/D structures 464 can be formed by growing a strained material in recesses (not shown) by an epitaxial (epi) operation. In some embodiments, a lattice constant of the strained material may be different from a lattice constant of the substrate 400. In some embodiments, the strained S/D structures 464 may include Ge, SiGe, InAs, InGaAs, InSb, GaSb, InAlP, InP, or a combination thereof, but the disclosure is not limited thereto. Accordingly, a semiconductor structure such as a planar SiGe MOSFET device 40 is obtained, as shown in FIG. 4F.

The method of forming the semiconductor structure 30 uses a cap-free dielectric design. According to the method 30, the Ge concentration in the dielectric layer 410' is less than 3% or even less than 1.5%. Consequently, gate leakage current (Jg) is reduced by the dielectric layer 410' and reliability of the SiGe MOSFET device 40 is improved. Further, interface trap density (Dit) and density of interface states are also reduced by the method 30. Therefore, the carrier mobility is improved by the SiGe channel layer 402 while the carrier mobility degradation issue caused by high Dit and density of interface states is mitigated.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. MOSFET devices have typically been formed with a gate dielectric layer including SiO and a gate electrode including polysilicon, as described above. There has been a desire to replace the SiO gate dielectric layer and polysilicon gate electrode with a high-k gate dielectric and a metal gate electrode to improve device performance as feature sizes continue to decrease. In some embodiments, the method 30 can further include a number of operations (321, 322, 323, 324, 325, 326, 327 and 328). In some embodiments, operation 321 can be performed after operation 317, but the disclosure is not limited thereto. In some embodiments, operations 327 and 328 can be performed after operation 321, but the disclosure is not limited thereto. In other embodiments, operation 322, 323, 324, 325, 326, 327 and 328 can be performed after the operation 321, but the disclosure is not limited thereto.

Figure 5:
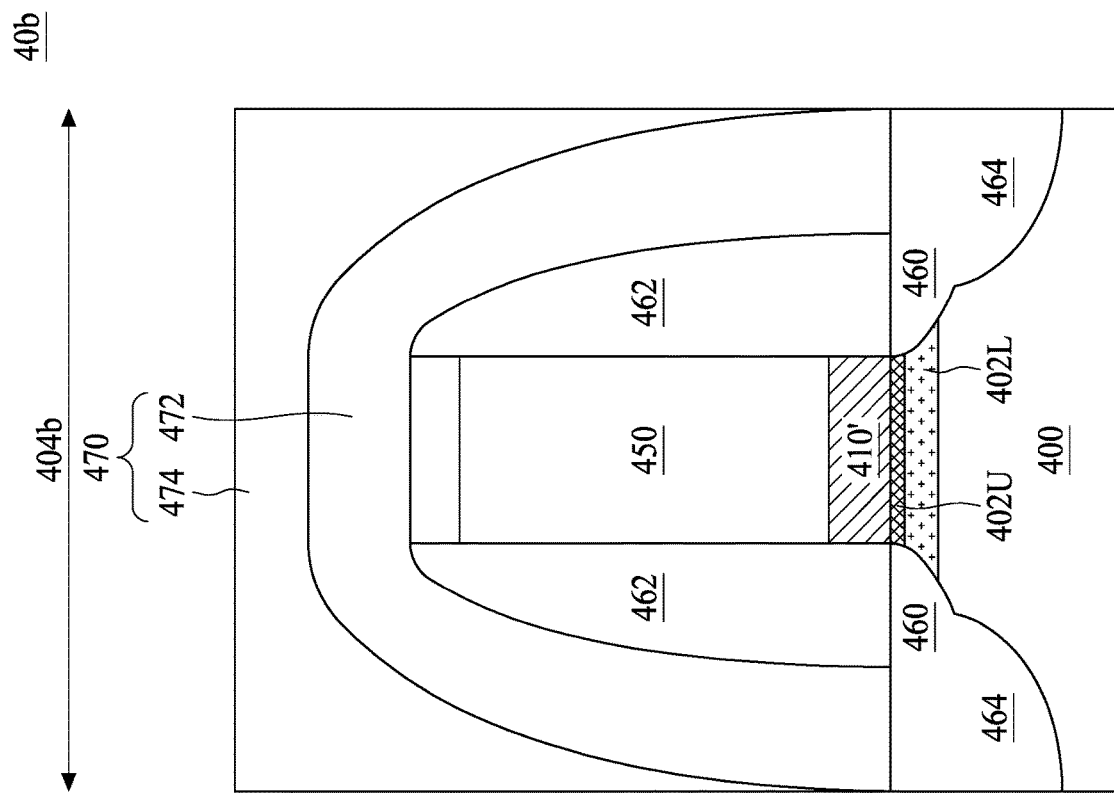
FIG. 5 is a schematic drawing illustrating a semiconductor structure according to aspects of the present disclosure in one or more embodiments.
Figure 5:
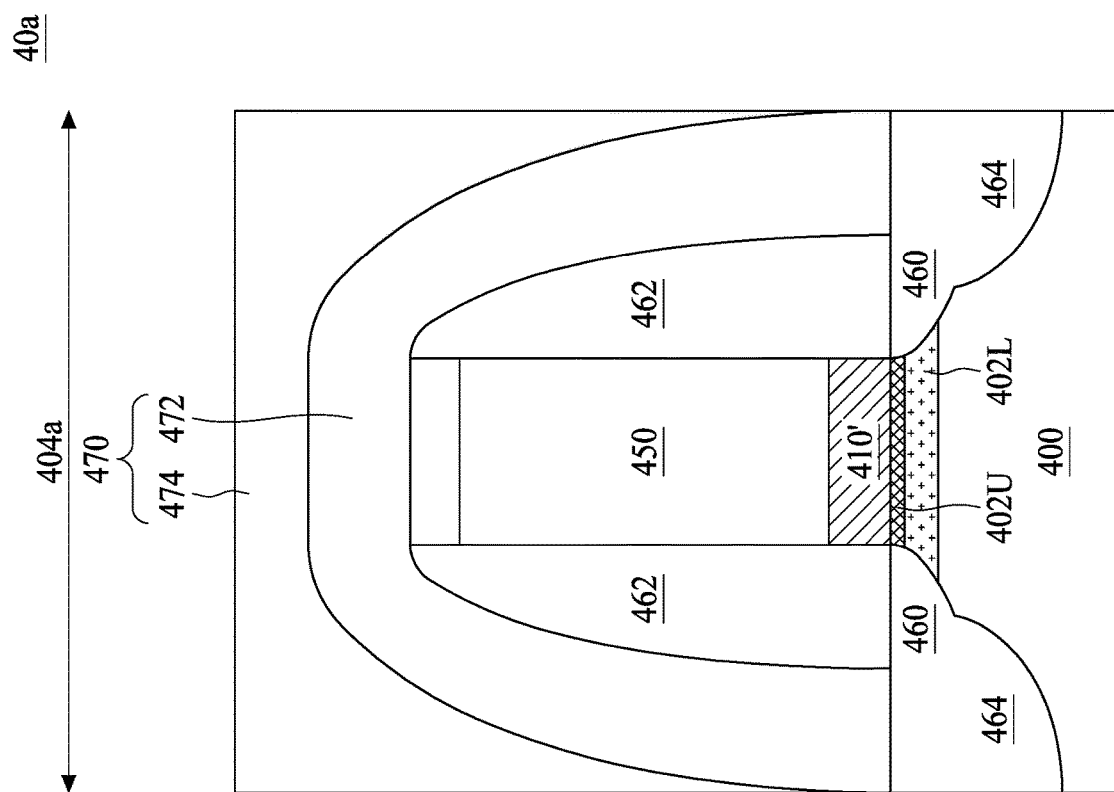

Further, as the integrated circuit size continues to shrink, a core operation voltage is reduced. It is expected that the core operation voltage will continue to be reduced as the integrated circuit size continues to shrink. As the core operation voltage is reduced, an I/O operation voltage stays at a higher value. As a result, the MOS devices in an I/O region and a core region are expected to work under different operation voltages. Thus different operations can be performed to form the devices in the I/O region and the core region. For example, in some embodiments, the above-mentioned operations 311, 312, 313, 314, 315 and 316 are performed to simultaneously form a device 40a having a polysilicon gate electrode 450 in an I/O region 404a and a device 40b having polysilicon gate electrode 450 in a core region 404b, as shown in FIG. 5.

In some embodiments, a dielectric structure 470 is formed over the substrate 400. In some embodiments, the dielectric structure 470 can include an etch-stop layer (e.g., a contact etch stop layer (CESL)) 472 and various dielectric layers (e.g., an inter-layer dielectric (ILD) layer) 474 formed over the substrate 400 after the forming of the strained S/D structures 464. In some embodiments, the CESL 472 includes a SiN layer, a SiCN layer, a SiON layer, and/or other materials known in the art. In some embodiments, the ILD layer 474 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. Accordingly, the SiGe MOSFET device 40a and the SiGe MOSFET device 40b are embedded in the dielectric structure 470.

Figure 6C:
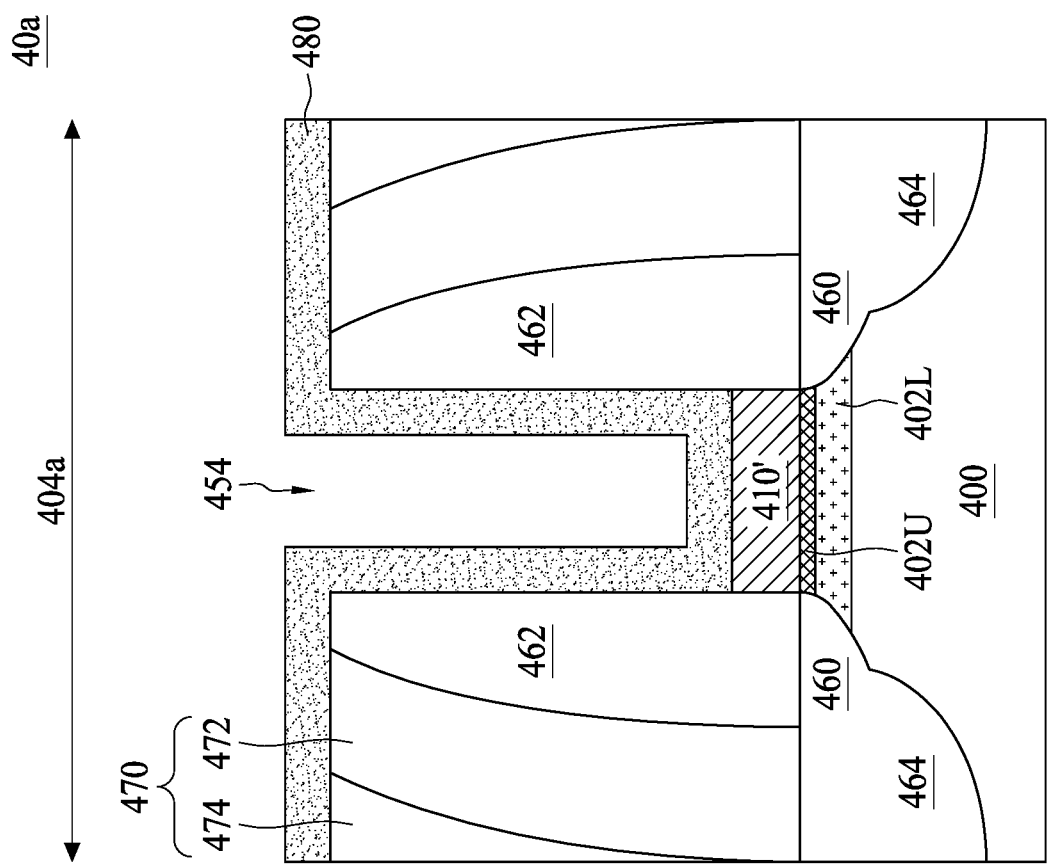

In some embodiments, the operations 321, 327 and 328 can be performed to form a MOSFET device 40a having a metal gate electrode in the I/O region 404a, but the disclosure is not limited thereto. Accordingly, only the device 40a in the I/O region 404a is shown in FIGS. 6A to 6D. In some embodiments, the semiconductor gate layer 450 (i.e., the polysilicon gate electrode) serves as a sacrificial gate structure, also known as a dummy gate structure, in a replacement gate (RPG) approach. Referring to FIGS. 3 and 6A, in some embodiments, after the CESL 472 and the ILD layer 474 are deposited, a planarization process, such as a chemical mechanical planarization (CMP) operation, may be performed to remove a portion of the dielectric structure 470, a portion of the spacer 462 and the patterned hard mask 452. Consequently, a top surface of the semiconductor gate structure 450 is exposed, as shown in FIG. 6A.

Referring to FIGS. 3 and 6B, the semiconductor gate structure 450 is removed in operation 321. Consequently, a gate trench 454 is formed within the dielectric structure 470 and the spacers 462. Further, the dielectric layer 410' is exposed through a bottom of the gate trench 454.

Referring to FIGS. 3 and 6C, a high-k dielectric layer 480 is formed on the dielectric layer 410' in operation 327. In some embodiments, the high-k dielectric layer 480 may include hafnium oxide ($HfO_2$), zirconium oxide ($ZrO_2$), lanthanum oxide ($La_2O_3$), aluminum oxide ($Al_2O_3$), titanium oxide ($TiO_2$), yttrium oxide ($Y_2O_3$), strontium titanate ($SrTiO_3$), hafnium oxynitride (HfOxNy), other suitable metal-oxides, or combinations thereof. Additionally, the dielectric layer 410' serves as an interfacial layer (IL) between the high-k dielectric layer 480 and the channel layer 402.

Figure 6D:
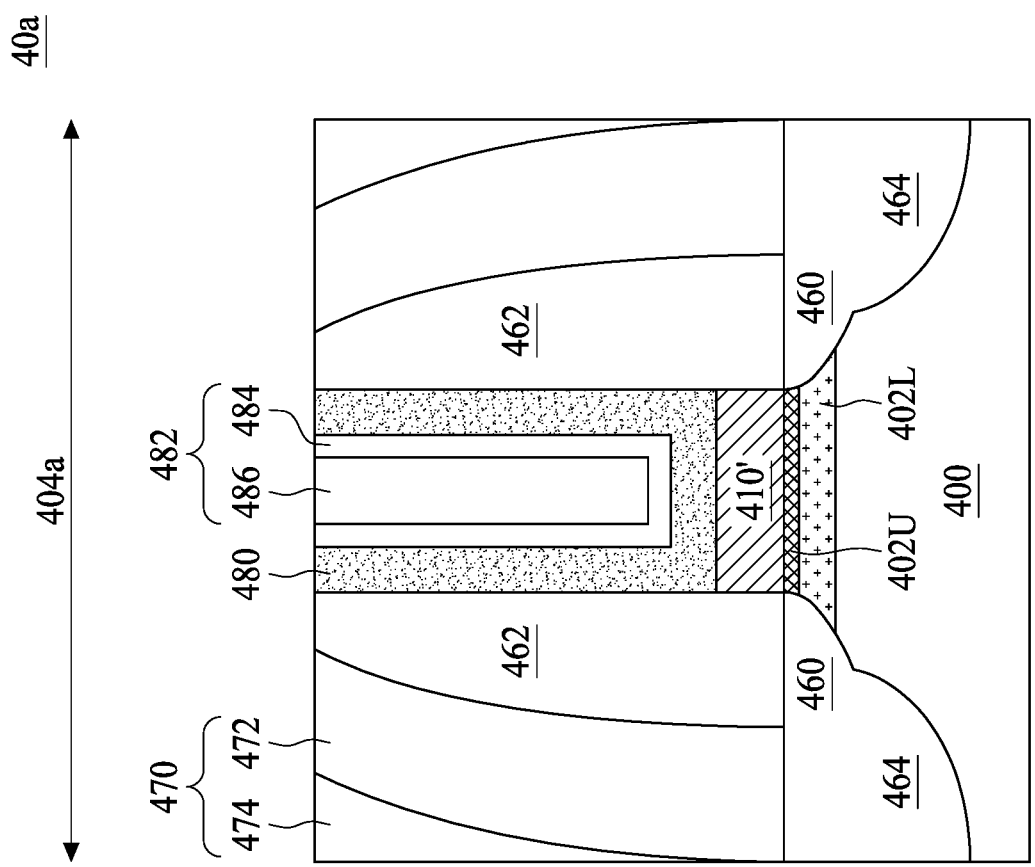

Referring to FIGS. 3 and 6D, a metal gate structure 482 is formed over the high-k dielectric layer 480 in operation 328. In some embodiments, the metal gate structure 482 can include at least a barrier metal layer (not shown), a work functional metal layer 484 and a gap-filling metal layer 486. The barrier metal layer can include, for example but not limited to, TiN. The work function metal layer 484 can include a single layer of TiN, TaN, TaAlC, TiC, TaC, Co, Al, TiAl, HfTi, TiSi, TaSi or TiAlC, or a multilayer of two or more of these materials, but is not limited thereto. For an n-channel FET, one or more of TaN, TaAlC, TiN, TiC, Co, TiAl, HfTi, TiSi and TaSi are used as the work function metal layer 484, and for a p-channel FET, one or more of TiAlC, Al, TiAl, TaN, TaAlC, TiN, TiC and Co are used as the work function metal layer 484. In some embodiments, the gap-filling metal layer 486 can include conductive material such as Al, Cu, AlCu, or W, but the material is not limited thereto.

Accordingly, a planar SiGe MOSFET 40a having a metal gate electrode is obtained in the I/O region 404a, according to the method 30.

Figure 7A:
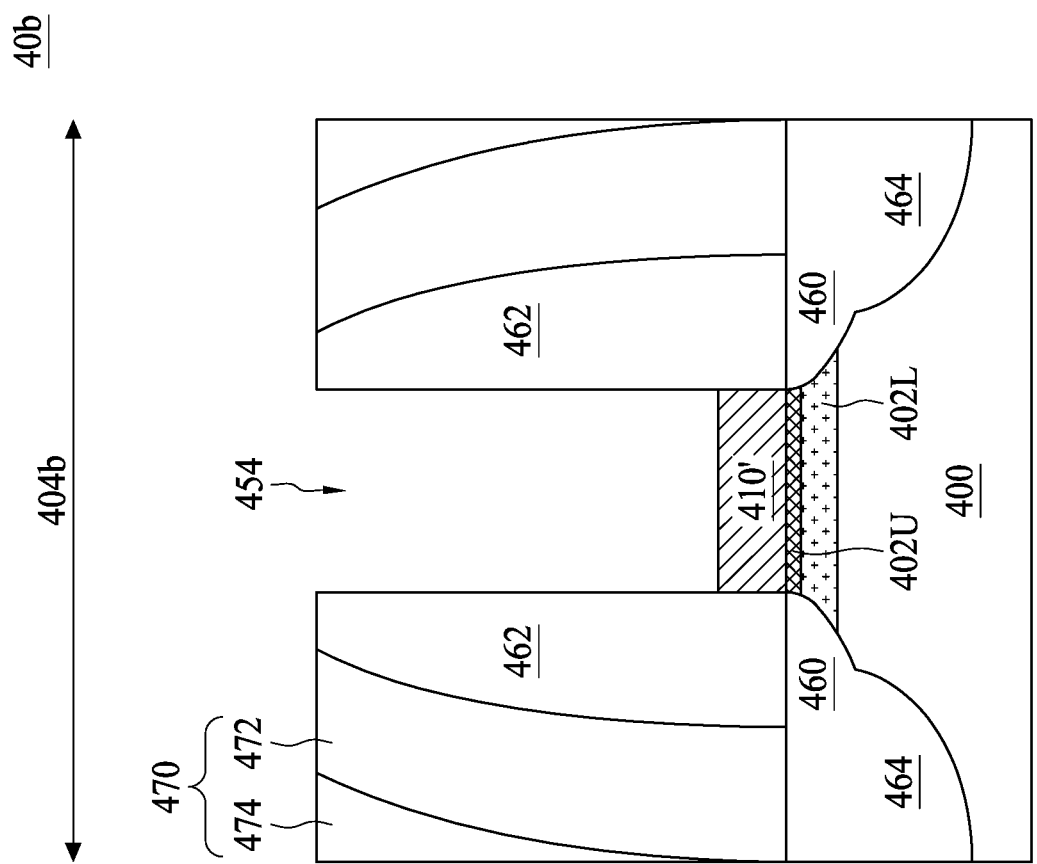
FIGS. 7A to 7H are schematic drawings illustrating a semiconductor structure at various fabrication stages constructed according to aspects of the present disclosure in one or more embodiments.

In contrast to the device in the I/O region 404a, the device 40b having a metal gate electrode in the core region 404b can be formed by the operations 321, 322, 323, 324, 325, 326, 327 and 328, but the disclosure is not limited thereto. Accordingly, only the device 40b in the core region 404b is shown in FIGS. 7A to 7H. In some embodiments, the semiconductor gate layer 450 (i.e., the polysilicon gate electrode) serves as a sacrificial gate, also known as a dummy gate, in a replacement gate (RPG) approach. Referring to FIGS. 3 and 7A, as described above, after the CESL 472 and the ILD layer 474 are deposited, a planarization process, such as a CMP operation, may be performed to remove a portion of the dielectric structure 470, a portion of the spacer 462 and the patterned hard mask 452. Consequently, a top surface of the semiconductor gate structure 450 is exposed. The semiconductor gate structure 450 is removed in operation 321. Consequently, a gate trench 454 is formed within the dielectric layer 470 and the spacers 462. Further, the dielectric layer 410' is exposed through a bottom of the gate trench 454.

Figure 7B:
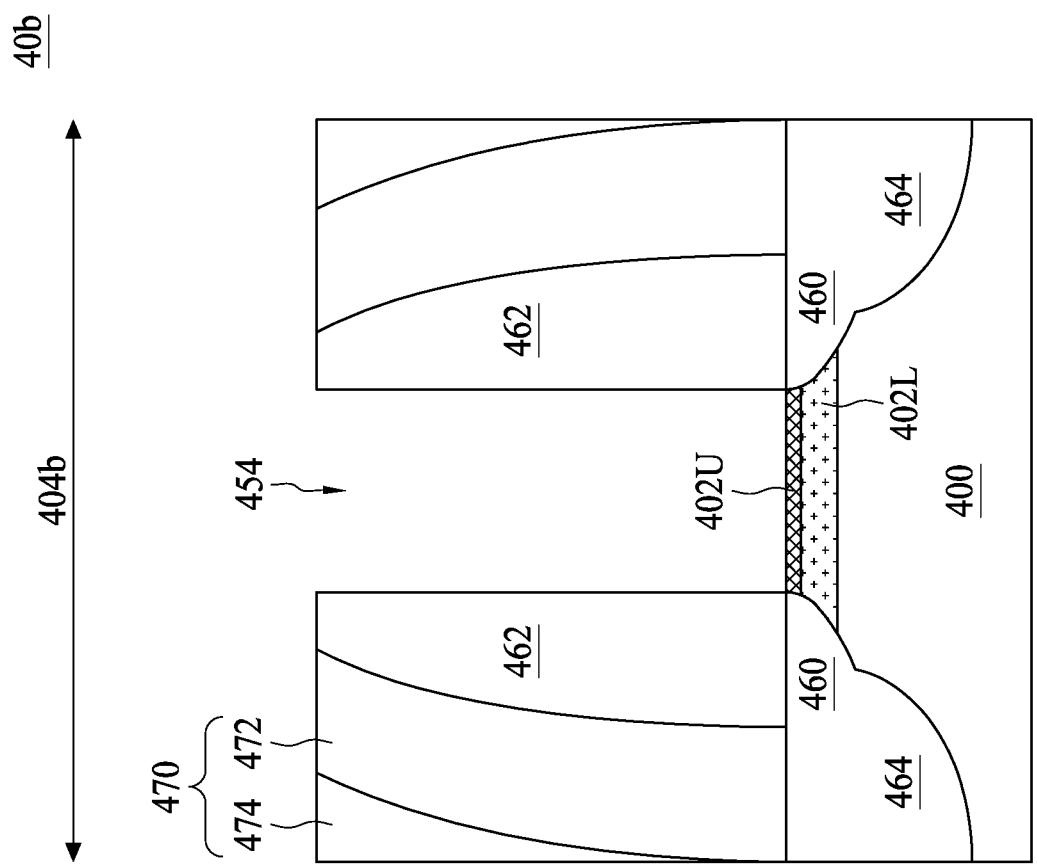

Referring to FIGS. 3 and 7B, the dielectric layer 410' is removed in operation 322. Consequently, the channel layer 402, such as the first portion 402U, is exposed through the bottom of the gate trench 454.

Figure 7C:
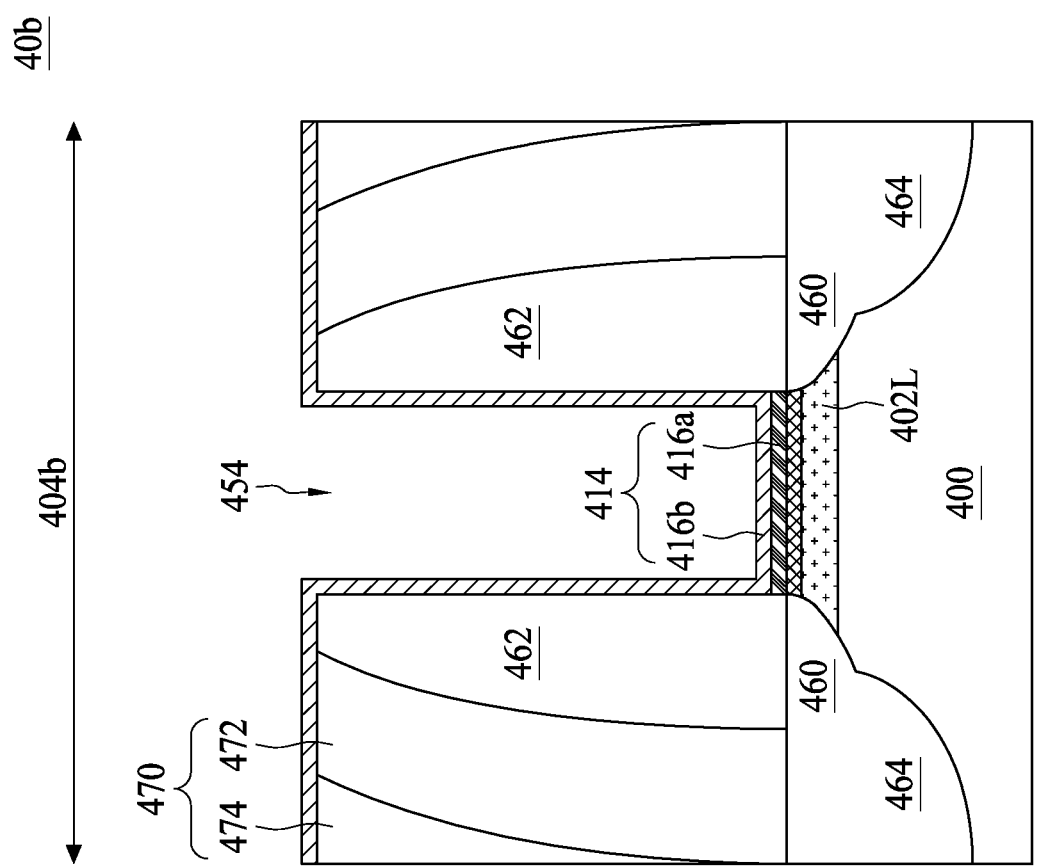

Referring to FIGS. 3 and 7C, another dielectric layer 414 is formed on the channel layer 402 in operation 323. The dielectric layer 414 can include semiconductor oxide. For example, the dielectric layer 414 may include a silicon oxide layer, but the disclosure is not limited thereto. In some embodiments, the dielectric layer 414 may include a first dielectric layer 416a and a second dielectric layer 416b. As shown in FIG. 7C, the first dielectric layer 416a is sandwiched between the second dielectric layer 416b and the channel layer 402. In some embodiments, the first dielectric layer 416a may be a III-V compound semiconductor oxide layer and the second dielectric layer 416b may include a silicon oxide layer. For example but not limited thereto, the first dielectric layer 416a may be a silicon germanium oxide ($Si_{1-x}Ge_xO$) layer wherein x is between approximately 0.6 and approximately 1, and y is between approximately 0.4 and approximately 0. In some embodiments, the III-V compound semiconductor oxide layer may be a native oxide layer that is spontaneously grown on a surface of the channel layer 402. For example, the first dielectric layer 416a may be a native silicon germanium oxide layer spontaneously grown on a surface of the channel layer 402. In some embodiments, the second dielectric layer 416b may be a silicon oxide layer, and may be a chemical oxide layer. The second dielectric layer 416b can be formed by suitable thermal oxidation or deposition. The method of forming the second dielectric layer 416b can be similar to methods described above; therefore, similar details are omitted in the interest of brevity. In some embodiments, a thickness of the dielectric layer 414 is less than approximately 20 Å, but the disclosure is not limited thereto. In some embodiments, when the second dielectric layer 416b of the dielectric layer 414 is formed by deposition, the second dielectric layer 416b may cover sidewalls of the gate trench 454 and top surfaces of the spacers 462 and the dielectric structure 470, as shown in FIG. 7C, but the disclosure is not limited thereto.

Figure 7D:
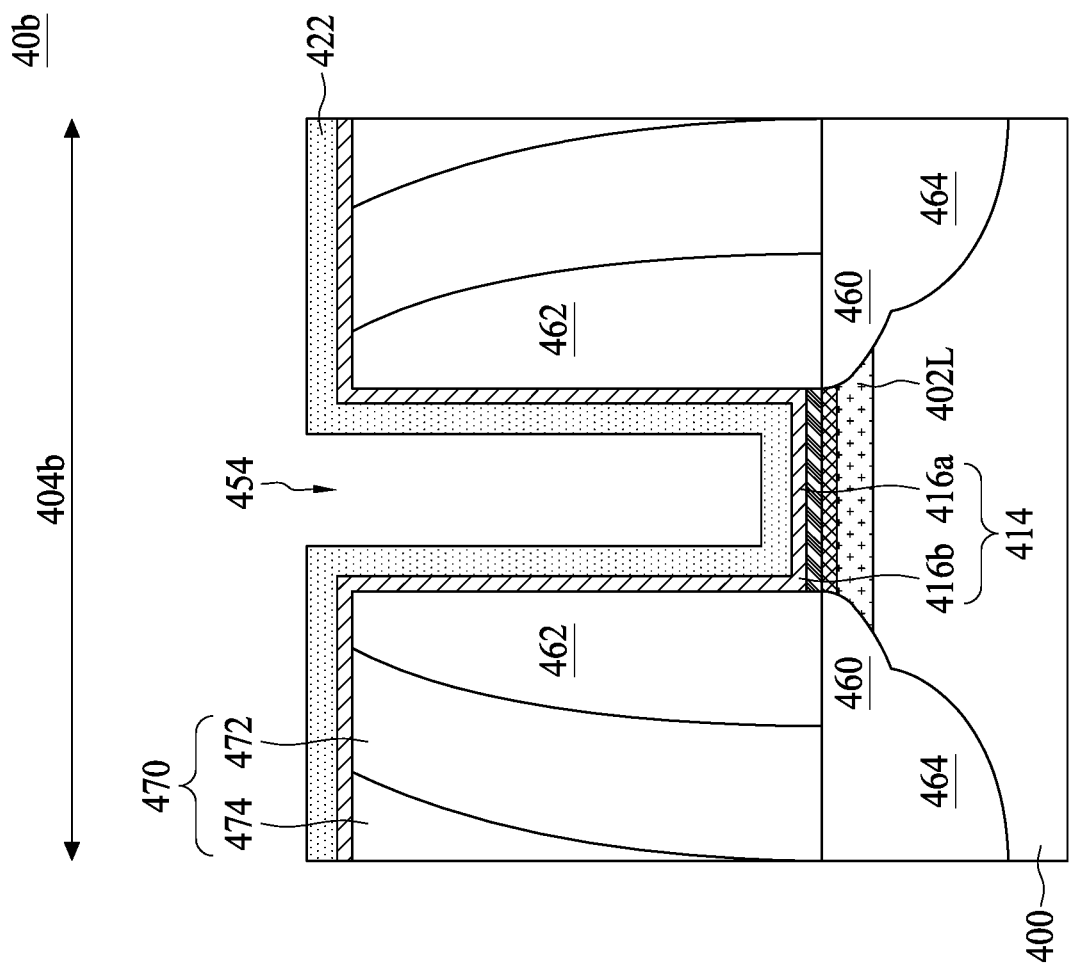

Referring to FIGS. 3 and 7D, a third sacrificial cap 422 including Si is formed on the dielectric layer 414 in operation 324. In some embodiments, the third sacrificial cap 422 may include an amorphous silicon layer or a polysilicon layer. In some embodiments, a thickness of the third sacrificial cap 422 is greater than 10 Å, but the disclosure is not limited thereto. The method of forming the third sacrificial cap 422 can be similar to methods described above; therefore, similar details are omitted in the interest of brevity.

Figure 7E:
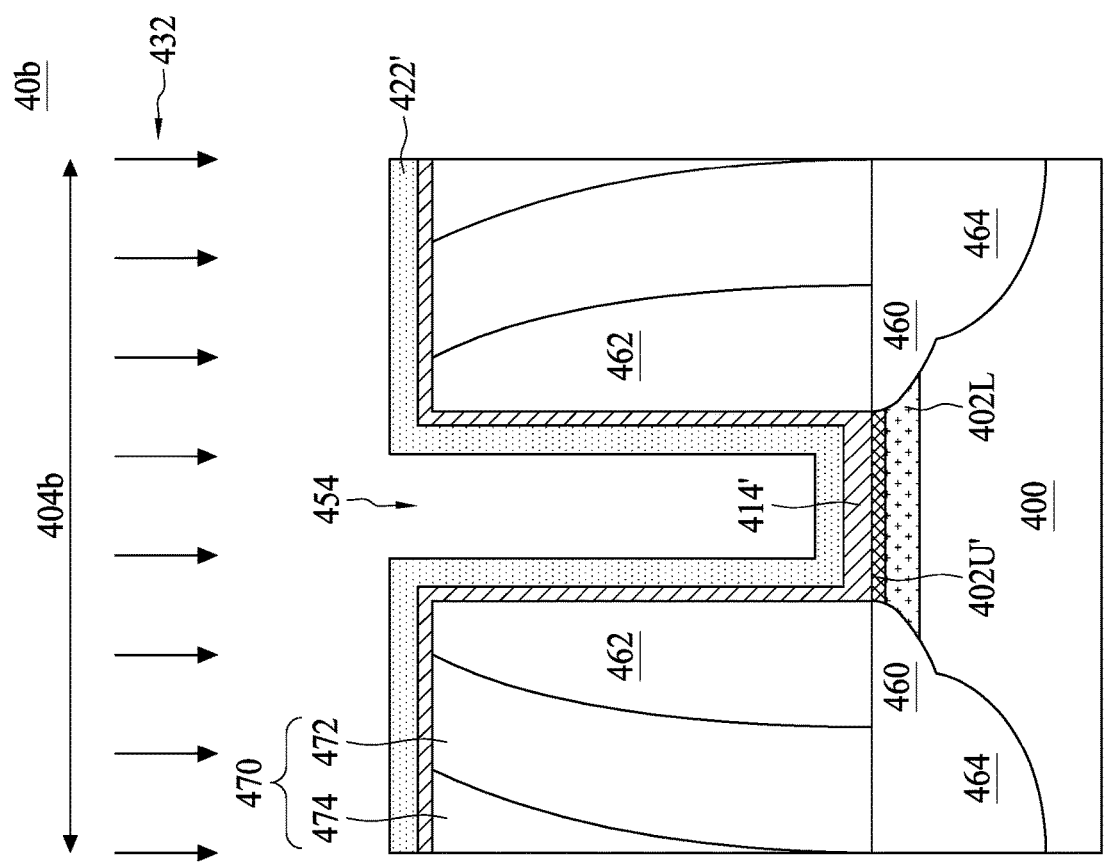

Referring to FIGS. 3 and 7E, the substrate 400 is annealed to transform the third sacrificial cap 422 into a fourth sacrificial cap 422' in operation 325. In some embodiments, an anneal 432 is performed, wherein the details of the anneal 432 can be similar to those of anneals described above; therefore, similar details are omitted in the interest of brevity. During the anneal 432, Ge atoms may diffuse from the channel layer 402 and from the first dielectric layer 416a. Further, the Ge atoms may diffuse upwardly and pass the second dielectric layer 416b, and stay with Si atoms in the third sacrificial cap 422. Accordingly, the third sacrificial cap 422 including Si is transformed into the fourth sacrificial cap 422' including silicon germanium. The fourth sacrificial cap 422' may include Ge atoms from the channel layer 402 and from the first dielectric layer 416a. It should be noted that the thickness of the third sacrificial cap 422 (now the fourth sacrificial cap 422') is greater than 10 Å in order to provide sufficient accommodations for Ge atoms.

It should be noted that the first portion 402U' of the channel layer 402 in the core region 404b may undergo the anneal twice (i.e., the anneal 430 and the anneal 432), therefore more Ge atoms may diffuse from the first portion 402U' of the channel layer 402 in the core region 404b. Accordingly, the Ge concentration in the first portion 402U' of the channel layer 402 in the core region 404b may be further reduced.

Further, Ge atoms in the first dielectric layer 416a may also diffuse into the third sacrificial cap 422, and thus the first dielectric layer 416a, which includes a silicon germanium oxide layer, may be transformed into a silicon oxide layer. Accordingly, a dielectric layer 414' including silicon oxide may be formed after operation 325. In some embodiments, the dielectric layer 414' includes the original second dielectric layer 416b including silicon oxide and the first dielectric layer 416a previously including silicon germanium oxide and now including silicon oxide. In some embodiments, the Ge concentration in the dielectric layer 414' is less than 3%. In some embodiments, the Ge concentration in the dielectric layer 414' is less than 1.5%.

Figure 7F:
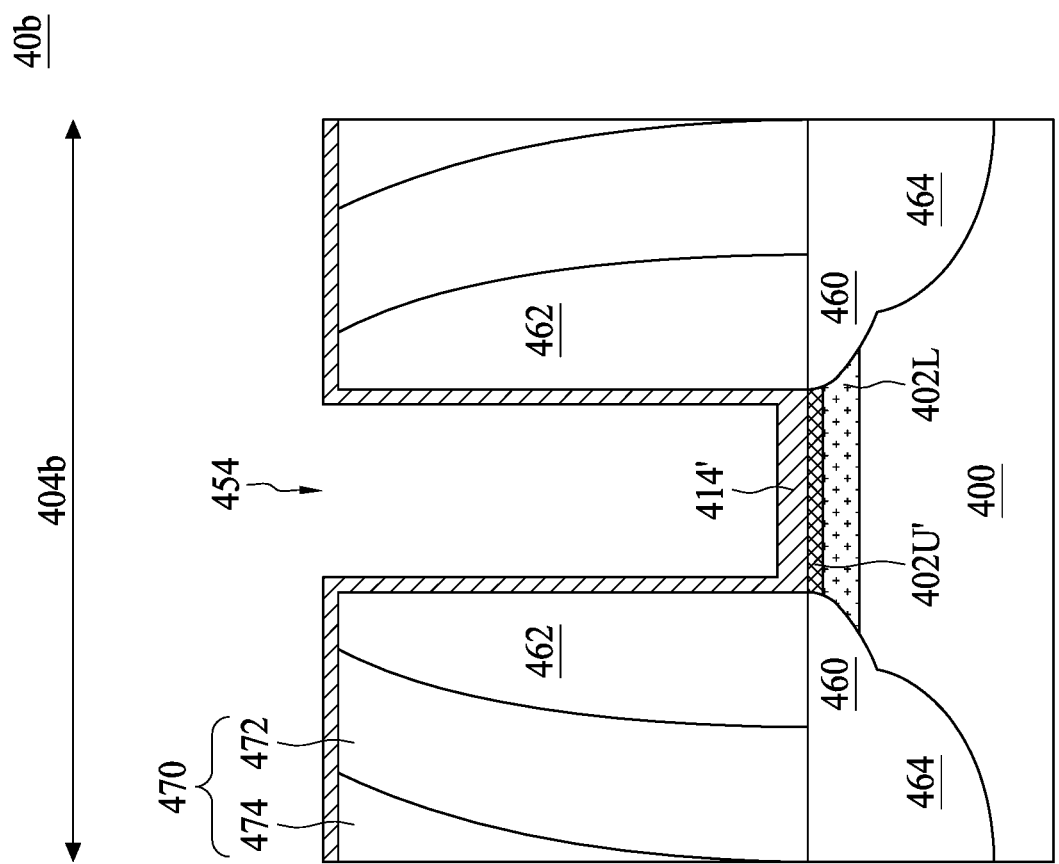

Referring to FIGS. 3 and 7F, the fourth sacrificial cap 422' is removed to expose the dielectric layer 414' in operation 326. In some embodiments, the dielectric layer 414' serves as an IL for a transistor device, and a thickness of the dielectric layer 414' may be less than approximately 20 Å, but the disclosure is not limited thereto.

Figure 7G:
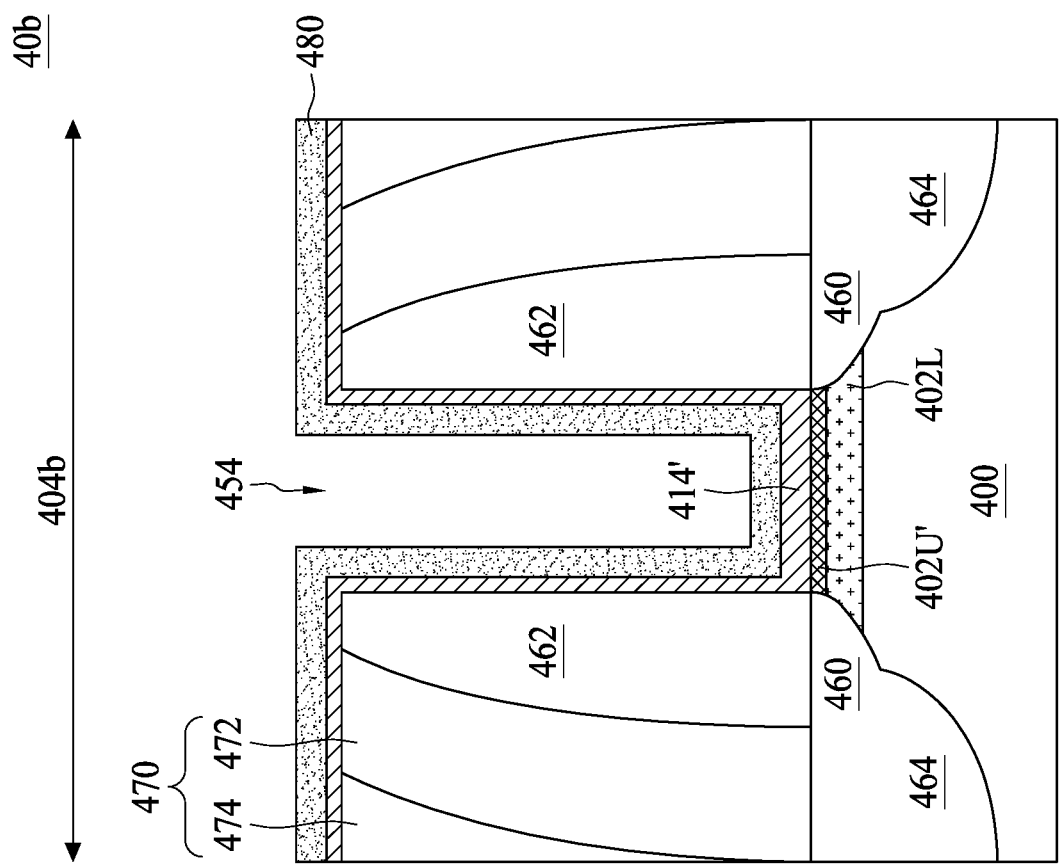

Referring to FIGS. 3 and 7G, a high-k dielectric layer 480 is formed on the dielectric layer 414' in operation 327. In some embodiments, the high-k dielectric layer 480 may include $HfO_2$, $ZrO_2$, $La_2O_3$, $Al_2O_3$, $TiO_2$, $Y_2O_3$, $SrTiO_3$, HfOxNy, other suitable metal-oxides, or combinations thereof.

Figure 7H:
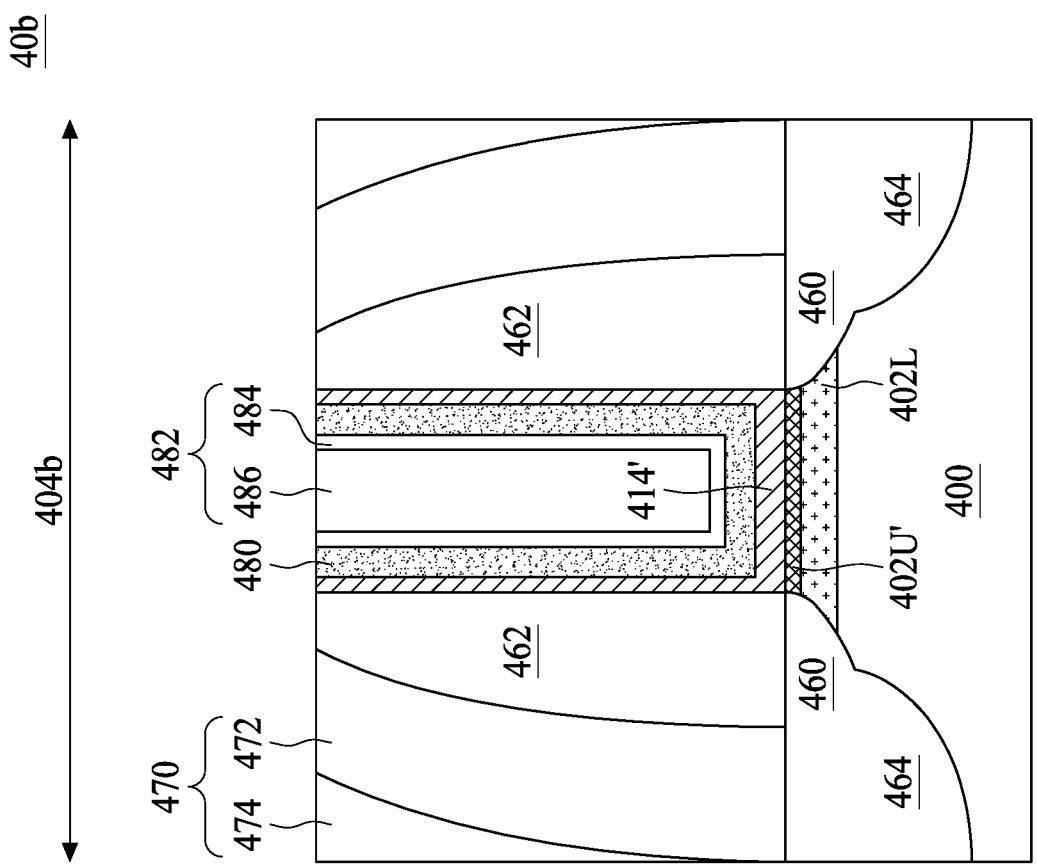

Referring to FIGS. 3 and 7H, a metal gate structure 482 is formed over the high-k dielectric layer 480 in operation 328. In some embodiments, the metal gate structure 482 can include at least a barrier metal layer (not shown), a work function metal layer 484 and a gap-filling metal layer 486. The barrier metal layer can include, for example but not limited to, TiN. The work function metal layer 484 can include a single layer of TiN, TaN, TaAlC, TiC, TaC, Co, Al, TiAl, HfTi, TiSi, TaSi or TiAlC, or a multilayer of two or more of these materials, but is not limited thereto. For an n-channel FET, one or more of TaN, TaAlC, TiN, TiC, Co, TiAl, HfTi, TiSi and TaSi are used as the work function metal layer 484, and for a p-channel FET, one or more of TiAlC, Al, TiAl, TaN, TaAlC, TiN, TiC and Co are used as the work function metal layer 484. In some embodiments, the gap-filling metal layer 486 can include conductive material such as Al, Cu, AlCu, or W, but is not limited to such materials.

Accordingly, a planar SiGe MOSFET 40b having a metal gate is obtained in the core region 404b, according to the method 30.

According to the method 30, when the planar SiGe MOSFET device having the metal gate 40a is required in the I/O region 404a, operations 327 and 328 can be performed after operation 321, and when the planar SiGe MOSFET device having the metal gate 40b is required in the core region 404b, operations 322 to operation 328 can be performed after operation 321. In some embodiments, the semiconductor gate layer 450 in both of the device 40a and 40b can be removed simultaneously, in operation 321, and a protecting layer (not shown) can be formed in the I/O region 404a after the removal of the semiconductor gate layer in order to protect the dielectric layer 410' in the device 40a in the I/O region 404a. The operations 322 to 326 can be performed on the device 40b in the core region 404b without impacting the device 40a in the I/O region 404a. In such embodiments, the protecting layer can be removed after the removal of the fourth sacrificial cap 422' (i.e., operation 326), and the high-k gate dielectric layer 480 and the metal gate layer 482 can be formed in the gate trenches 454 in the SiGe MOSFET device 40a in the I/O region 404a and in the MOSFET device 40b in the core region 404b.

Figure 8:
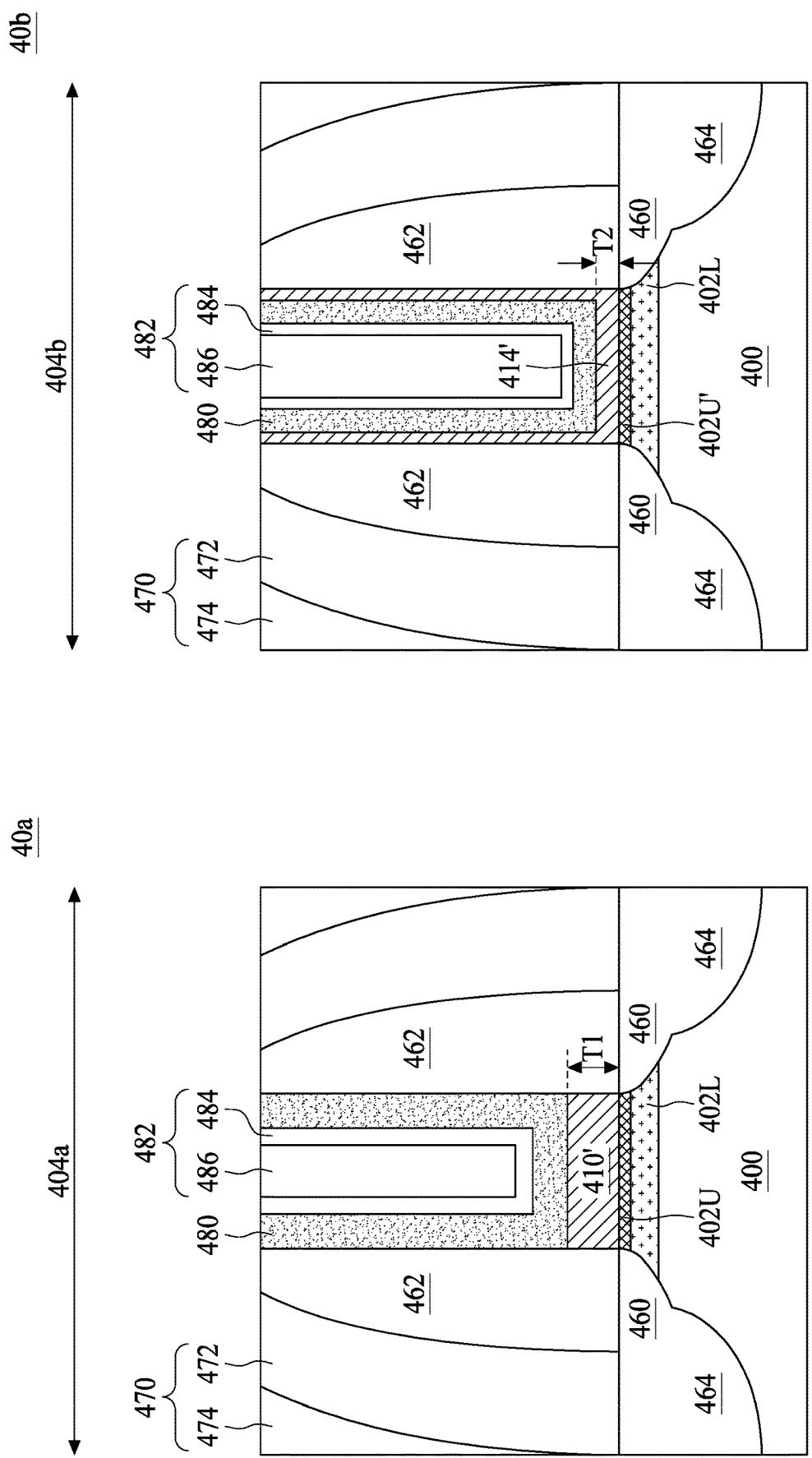
FIG. 8 is a schematic drawing illustrating a semiconductor structure according to aspects of the present disclosure in one or more embodiments.

Referring to FIG. 8, accordingly, a semiconductor structure is provided. The semiconductor structure includes a substrate 400 including a first region 404a (i.e., an I/O region) and a second region 404b (i.e., a core region). The semiconductor structure includes a channel layer 402 disposed in the first region 404a and a channel layer 402 disposed in the second region 404b. As described above, the channel layer 402 in the first region 404a includes a Ge compound such as silicon germanium and the channel layer 402 in the second region 404b includes a Ge compound such as silicon germanium. In some embodiments, the channel layer 402 in the first region 404a includes a first portion 402U and a second portion 402L, wherein the Ge concentration in the first portion 402U is less than that in the second portion 402L. In some embodiments, the channel layer 402 in the second region 404b includes a first portion 402U' and the second portion 402L, wherein the Ge concentration in the first portion 402U' is less than that of the second portion 402L. In some embodiments, the second portions 402L of the channel layers 402 in both of the first and second regions 404a and 404b may include the same Ge concentration. However, because the first portion 402U' of the channel layer 402 in the core region 404b may undergo the anneal twice (i.e., the anneal 430 and the anneal 432), more Ge atoms may diffuse from the first portion 402U' of the channel layer 402 in the core region 404b. Accordingly, the Ge concentration in the first portion 402U' of the channel layer 402 in the second region 404b may be less than the Ge concentration in the first portion 402U of the channel layer 402 in the first region 404a.

Still referring to FIG. 8, the semiconductor structure further includes a dielectric layer 410' disposed on the channel layer 402 in the first region 404a and a dielectric layer 414' disposed on the channel layer 402 in the second region 404b. In some embodiments, the dielectric layer 410' and the dielectric layer 414' may serve as an interfacial layer (IL), wherein a high-k dielectric layer 480 is disposed on the dielectric layer 410' and the dielectric layer 414', respectively, as shown in FIG. 8. A metal gate electrode including a work function metal layer 484 and a gap-filling metal layer 486 can be formed on the high-k dielectric layer 480, respectively, as shown in FIG. 8.

The dielectric layer 410' includes a thickness T1, and the dielectric layer 414' includes a thickness T2. In some embodiments, the thickness T1 of the dielectric layer 410' in the first region 404a is greater than the thickness T2 of the dielectric layer 414' in the second region 404b. In some embodiments, the thickness T1 of the dielectric layer 410' in the first region 404a is between approximately 10 Å and approximately 50 Å, but the disclosure is not limited thereto. In some embodiments, the thickness T2 of the dielectric layer 414' in the second region 404b is less than 20 Å, but the disclosure is not limited thereto. In some embodiments, the dielectric layer 410' in the first region 404a may be disposed between the high-k dielectric layer 480 and the channel layer 402, and may have a flat shape, as shown in FIG. 8. In some embodiments, the dielectric layer 414' in the second region 404b may be disposed not only between the high-k dielectric layer 480 and the channel layer 402 but also between the high-k dielectric layer 480 and the spacer 462. Further, the dielectric layer 414' may have a U shape, as shown in FIG. 8. Additionally, portions of the dielectric layer 414' are in contact with the spacer 462 and a portion of the dielectric layer 414' is in contact with the channel layer 402. In some embodiments, a thickness of the portions of the dielectric layer 414' that are in contact with the spacer 462 is less than a thickness of the portion of the dielectric layer 414' that is in contact with the channel layer 402, but the disclosure is not limited thereto. However, in some embodiments, when the dielectric layer 414' is formed by oxidation or thermal oxidation, the dielectric layer 414' can have a flat shape, though not shown.

According to the method 30, the Ge concentrations in the dielectric layers 410' and 414' are less than 3% or even less than 1.5%, while the Ge concentration in the dielectric layer 414' may be even less than that in the dielectric layer 410'. Consequently, gate leakage current (Jg) is reduced by the dielectric layers 410' and 414' and reliability of the SiGe MOSFET devices 40a and 40b is improved. Further, interface trap density (Dit) and density of interface states are also reduced by the method 30. Therefore the carrier mobility of the SiGe MOSFET devices 40a and 40b is improved by the SiGe channel layer 402 while the carrier mobility degradation issue caused by high Dit and density of interface states is mitigated.

As the semiconductor industry has progressed into nanometer technology process nodes in pursuit of higher device density, higher performance and lower costs, challenges from both fabrication and design issues have led to the development of three-dimensional designs, such as the FinFET device. FinFET devices are fabricated with a thin "fin" or "fin structure" vertically extending from a substrate, wherein a gate electrode is formed over the fin. Thus, the channel of the FinFET device is formed. In some embodiments, the cap-free dielectric design described above can be integrated in non-planar transistor devices, such as FinFET devices. The FinFET device, for example, may be a complementary metal-oxide-semiconductor (CMOS) device including a p-type MOS FinFET device and an n-type MOS FinFET device. The following disclosure will continue with description of a CMOS FinFET device to illustrate various embodiments of the present disclosure. It is understood, however, that the application should be not limited to a particular type of device, except as specifically claimed.

Figure 9:
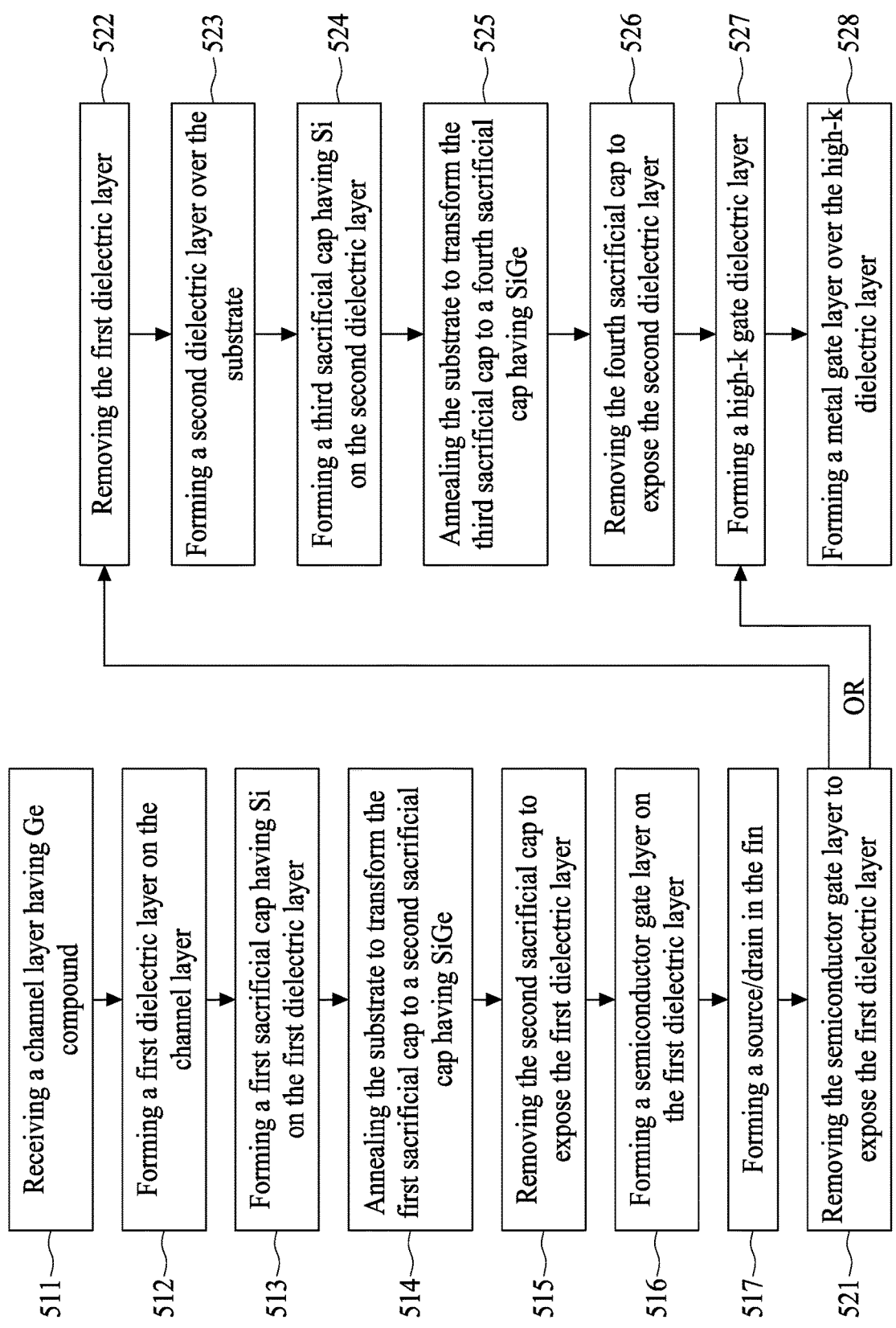
FIG. 9 is a flow diagram of some embodiments of a method of forming a semiconductor structure.

The abovementioned cap-free dielectric design described above can be integrated in non-planar transistor devices such as FinFET devices. FIG. 9 is a flow diagram of some embodiments of a method of forming a semiconductor structure, and FIGS. 10A to 10F are schematic drawings illustrating a semiconductor structure at various fabrication stages constructed according to aspects of the present disclosure in one or more embodiments. In some embodiments, a method of forming a semiconductor structure 60 is provided, and the method 50 includes a number of operations (511, 512, 513, 514, 515, 516 and 517).

Figure 10B:
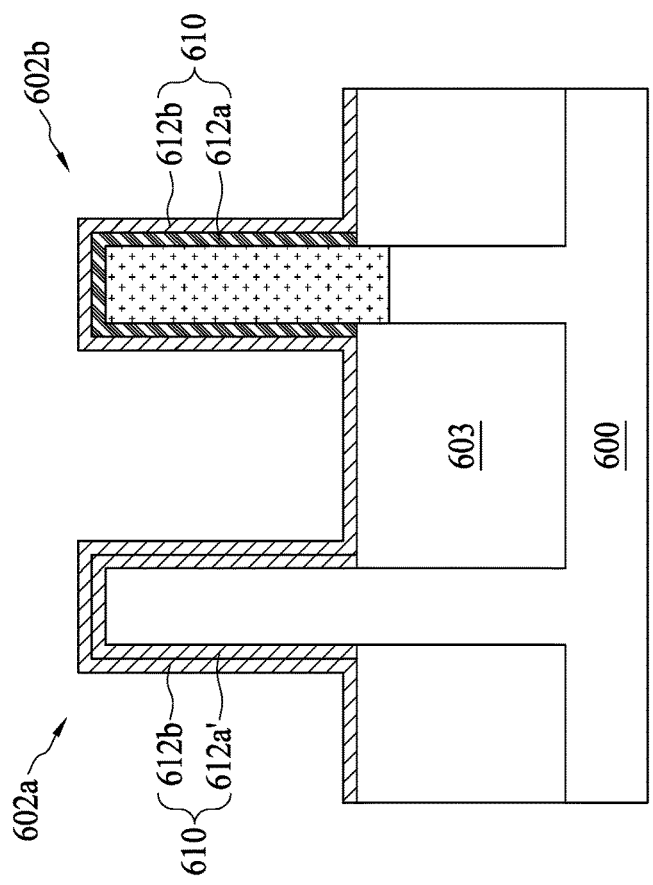
FIGS. 10A to 10F are schematic drawings illustrating a semiconductor structure at various fabrication stages constructed according to aspects of the present disclosure in one or more embodiments.
Figure 10A:
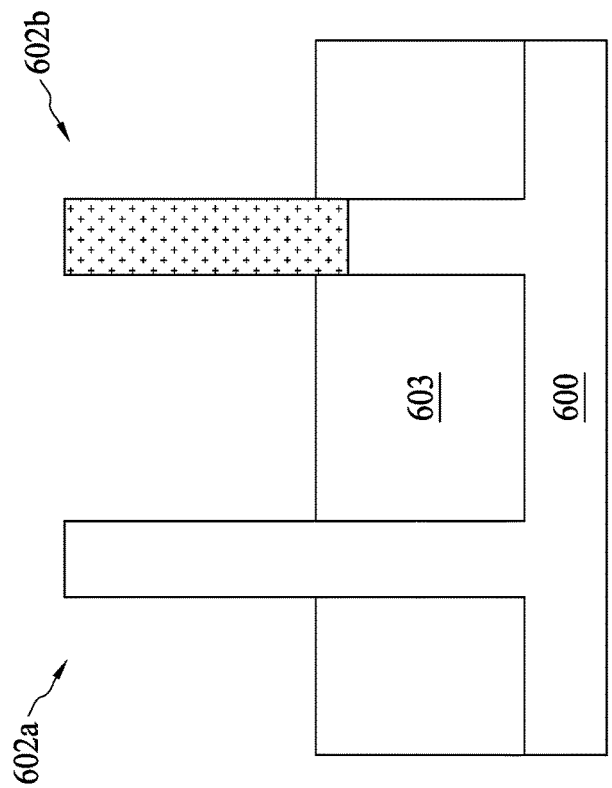

FIGS. 10A to 10F are schematic drawings illustrating a semiconductor structure at various fabrication stages constructed according to aspects of the present disclosure in one or more embodiments. Referring to FIGS. 9 and 10A, a substrate 600 including a channel layer is received in operation 511. In some embodiments of the present disclosure, the substrate 600 may be made of Si or other semiconductor materials. Alternatively or additionally, the substrate 600 may include other elementary semiconductor materials such as Ge. In some embodiments, the substrate 600 is made of a compound semiconductor such as SiC, GaAs, InAs, InP or the like. In some embodiments, the substrate 600 is made of an alloy semiconductor such as SiGe, SiGeC, GaAsP, GaInP, or the like. In some embodiments, the substrate 600 includes an epitaxial layer. For example, the substrate 600 includes an epitaxial layer overlying a bulk semiconductor. In some embodiments, the substrate 600 can include an SOI substrate or a germanium-on-insulator (GOI) substrate. In some embodiments, the substrate 600 can include various doped regions and other suitable features.

In some embodiments, an anti-punch through implant (APT) region (not shown) can be formed in the substrate 600. The APT region is used to reduce sub-threshold source-to-drain leakage and drain-induced barrier lowering (DIBL). The APT region may be an n-type APT region or a p-type APT region. In some embodiments, the n-type APT region is obtained by doping with an n-type dopant, such as As, P, or antimony (Sb). In some embodiments, the p-type APT region is obtained by doping with a p-type dopant, such as boron (B), or boron fluorine ($BF_2$). In some embodiments, a thermal operation can be performed to activate the dopant in the APT region. In some embodiments, the thermal process is performed by a rapid thermal annealing process, but is not limited thereto.

As shown in FIG. 10A, a fin structure 602a and a fin structure 602b are disposed over the substrate 600 and protrude from the substrate 600. Further, each fin structure 602a, 602b includes a semiconductor layer. In some embodiments, the fin structure 602a and the substrate 600 may include the same material, such as Si. Alternatively, the fin structure 602a and the substrate 600 may include different materials. In some embodiments, the fin structure 602b may include materials different from those of the substrate 600.

For example, the substrate 600 may include silicon, and the fin structure 602b may include silicon germanium. The fin structure 602b may include silicon carbide or Sn, as another example. In some embodiments, the fin structure 602a and the fin structure 602b are recognized as including different semiconductor layers. For example but not limited thereto, the fin structure 602a includes a Si layer while the fin structure 602b includes a $Si_{1-x}Ge_x$ layer, wherein the germanium content, x, ranges from 0 to 1. In some embodiments, the germanium content may be greater than 0.3. In some embodiments, the Ge content may be greater than 0.35, but the disclosure is not limited thereto.

The fin structures 602a and 602b may be formed using a subtractive etch process, by patterning a substrate 600, and masking the fin structure 602b while a substance is introduced to alter the material of the fin structure 602b to include a compound semiconductor material or other material different from the substrate 600 material. The fin structure 602b may be altered to include the material different from that of the substrate 600 using an epitaxial growth process, implantation process, deposition process, or other type of process. Further, an isolation structure 603 may be disposed between the fin structures 602a and 602b to electrically isolate the fin structures 602a and 602b.

In some embodiments, the isolation structure 603 may be formed between the fin structures 602a and 602b, by depositing insulating material over and between the fin structures 602a and 602b, and removing any excess insulating material from over top surfaces of the fin structures 602a and 602b using a CMP operation and/or an etch operation, as examples. In other embodiments, the isolation structure 603 may be formed over the substrate 600, and patterned with a pattern for the fin structures 602a and 602b. The fin structures 602a and/or 602b are then epitaxially grown within the patterns formed within the isolation structure 603. Two separate processes may be used to form the fin structure 602a and the fin structure 602b, so that they include different materials, depending on the desired functionality of the fin structures 602a and 602b for the particular type of FinFET devices they will be used in, for example. In still other embodiments, combinations of subtractive etch processes and epitaxial growth processes may also be used to form the fin structures 602a and 602b. The fin structure 602a may be formed using a subtractive etch process, and at least a portion of the fin structure 602b may be formed using an epitaxial growth process, for example. The isolation structure 603 may be recessed before or after the formation of the fin structures 602a and 602b so that a top surface of the isolation structure 603 is recessed below the top surfaces of the fin structures 602a and 602b, as shown in FIG. 10A.

Referring to FIGS. 9 and 10B, a dielectric layer 610 is formed on the fin structures 602a and 602b in operation 512. The dielectric layer 610 can include semiconductor oxide. For example, the dielectric layer 610 may include a silicon oxide layer, but the disclosure is not limited thereto. In some embodiments, the dielectric layer 610 may include a first dielectric layer 612a and a second dielectric layer 612b, or a first dielectric layer 612a' and a second dielectric layer 612b. As shown in FIG. 10B, the first dielectric layer 612a is sandwiched between the second dielectric layer 612b and the fin structure 602b, and the first dielectric layer 612a' is sandwiched between the second dielectric layer 612b and the fin structure 602a. In some embodiments, the first dielectric layer 612a and 612a' may be a III-V compound semiconductor oxide layer. In some embodiments, the III-V compound semiconductor oxide layer may be a native oxide layer that is spontaneously grown on a surface of the fin structures 602a and 602b, respectively. For example, the first dielectric layer 612a may be a native silicon germanium oxide ($Si_xGe_yO$) layer spontaneously grown on a surface of the SiGe fin structure 602b, wherein x is between approximately 0.6 and approximately 1, and y is between approximately 0.4 and approximately 0. The first dielectric layer 612a' may be a native silicon oxide layer spontaneously grown on a surface of the Si fin structure 602a. In some embodiments, the second dielectric layer 612b may be a silicon oxide layer. In some embodiments, the second dielectric layer 612b may be a chemical oxide layer formed by suitable thermal oxidation or deposition. The method of forming the second dielectric layer 612b can be similar to methods described above; therefore, similar details are omitted in the interest of brevity. In some embodiments, a thickness of the dielectric layer 610 (i.e., a sum of a thickness of the second dielectric layer 612b and a thickness of the first dielectric layer 612a or 612a') is between approximately 10 Å and approximately 50 Å, but the disclosure is not limited thereto. In other embodiments, the thickness of the dielectric layer 610 is less than 20 Å, but the disclosure is not limited thereto.

Figures 10C, 10D:
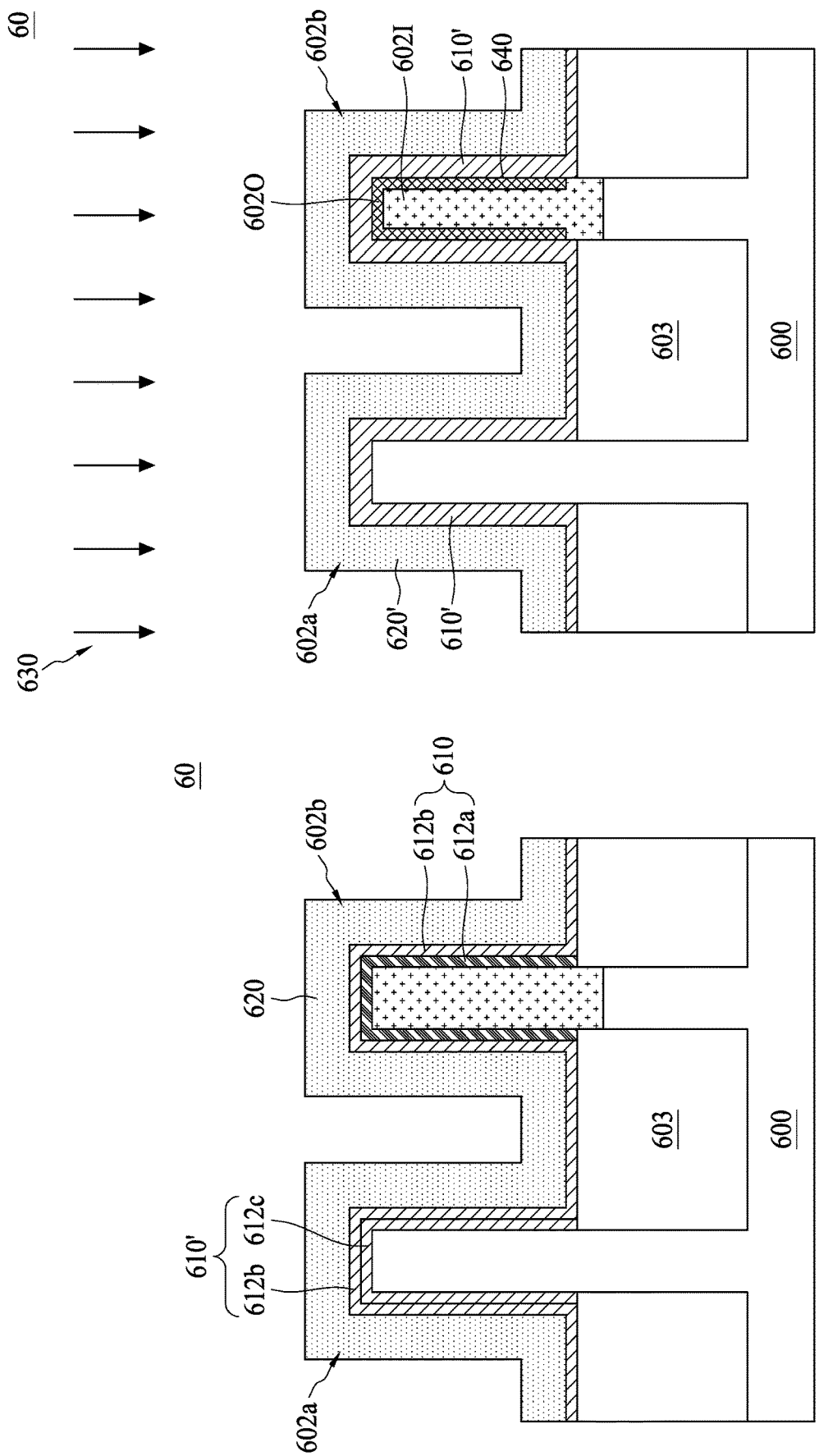

Still referring to FIGS. 9 and 10C, a first sacrificial cap 620 including Si is formed on the dielectric layer 610 in operation 513. In some embodiments, the first sacrificial cap 620 may include an amorphous silicon layer or a polysilicon layer. In some embodiments, a thickness of the first sacrificial cap 620 is greater than 20 Å, but the disclosure is not limited thereto. The method of forming the first sacrificial cap 620 can be similar to methods described above; therefore, similar details are omitted in the interest of brevity. In some embodiments, the first sacrificial cap 620 is conformally formed to cover the fin structures 602a and 602b, the substrate 600 and the isolation structure 503, but the disclosure is not limited thereto. In some embodiments, the thickness of the first sacrificial cap 620 is sufficiently thick so that the space between the fin structures 602a and 602b is filled by the first sacrificial cap 620, but the disclosure is not limited thereto.

Referring to FIGS. 9 and 10D, the substrate 600 is annealed to transform the first sacrificial cap 620 into a second sacrificial cap 620' in operation 614. In some embodiments, an anneal 630 is performed, wherein the details of the anneal 630 can be similar to those of anneals described above; therefore, similar details are omitted in the interest of brevity. During the anneal 630, Ge atoms diffuse from the fin structure 602b and from the first dielectric layer 612a over the fin structure 602b. Further, Ge atoms may diffuse upwardly and pass the second dielectric layer 612b, and stay with Si atoms in the first sacrificial cap 620. Accordingly, the first sacrificial cap 620 including silicon is transformed into the second sacrificial cap 620' including silicon germanium. In other words, the second sacrificial cap 620' may include Ge atoms from the fin structure 602b and from the first dielectric layer 612a. It should be noted that the thickness of the first sacrificial cap 620 (now the second sacrificial cap 620') is greater than 20 Å in order to provide sufficient accommodations for the Ge atoms.

In some embodiments, the first dielectric layer 612a' including silicon oxide and the second dielectric layer 612b including silicon oxide over the fin structure 602a are densified during the anneal 630, and thus quality of the silicon oxide dielectric layer 610' over the fin structure 602a is improved.

As described above, Ge atoms may diffuse from the semiconductor layer in the fin structure 602b. Accordingly, a portion of the fin structure 602b may lose Ge atom. In some embodiments, it is observed that a portion of the fin structure 602b, usually an outer portion, is likely to exhibit Ge diffusion. Accordingly, the portion having a lower Ge concentration is recognized and defined as a first portion 6020, while the other portion, usually a portion located inside of the first portion 6020, having the Ge concentration greater than that of the first portion 6020, is recognized and defined as a second portion 6021. In some embodiments, the Ge concentration in the second portion 6021 may be substantially equal to an original Ge concentration in the fin structure 602b. The first portion 6020 of the fin structure 602b has a first Ge concentration prior to the annealing of the substrate 600 and a second Ge concentration after the annealing of the substrate 600. In some embodiments, the first Ge concentration in the first portion 6020 is substantially equal to the Ge concentration in the second portion 6021, which is the original Ge concentration. The second Ge concentration in the first portion 6020 is less than the first Ge concentration in the first portion 6020 and the Ge concentration in the second portion 6021. For example but not limited thereto, the first Ge concentration in the first portion 6020 and the Ge concentration in the second portion 6021 may be greater than approximately 30%, while the second Ge concentration in the first portion 6020 may be less than approximately 25%. Accordingly, a Ge concentration in an interface 640 between the dielectric layer 610 and the fin structure 602b is reduced from greater than approximately 30% to less than approximately 25%, but the disclosure is not limited thereto.

Further, Ge atoms in the first dielectric layer 612a may also diffuse into the first sacrificial cap 620, and thus the first dielectric layer 612a, which includes a silicon germanium oxide layer may be transformed into a silicon oxide layer. Accordingly, a dielectric layer 610' including silicon oxide may be formed after operation 314. In some embodiments, the dielectric layer 610' includes the original second dielectric layer 612b including silicon oxide and the first dielectric layer 612a previously including silicon germanium oxide and now including silicon oxide. In some embodiments, the Ge concentration in the dielectric layer 610' is less than 3%. In some embodiments, the Ge concentration in the dielectric layer 610' is less than 1.5%.

Figure 10F:
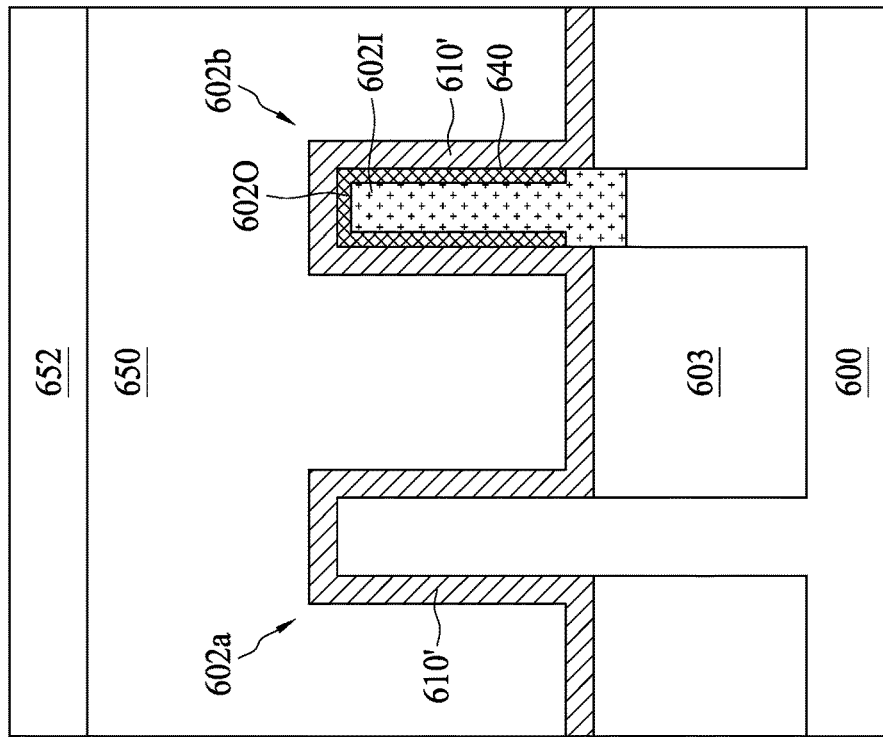
Figure 10E:
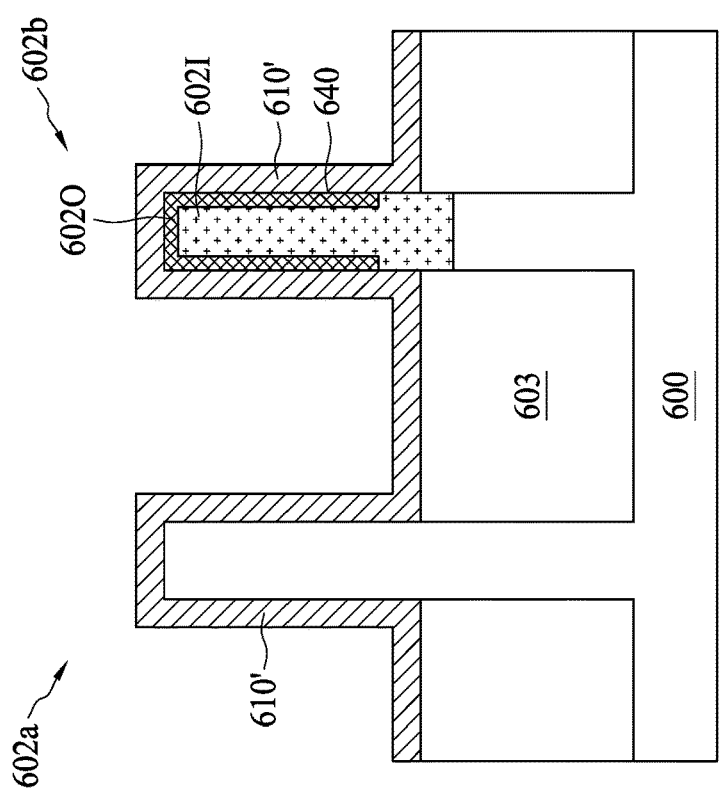

Referring to FIGS. 9 and 10E, the second sacrificial cap 620' is removed to expose the dielectric layer 610' in operation 515. Referring to FIGS. 9 and 10F, a semiconductor gate layer 650 is formed over the dielectric layer 610' in operation 516. In some embodiments, the dielectric layer 610' serves as a gate dielectric layer for a transistor device, and a thickness of the dielectric layer 610' may be between approximately 10 Å and approximately 50 Å, but the disclosure is not limited thereto. In such embodiments, the gate layer can include a semiconductor material; for example, a doped polysilicon is formed to serve as the semiconductor gate layer 650.

Still referring to FIG. 10F, in some embodiments, a patterned hard mask 652 is formed on the semiconductor gate layer 650, and the semiconductor gate layer 650 is patterned through the patterned hard mask, such that a gate structure including the semiconductor gate layer 650 and the dielectric layer 610' is obtained. Accordingly, a channel layer is formed in the fin structures 602a and 602b beneath the gate structure.

Figure 11:
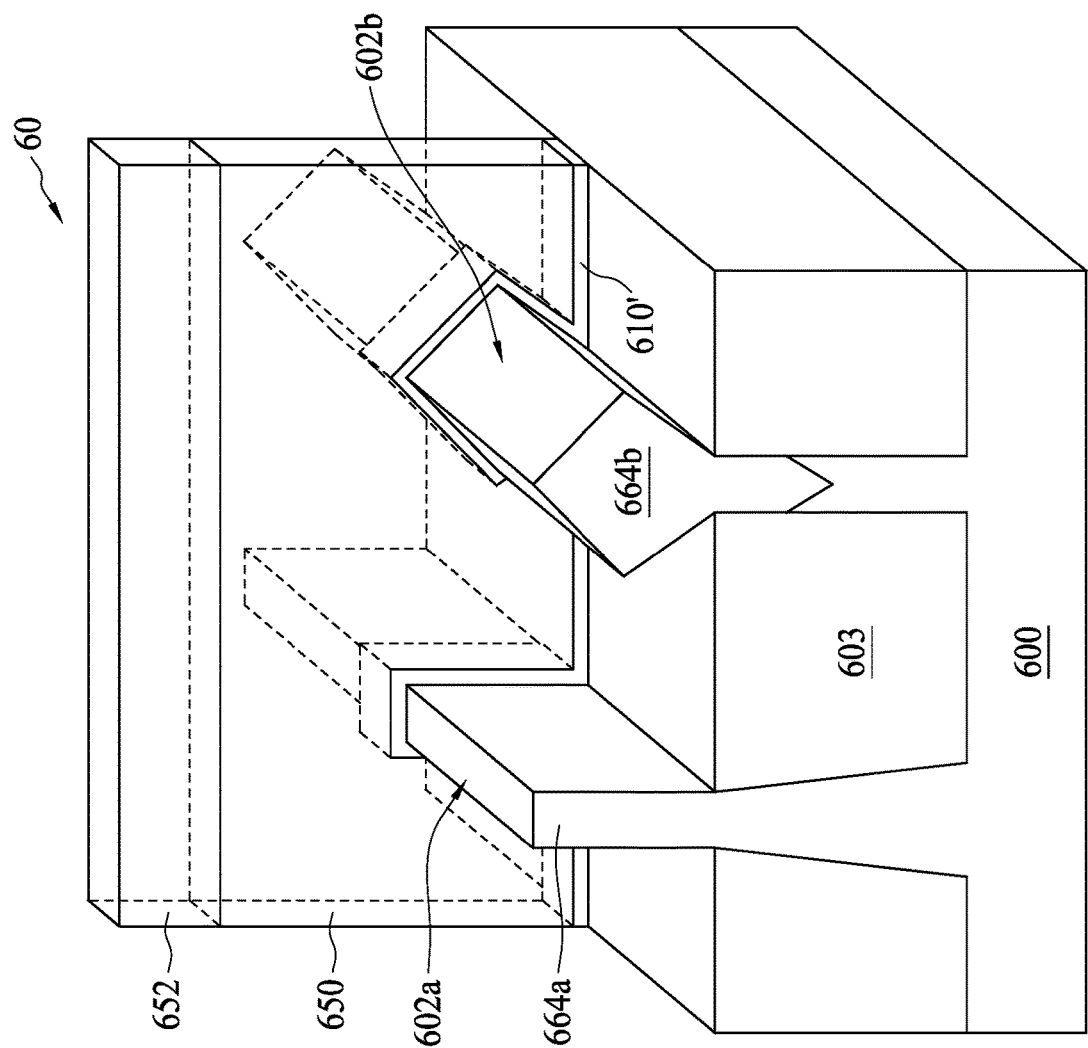
FIG. 11 is a schematic drawing illustrating a semiconductor structure according to aspects of the present disclosure in one or more embodiments.

Referring to FIG. 11, in some embodiments, source/drain extension regions (not shown) for different devices (i.e., nMOS device and pMOS device) can be formed in the substrate 600 at two sides of the gate structure and spacer (not shown) can be formed on sidewalls of the gate structure. A source/drain 664a and a source/drain 664b for different devices can be formed in the substrate 600 at two sides of the gate structure and the spacers in operation 517. In some embodiments, at least the source/drain 664b can be a strained source/drain (S/D) structure for different devices. The strained S/D structures can be formed by growing a strained material in recesses (not shown) by an epitaxial (epi) operation. In some embodiments, a lattice constant of the strained material may be different from a lattice constant of the substrate. In some embodiments, materials for forming the strained S/D structures can be similar to materials described above; therefore, similar details are omitted for brevity. Accordingly, a semiconductor structure such as an non-planar MOSFET device (i.e., a FinFET device) 60 is obtained, as shown in FIG. 11.

The method of forming the semiconductor structure 50 uses a cap-free dielectric design. According to the method 50, the Ge concentration in the dielectric layer 610' is less than 3% or even less than 1.5%. Consequently, gate leakage current (Jg) is reduced by the dielectric layer 610' and reliability of the MOSFET device 60 including the SiGe fin structure 602b is improved. Further, interface trap density (Dit) and density of interface states are also reduced by the method 50. Therefore the carrier mobility is improved by the SiGe channel layer in the fin structure 602b while the carrier mobility degradation issue caused by high Dit and density of interface states is mitigated.

As described above, in some embodiments, metal gate approach can be adopted to use a high-k gate dielectric and a metal gate electrode to improve device performance. Therefore, the method 50 can further include a number of operations (521, 522, 523, 524, 525, 526, 527 and 528). In some embodiments, operation 521 can be performed after operation 517, but the disclosure is not limited thereto. In some embodiments, operations 527 and 528 can be performed after operation 521, but the disclosure is not limited thereto. In other embodiments, operations 522, 523, 524, 525, 526, 527 and 528 can be performed after operation 521, but the disclosure is not limited thereto.

Figure 12:
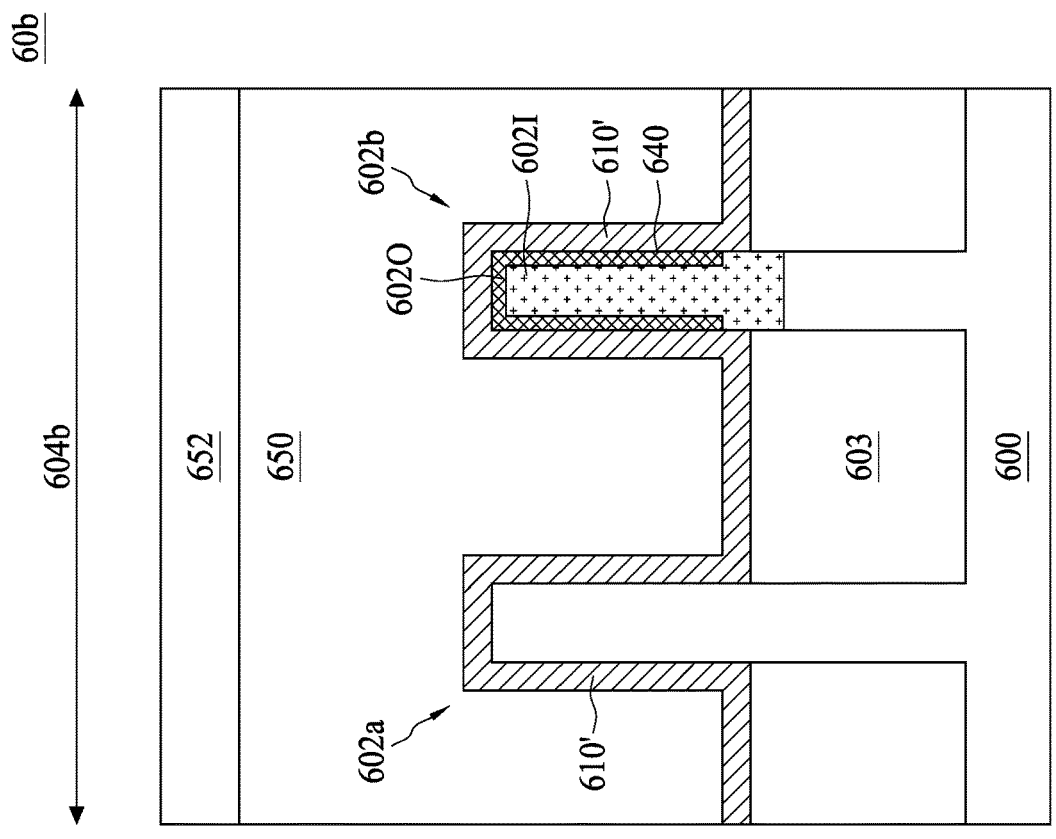
FIG. 12 is a drawing illustrating a semiconductor structure according to aspects of the present disclosure in one or more embodiments.
Figure 12:
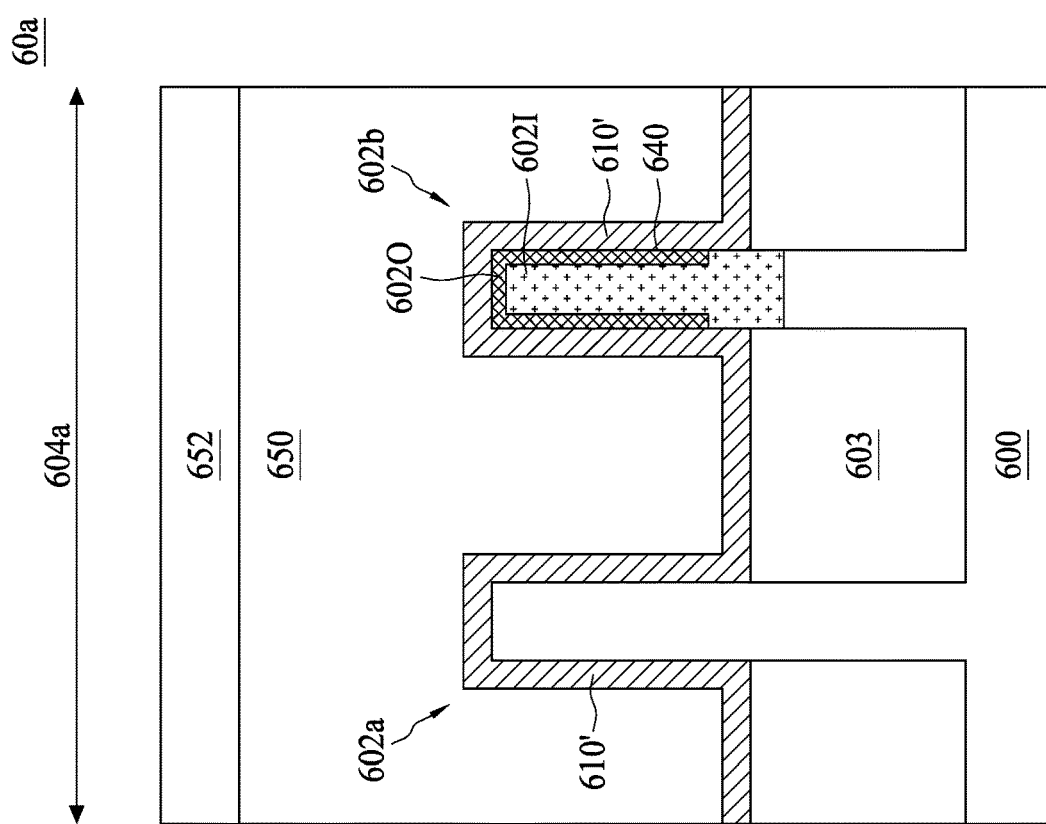

Referring to FIG. 12, as described above, devices in an I/O region and a core region are expected to work under different operation voltages, and thus different operations can be performed to form the devices in the I/O region and the core region. For example, in some embodiments, the above-mentioned operations 511, 512, 513, 514, 515, 516 and 517 are performed to simultaneously form a FinFET device 60a including a polysilicon gate electrode 650 in an I/O region 604a and a FinFET device 60b including polysilicon gate electrode 650 in a core region 604b, as shown in FIG. 12.

In some embodiments, a dielectric structure (not shown) can be formed over the substrate 600, such that the FinFET device 60a and the FinFET device 60b are both embedded in the dielectric structure. In some embodiments, the dielectric structure can include a CESL (not shown) and various dielectric layers (e.g., an inter-layer dielectric (ILD) layer) formed over the substrate after the forming of the strained S/D structures. The materials used to form the CESL and the ILD layers can be similar to materials described above; therefore, similar details are omitted for brevity.

Figure 13A:
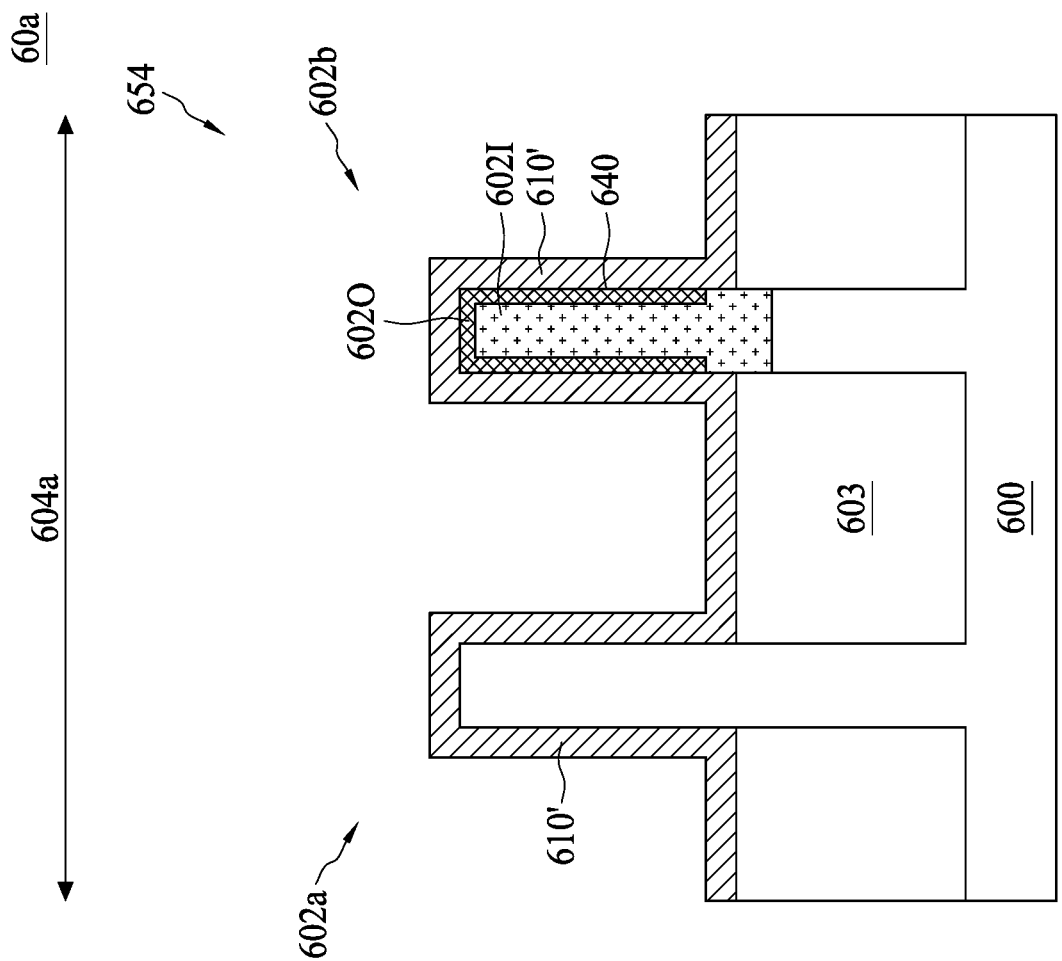
FIGS. 13A to 13C are schematic drawings illustrating a semiconductor structure at various fabrication stages constructed according to aspects of the present disclosure in one or more embodiments.
Figure 13B:
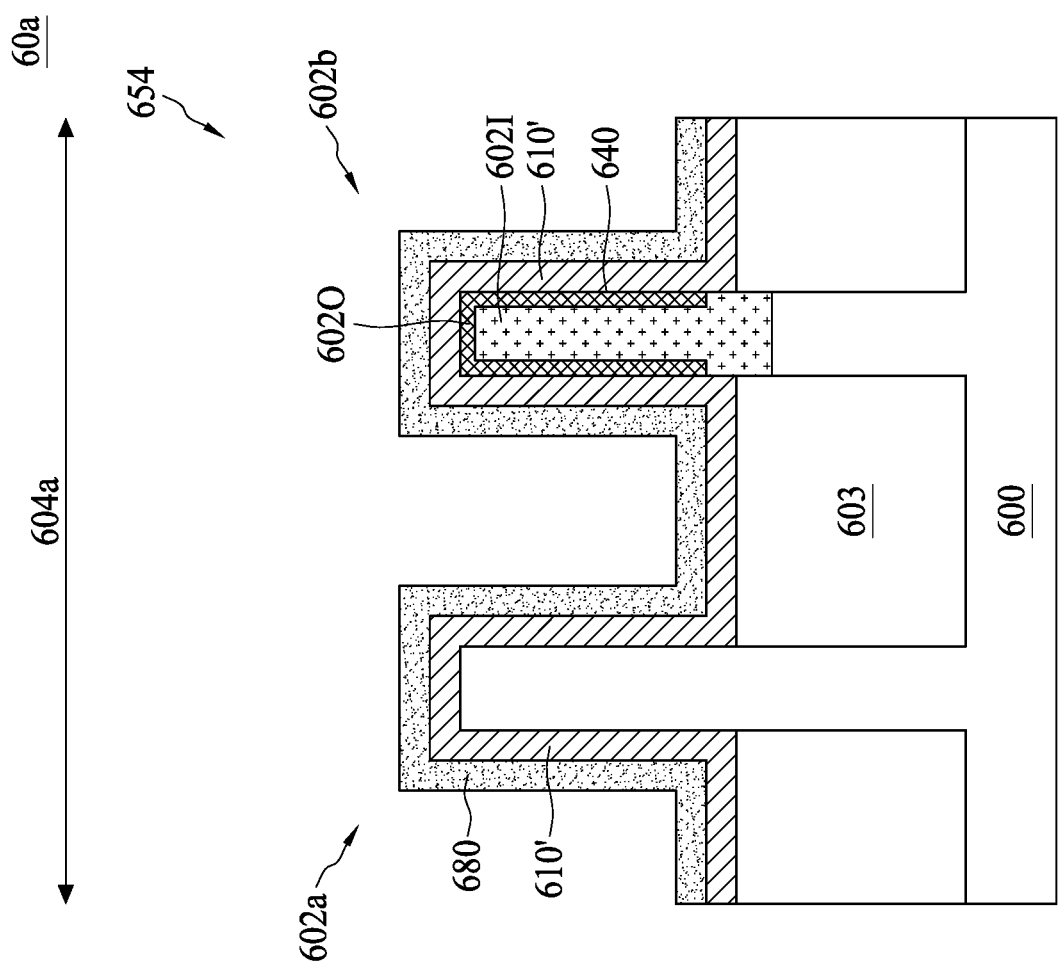
Figure 13C:
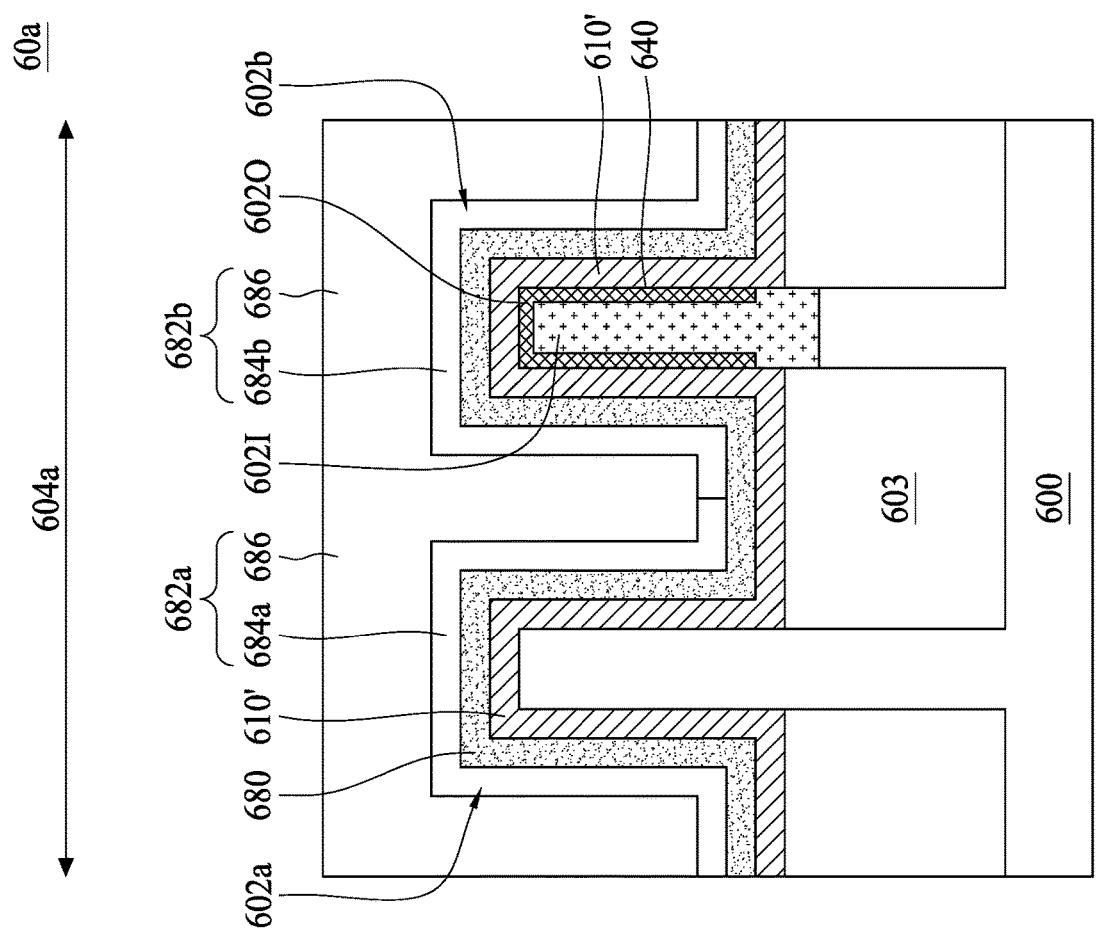

In some embodiments, the operations 521, 527 and 528 can be performed to form a FinFET device 60a having a metal gate electrode in the I/O region 604a, but the disclosure is not limited thereto. Accordingly, only the FinFET device 60a in the I/O region 604a is shown in FIGS. 13A to 13C. In some embodiments, the semiconductor gate layer 650 (i.e., the polysilicon gate electrode) serves as a sacrificial gate structure, also known as a dummy gate structure, in a replacement gate (RPG) approach. Referring to FIGS. 9 and 13A, in some embodiments, after the dielectric structure is formed, a planarization process, such as a CMP operation, may be performed to remove a portion of the dielectric structure, a portion of the spacer and the patterned hard mask 652. Consequently, a top surface of the semiconductor gate structure 650 is exposed. Subsequently, the semiconductor gate structure 650 is removed in operation 521. Consequently, a gate trench 654 is formed within the dielectric structure and the spacers. Further, the first dielectric layer 610' is exposed through the gate trench 654, as shown in FIG. 13A.

Referring to FIGS. 9 and 13B, a high-k dielectric layer 680 is formed on the first dielectric layer 610' in operation 527. The materials used to form the high-k dielectric layer 680 can be the same as materials described above; therefore, those details are omitted for brevity. In such embodiments, the dielectric layer 610' serves as an interfacial layer (IL) between the high-k dielectric layer 680 and the fin structures 602a and 602b.

Referring to FIGS. 9 and 13C, metal gate structures 682a and 682b are formed over the high-k dielectric layer 680 in operation 528. In some embodiments, the metal gate structure 682a can include at least a barrier metal layer (not shown), a work function metal layer 684a for the nMOS device and a gap-filling metal layer 686, while the metal gate structure 682b can include at least a barrier metal layer (not shown), a work function metal layer 684b for a pMOS device and a gap-filling metal layer 686. Materials for forming the barrier layer, the work function metal layers 684a and 684b, and the gap-filling layer 686 can be similar to materials described above; therefore, similar details are omitted for brevity.

Accordingly, a FinFET device 60a with metal gate is obtained in the I/O region 604a, according to the method 50. The FinFET device can be an n-type FinFET device and/or a p-type FinFET device. The n-type and p-type FinFET devices can be electrically connected to form a CMOS device in the I/O region 604a, as shown FIG. 13C.

Figure 14A:
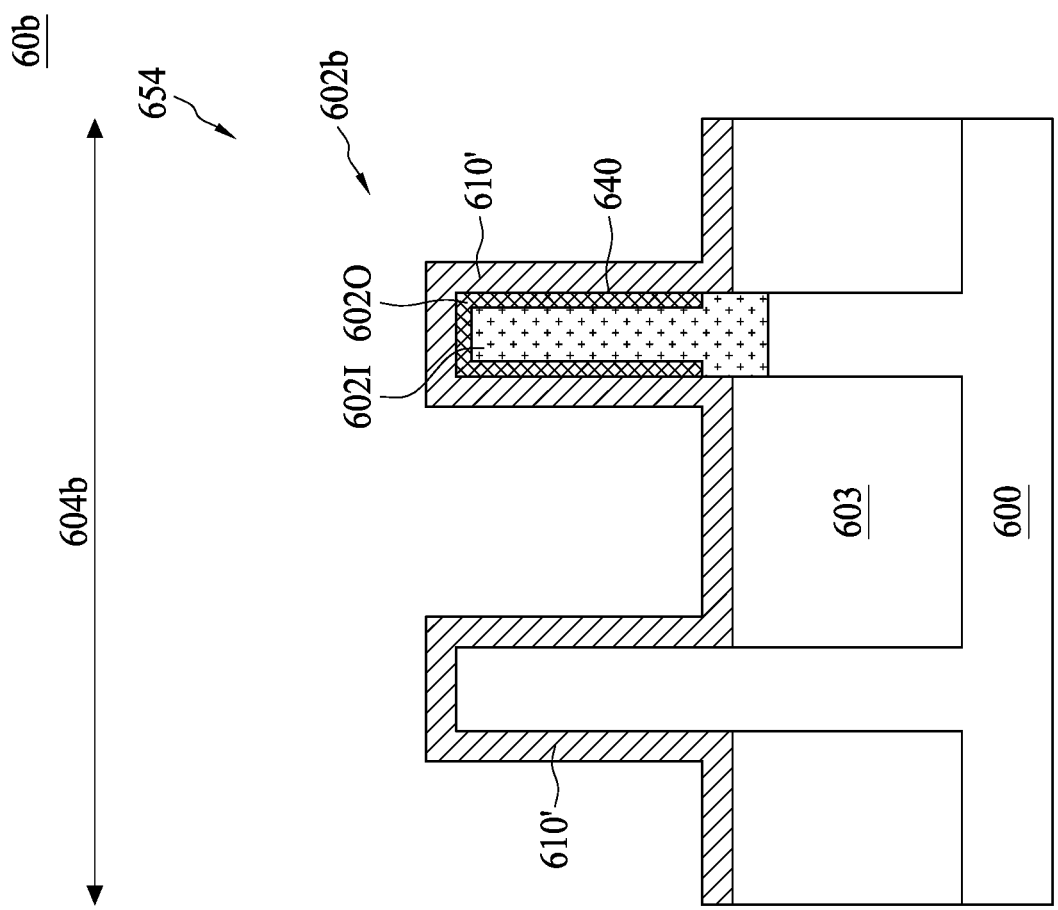

In contrast to the device in the I/O region 604a, the FinFET device 60b having a metal gate electrode in the core region 604b can be formed by the operations 521, 522, 523, 524, 525, 526, 527 and 528, but the disclosure is not limited thereto. Accordingly, only the device 60b in the core region 604b is shown in FIGS. 14A to 14H. In some embodiments, the semiconductor gate layer 650 (i.e., the polysilicon gate electrode) serves as a sacrificial gate, also known as a dummy gate, in a replacement gate (RPG) approach. Referring to FIGS. 9 and 14A, as described above, after the CESL and the ILD layer are deposited, a portion of the dielectric structure, a portion of the spacer and the patterned hard mask are removed to expose a top surface of the semiconductor gate layer 650, and the semiconductor gate structure 650 is removed in operation 321. Consequently, a gate trench 654 is formed within the dielectric layer and the spacers. Further, the dielectric layer 610' is exposed through the gate trench 654.

Figure 14B:
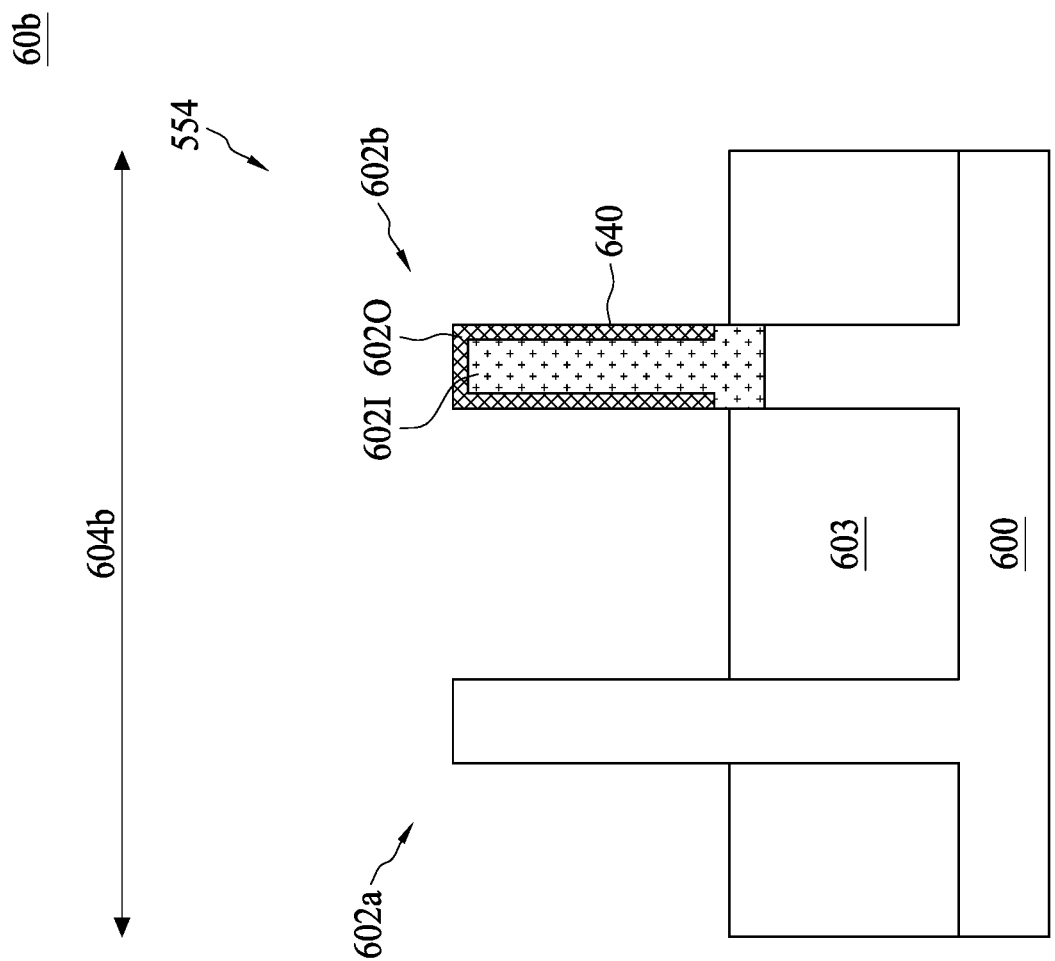

Referring to FIGS. 9 and 14B, the dielectric layer 610' is removed in operation 522. Consequently, the fin structures 602a and 602b in the core region 604b are exposed through the gate trench 654.

Figure 14C:
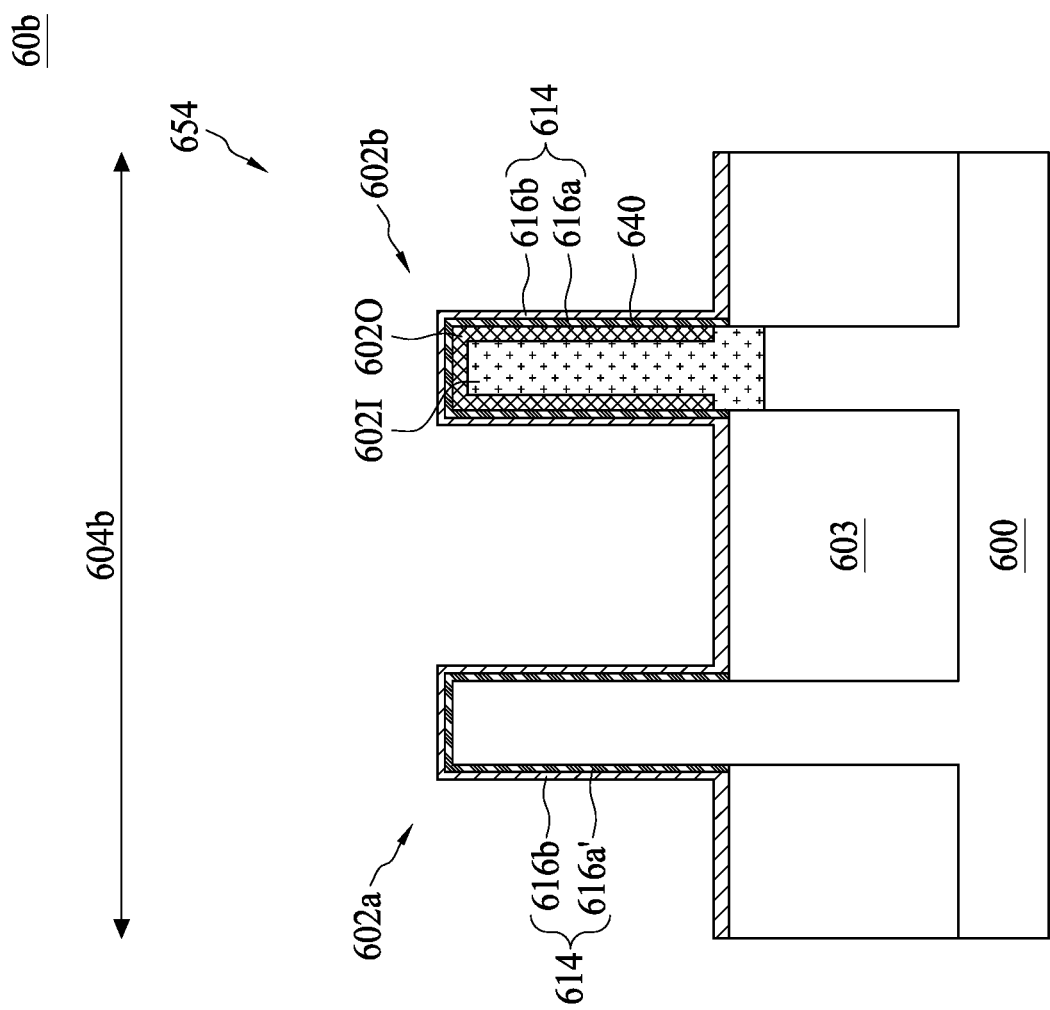

Referring to FIGS. 9 and 14C, another dielectric layer 614 is formed on the fin structures 602a and 602b in operation 523. The dielectric layer 614 can include semiconductor oxide. For example, the dielectric layer 614 may include a silicon oxide layer, but the disclosure is not limited thereto. In some embodiments, the dielectric layer 614 may include a first dielectric layer 616a and a second dielectric layer 616b over the fin structure 602b, or include a first dielectric layer 616a' and a second dielectric layer 616b over the fin structure 602a. As shown in FIG. 14C, the first dielectric layer 616a is sandwiched between the second dielectric layer 616b and the fin structure 602b while the first dielectric layer 616a' is sandwiched between the second dielectric layer 616b and the fin structure 602a. In some embodiments, the first dielectric layer 616a may be a III-V compound semiconductor oxide layer. In some embodiments, the III-V compound semiconductor oxide layer may be a native oxide layer that is spontaneously grown on a surface of the fin structures 602a and 602b. For example, the first dielectric layer 616a may be a native silicon germanium oxide layer spontaneously grown on a surface of the fin structure 602b. In some embodiments, the first dielectric layer 616a' may be a native silicon oxide layer spontaneously grown on a surface of the fin structure 602a. In some embodiments, the second dielectric layer 616b can be a silicon oxide layer. In some embodiments, the second dielectric layer 616b may be a chemical oxide layer formed by suitable thermal oxidation or deposition. The method for forming the second dielectric layer 616b can be similar to methods described above; therefore, similar details are omitted in the interest of brevity. In some embodiments, a thickness of the dielectric layer 614 is less than approximately 20 Å, but the disclosure is not limited thereto. In some embodiments, when the second dielectric layer 616b of the dielectric layer 614 is formed by deposition, the second dielectric layer 616b may cover top surfaces and sidewalls of the fin structures 602a and 602b, and top surfaces of the isolation structure 603, as shown in FIG. 14C, but the disclosure is not limited thereto.

Figure 14D:
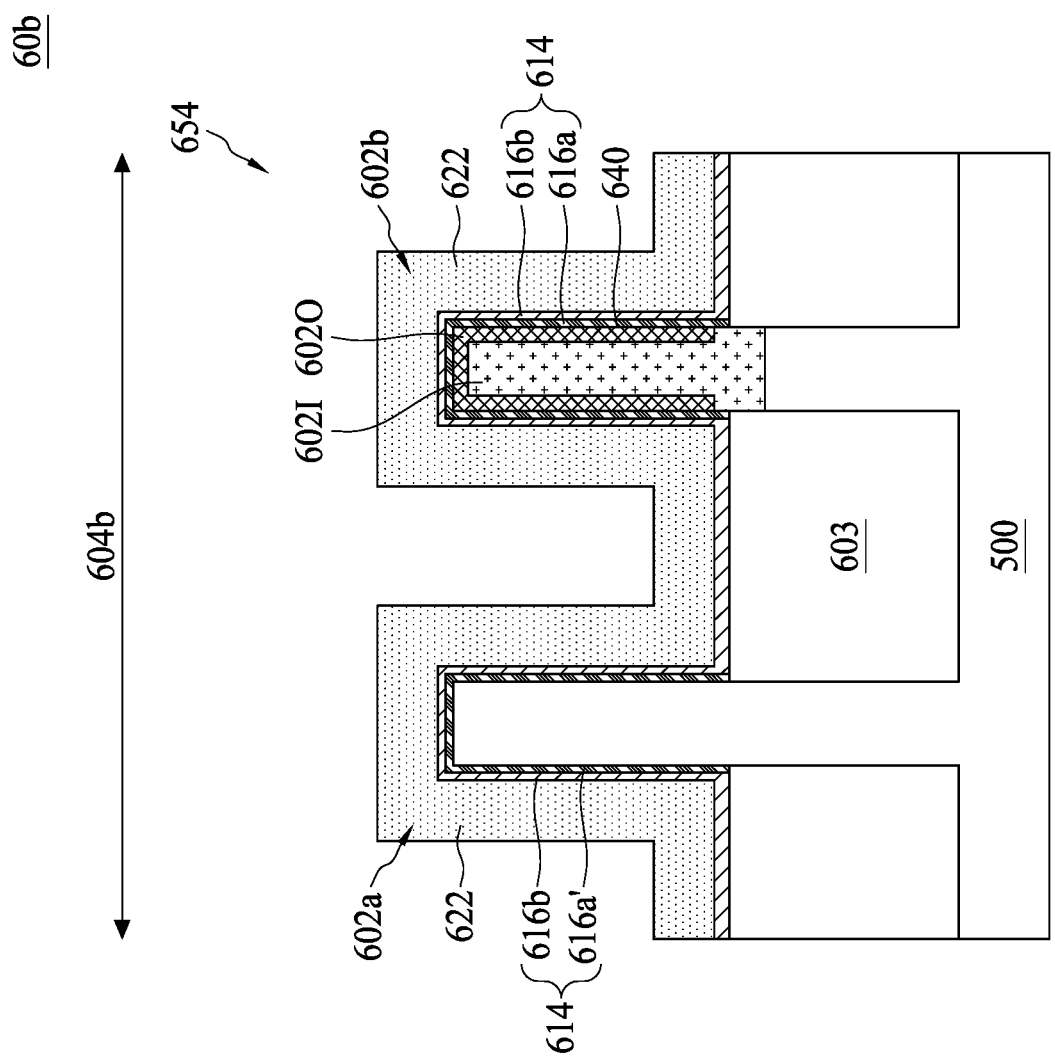

Referring to FIGS. 9 and 14D, a third sacrificial cap 622 including Si is formed on the dielectric layer 614 in operation 524. In some embodiments, the third sacrificial cap 622 may include an amorphous silicon layer or a polysilicon layer. In some embodiments, a thickness of the third sacrificial cap 622 is greater than 10 Å, but the disclosure is not limited thereto. The method of forming the third sacrificial cap 622 can be similar to methods described above; therefore, those details are omitted in the interest of brevity.

Figure 14E:
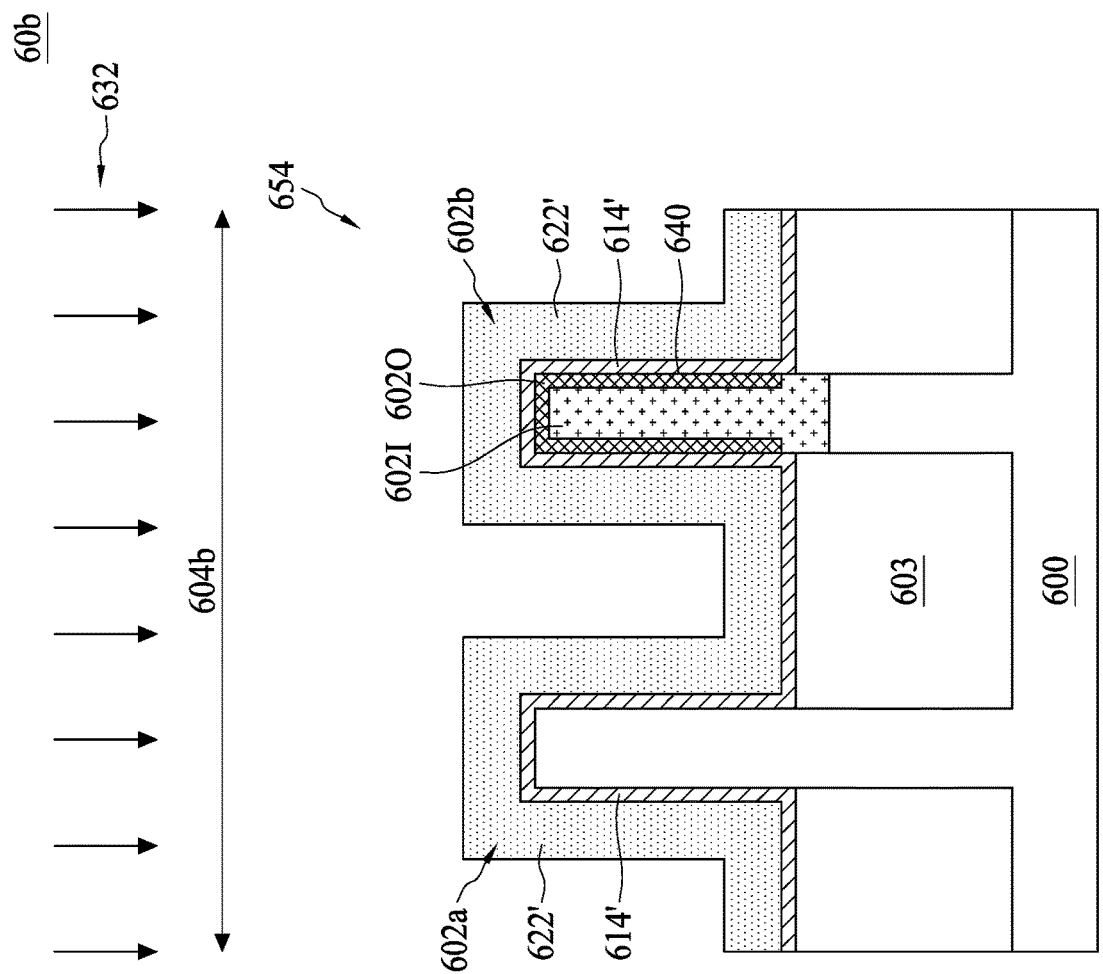

Referring to FIGS. 9 and 14E, the substrate 600 is annealed to transform the third sacrificial cap 622 into a fourth sacrificial cap 622' in operation 525. In some embodiments, an anneal 632 is performed, wherein the details of the anneal 632 can be similar to those of anneals described above; therefore, similar details are omitted in the interest of brevity. During the anneal 632, Ge atoms may diffuse from the fin structure 602b and from the first dielectric layer 616a. Further, Ge atoms may diffuse upwardly and pass the second dielectric layer 616b, and stay with Si atoms in the third sacrificial cap 622. Accordingly, the third sacrificial cap 622 including silicon is transformed into the fourth sacrificial cap 622' including silicon germanium. In other words, the fourth sacrificial cap 622' may include Ge atoms from the fin structure 602b and from the first dielectric layer 616a. It should be noted that the thickness of the third sacrificial cap 622 (now the fourth sacrificial cap 622') is greater than 10 Å in order to provide sufficient accommodations for the Ge atoms.

It should be noted that the first portion 6020' of the fin structure 602b in the core region 604b may undergo the anneal twice (i.e., the anneal 630 and the anneal 632); therefore, more Ge atoms may diffuse from the first portion 6020' of the fin structure 602b in the core region 604b.

Accordingly, the Ge concentration in the first portion 6020' of the fin structure 602b in the core region 604b may be further reduced.

Further, Ge atoms in the first dielectric layer 616a may also diffuse into the third sacrificial cap 622, and thus the first dielectric layer 616a, which includes a silicon germanium oxide layer, may be transformed into a silicon oxide layer. Accordingly, a dielectric layer 614' including silicon oxide may be formed after the operation 525. In some embodiments, the dielectric layer 614' includes the original second dielectric layer 616b including silicon oxide and the first dielectric layer 616a previously including silicon germanium oxide and now including silicon oxide. In some embodiments, the Ge concentration in the dielectric layer 614' is less than 3%. In some embodiments, the Ge concentration in the dielectric layer 614' is less than 1.5%.

Figure 14F:
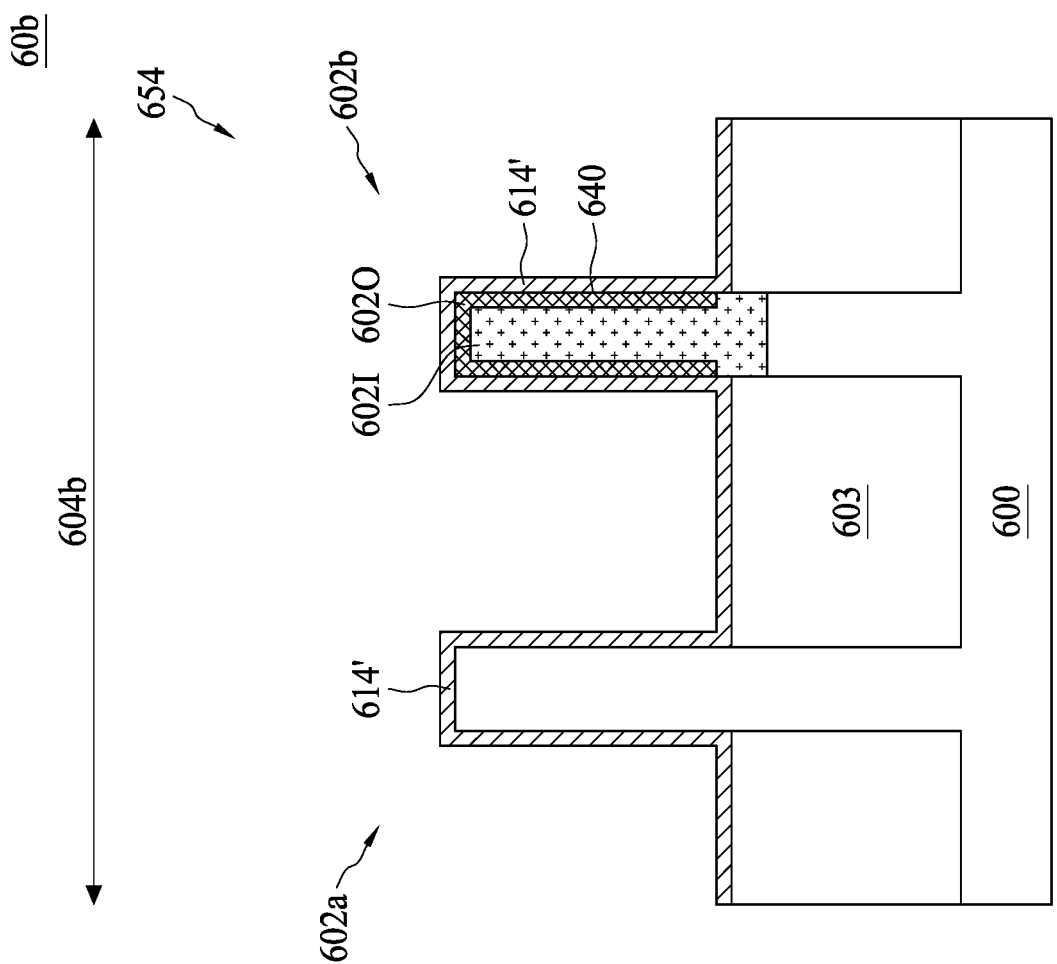

Referring to FIGS. 9 and 14F, the fourth sacrificial cap 622' is removed to expose the dielectric layer 614' in operation 526. In some embodiments, the dielectric layer 614' serves as an IL for a transistor device, and a thickness of the dielectric layer 614' may be less than approximately 20 Å, but the disclosure is not limited thereto.

Referring to FIGS. 9 and 14G, a high-k dielectric layer 680 is formed on the dielectric layer 614' in operation 527. In some embodiments, materials used to form the high-k dielectric layer 680 can be similar to materials described above; therefore, similar details are omitted for brevity.

Figure 14H:
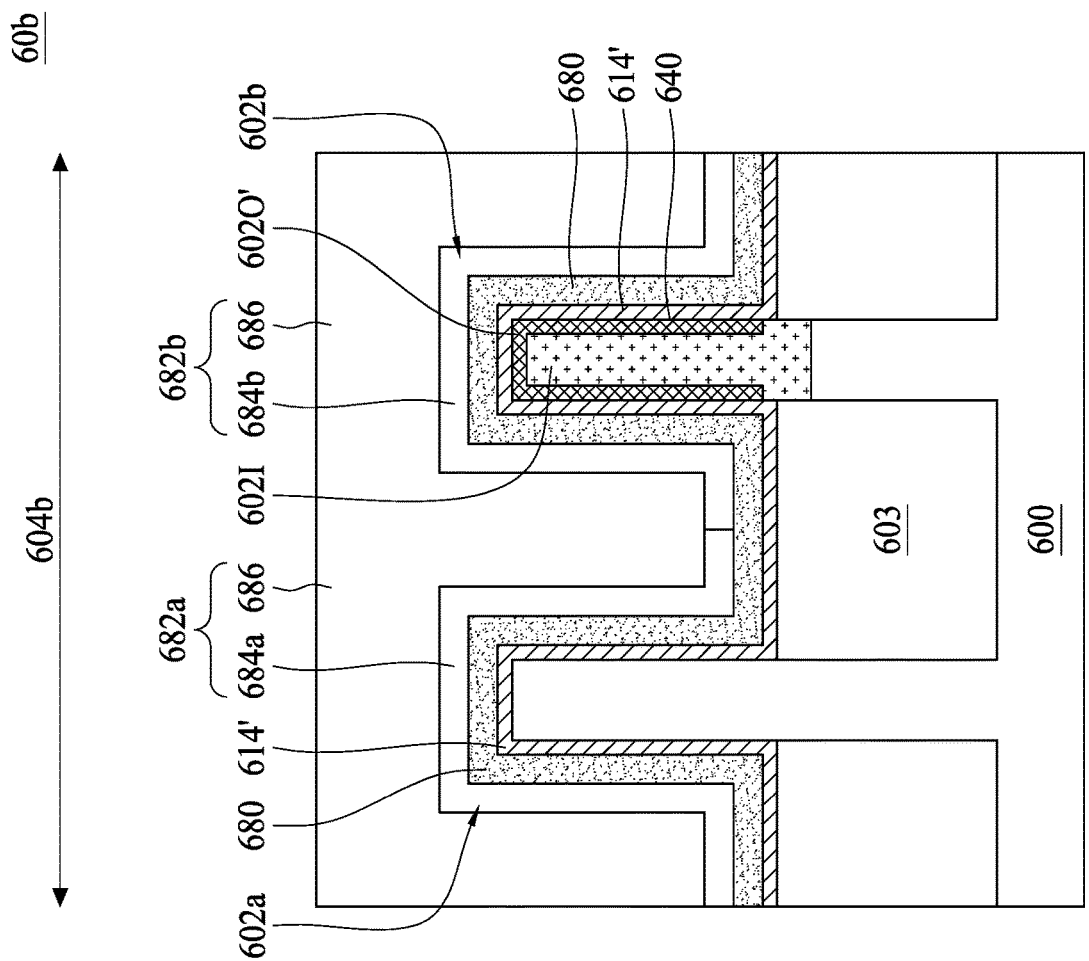

Referring to FIGS. 9 and 14H, metal gate structures 682a and 682b are formed over the high-k dielectric layer 680 in operation 528. In some embodiments, the metal gate structure 682a can include at least a barrier metal layer (not shown), a work function metal layer 684a for the nMOS device and a gap-filling metal layer 686, while the metal gate structure 682b can include at least a barrier metal layer (not shown), a work function metal layer 684b for a pMOS device and a gap-filling metal layer 686. Materials for forming the barrier layer, the work function metal layers 684a and 684b, and the gap-filling layer 686 can be similar to materials described above; therefore, similar details are omitted for brevity.

Accordingly, FinFET devices with metal gates are obtained in the core region 604b, according to the method 50. The FinFET device can be an n-type FinFET device or a p-type FinFET device. The n-type and p-type FinFET devices can be electrically connected to form a CMOS device in the core region 604b, as shown FIG. 14H.

According to the method 50, when the FinFET device including metal gate 60a is required in the I/O region 604a, operations 527 and 528 can be performed after operation 521, and when the FinFET device including metal gate 60b is required in the core region 604b, operations 522 to operation 528 can be performed after operation 521. In some embodiments, the semiconductor gate layer 650 in both of the device 60a and 60b can be removed simultaneously, in operation 521, and a protecting layer (not shown) can be formed in the I/O region 604a after the removal of the semiconductor gate layer in order to protect the dielectric layer 610' in the device 60a in the I/O region 604a. The operations 522 to 526 can be performed on the device 60b in the core region 604b without impacting the device 60a in the I/O region 604a. In such embodiments, the protecting layer can be removed after the removal of the fourth sacrificial cap 622' (i.e., operation 526), and the high-k gate dielectric layer 680 and the metal gate layers 682a and 682b can be formed in the gate trenches 654 in the SiGe MOSFET device 60a in the I/O region 604a and in the MOSFET device 60b in the core region 604b.

Figure 15:
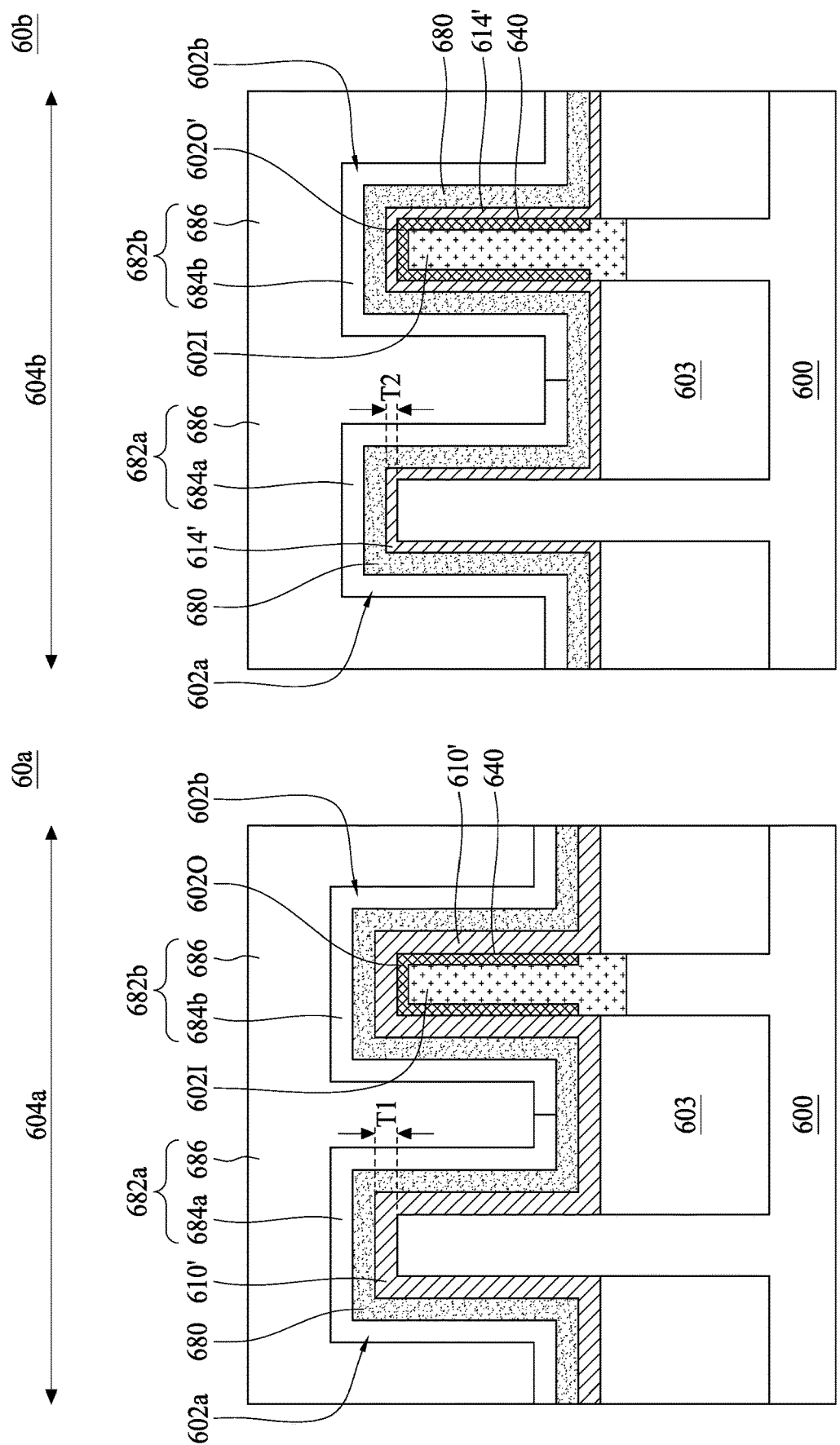
FIG. 15 is a schematic drawing illustrating a semiconductor structure according to aspects of the present disclosure in one or more embodiments.

Referring to FIG. 15, accordingly, a semiconductor structure is provided. The semiconductor structure includes a substrate 600 including a first region 604a (i.e., an I/O region) and a second region 604n (i.e., a core region). The semiconductor structure may include fin structures 602a including silicon channel layers disposed in the first region 604a and the second region 604b, and fin structures 602b including silicon germanium channel layers disposed in the first region 604a and the second region 604b. In some embodiments, the fin structure 602b in the first region 604a includes a first portion 6020 and a second portion 6021, wherein the Ge concentration in the first portion 6020 is less than that in the second portion 6021. In some embodiments, the fin structure 602b in the second region 604b includes a first portion 6020' and the second portion 6021, wherein the Ge concentration in the first portion 6020' is less than that in the second portion 6021. In some embodiments, the second portions 6021 of the fin structures 602b in both of the first and second regions 604a and 604b may include the same Ge concentration. However, because the first portion 6020' of the fin structure 602b in the core region 604b may undergo the anneal twice (i.e., the anneal 630 and the anneal 632), more Ge atoms may diffuse from the first portion 6020' of the fin structure 602b in the core region 604b. Accordingly, the Ge concentration in the first portion 6020' of the fin structure 602b in the core region 604b may be less than the Ge concentration in the first portion 6020 of the fin structure 602a in the I/O region 604a.

Still referring to FIG. 15, the semiconductor structure further includes a dielectric layer 610' having a thickness T1 disposed on the fin structures 602a and 602b in the first region 604a and a dielectric layer 614' having a thickness T2 disposed on the fin structures 602a and 602b in the second region 604b. In some embodiments, the dielectric layer 610' and the dielectric layer 614' may serve as an IL, and a high-k dielectric layer 680 is disposed on the dielectric layer 610' and the dielectric layer 614', respectively, as shown in FIG. 15. In such embodiments, a metal gate electrode can be formed on the high-k dielectric layer 680, as shown in FIG. 15. The metal gate electrode may include different work function metal layers for n-type or p-type FinFET devices. In some embodiments, different p-type work function metal layers can be formed in the I/O region 604a and the core region 604b. Similarly, different n-type work function metal layers can be formed in the I/O region 604a and the core region 604b.

In some embodiments, the thickness T1 of the dielectric layer 610' in the first region 604a is greater than the thickness T2 of the dielectric layer 614' in the second region 604b. In some embodiments, the thickness T1 of the dielectric layer 610' in the first region 604a is between approximately 10 Å and approximately 50 Å, but the disclosure is not limited thereto. In some embodiments, the thickness T2 of the dielectric layer 614' in the second region 604b is less than 20 Å, but the disclosure is not limited thereto. Additionally, the dielectric layer 610' is in contact with the fin structures 602a and 602b and the isolation structure 603 in the I/O region 604a, and the dielectric layer 614' is in contact with the fin structures 602a and 602b and the isolation structure 603 in the core region 604b. In some embodiments, a thickness of the portion of the dielectric layer 610' that is in contact with the isolation structure 603 is less than a thickness of the portion of the dielectric layer 610' that are in contact with the fin structures 602a and 602b in the first region 604a. Similarly, a thickness of the portion of the dielectric layer 614' that is in contact with the isolation structure 603 is less than a thickness of the portions of the dielectric layer 614' that are in contact with the fin structure 602a and 602b in the second region 604b.

Still referring to FIG. 15, the semiconductor structure further includes a gate electrode disposed on the high-dielectric layers 680 in the first region 604a and the second region 604b, respectively. The gate electrode can be a metal gate layer 682a or 682b, but the disclosure is not limited thereto.

According to the method 50, the Ge concentrations in the dielectric layers 610' and 614' are less than 3% or even less than 1.5%, while the Ge concentration in the dielectric layer 614' may be less than that in the dielectric layer 610'. Consequently, gate leakage current (Jg) is reduced by the dielectric layers 610' and 614' and reliability of the FinFET devices 60a and 60b in both of the first region 604a and second region 604b is improved. Further, interface trap density (Dit) and density of interface states are also reduced by the method 50. Therefore the carrier mobility of the FinFET devices 60a and 60b is improved by the SiGe channel layer 602 while the carrier mobility degradation issue caused by high Dit and density of interface states is mitigated.

In a FinFET device, a gate electrode is adjacent to three side surfaces of a fin structure with a gate dielectric layer interposed therebetween. Because the gate structure surrounds the fin structure on three surfaces, the transistor essentially has three gates controlling the current through the fin or channel region. However, the fourth side, which is the bottom part of the channel region, is far away from gate electrode and is not under close gate control. Unlike in a FinFET device, in a GAA FET device all side surfaces of the channel region are surrounded by the gate electrode, which allows for fuller depletion in the channel region and results in fewer short-channel effects due to a steeper sub-threshold current swing (SS) and smaller drain-induced barrier lowing (DIBL).

The cap-free dielectric design described above can be integrated in non-planar transistor devices such as GAA FET devices. FIGS. 16, 17A to 17F and 18 are schematic drawings illustrating the method of forming the semiconductor structure at various fabrication stages.

Figure 16:
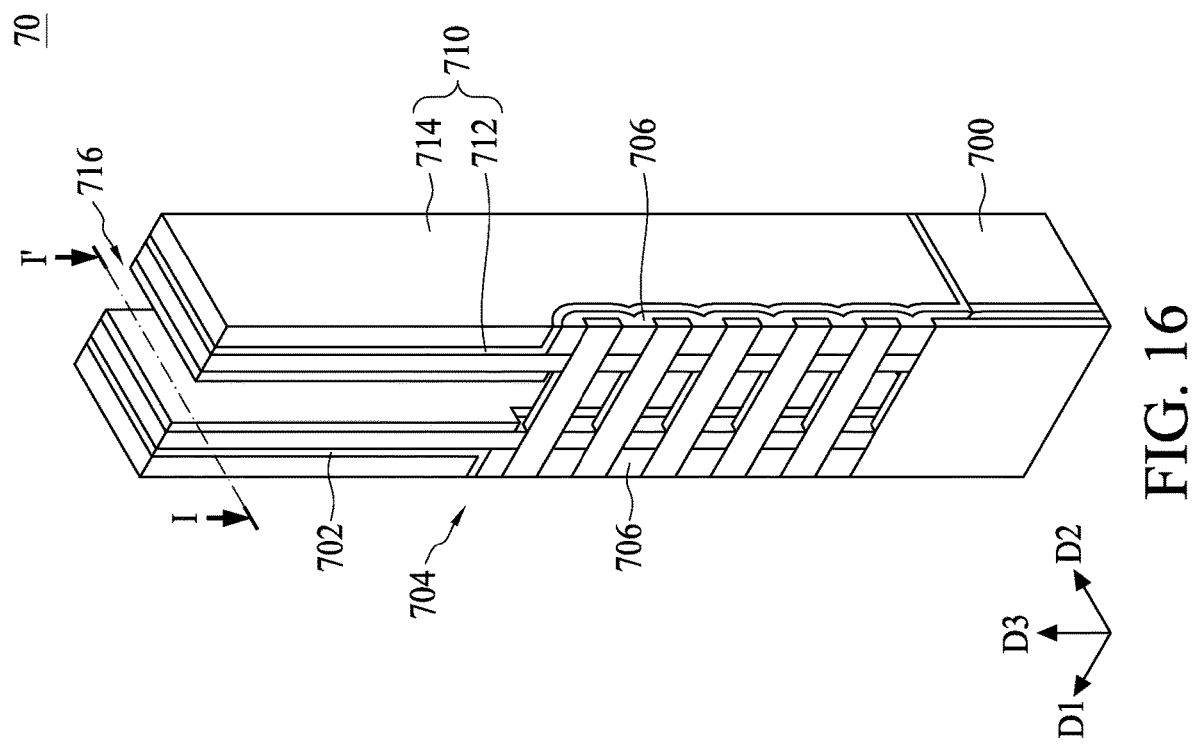
FIG. 16 is a schematic drawing illustrating a semiconductor structure at a fabrication stage constructed according to aspects of the present disclosure in one or more embodiments.

Referring to FIG. 16, a substrate 700 is received. In some embodiments, the substrate 700 may be a semiconductor substrate such as a Si substrate. A dummy gate (not shown), a spacer 702, a plurality of nanowires 704 and source/drain regions 706 may be formed over the substrate 700. Further, a dielectric structure 710 is disposed over the substrate 700. In some embodiments, the dielectric structure 710 can include a CESL 712 and various dielectric layers (e.g., an inter-layer dielectric (ILD) layer) 714 formed over the substrate 700 after the forming of the source/drain regions 706. Materials for forming the CESL 712 and the ILD layer 714 can be similar to materials described above; therefore, similar details are omitted for brevity.

In some embodiments, the source/drain regions 706 may be formed by performing an epitaxial growth operation that provides an epitaxy material. In various embodiments, the source/drain regions 706 may include Ge, Si, GaAs, AlGaAs, SiGe, GaAsP, SiP, or other suitable material. In some embodiments, the source/drain regions 706 may be in-situ doped during the epi process. For example, in some embodiments, the source/drain regions 706 may be doped with boron. In some embodiments, the source/drain regions 706 may be doped with carbon to form a Si:C source/drain, phosphorus to form a Si:P source/drain, or both carbon and phosphorous to form SiCP source/drain. In some embodiments, the source/drain regions 706 are not in-situ doped, and an implantation process is instead performed to dope the source/drain regions 706.

Referring to FIG. 16, the dummy gate is removed to form a gate trench 716 in the dielectric structure 710 and the spacer 702, and the nanowires 704 are exposed through the gate trench 716.

Referring to FIGS. 17A to 17F, which are cross-sectional views taken along a line I-I' of FIG. 16, the nanowires 704 are exposed through the gate trench 718. In some embodiments, each nanowire includes the semiconductor layer 704 serving as a channel region. In other words, the nanowire 704 includes the channel layer. In some embodiments, the nanowires 704 can be slightly etched to obtain various desirable dimensions and shapes, and the various desired dimensions and shapes may be chosen based on device performance considerations.

Referring to FIG. 17B, a dielectric layer 730 is formed to surround or wrap each nanowire 704. In some embodiments, the dielectric layer 730 may include a first dielectric layer 732a and a second dielectric layer 732b. The dielectric layer 730 (including the first dielectric layer 732a and the second dielectric layer 732b) can be similar to the aforementioned dielectric layer 610, therefore those details are omitted for brevity. Because the second dielectric layer 732b is formed by deposition, the second dielectric layer 732b may cover sidewalls and bottom of the gate trench 716, though not shown. In other embodiments, the thickness of the dielectric layer 730 is less than 20 Å, but the disclosure is not limited thereto.

Referring to FIG. 17C, a first sacrificial cap 740 including Si is formed on the dielectric layer 730. In some embodiments, the first sacrificial cap 740 may include an amorphous silicon layer or a polysilicon layer. In some embodiments, a thickness of the first sacrificial cap 740 is greater than 20 Å, but the disclosure is not limited thereto. The method of forming the first sacrificial cap 740 can be similar to methods described above; therefore, similar details are omitted in the interest of brevity. In some embodiments, the first sacrificial cap 740 wraps around and surrounds each nanowire 704 and the dielectric layer 730. In some embodiments, space between the nanowires 704 is filled by the first sacrificial cap 740 when the distance between adjacent nanowire 704 is less than 20 Å, as shown in FIG. 17C, but the disclosure is not limited thereto.

Referring to FIG. 17D, the substrate 700 is annealed to transform the first sacrificial cap 740 into a second sacrificial cap 740' including silicon germanium. In some embodiments, an anneal 750 is performed, wherein the details of the anneal 750 can be similar to those of anneals described above; therefore, similar details are omitted in the interest of brevity. During the anneal 750, Ge atoms may diffuse from the nanowires 704 and from the first dielectric layer 732a. Further, Ge atoms may diffuse upwardly and pass the second dielectric layer 732b, and stay with Si atoms in the first sacrificial cap 740. Accordingly, the first sacrificial cap 740 including Si is transformed into the second sacrificial cap 740' including SiGe. In other words, the second sacrificial cap 740' may include Ge atoms from the nanowires 704 and from the first dielectric layer 732a. It should be noted that the thickness of the first sacrificial cap 740 (now the second sacrificial cap 740') is greater than 20 Å in order to provide sufficient accommodations for the Ge atoms.

As described above, Ge atoms may diffuse from the nanowires 704. Accordingly, a portion of each nanowire 704 may lose Ge atoms. In some embodiments, it is observed that a portion of each nanowire 704, usually an outer portion, is likely to exhibit Ge diffusion. Accordingly, the portion having lower Ge concentration is recognized and defined as a first portion 704O while the other portion, usually a portion inside of the first portion 704O, having the Ge concentration greater than that of the first portion 704O, is recognized and defined as a second portion 704I. In some embodiments, the Ge concentration in the second portion 704I may be substantially equal to an original Ge concentration in the nanowires 704. The first portion 704O of each nanowire 704 has a first Ge concentration prior to the annealing of the substrate 700 and a second Ge concentration after the annealing of the substrate 700. In some embodiments, the first Ge concentration in the first portion 704O is substantially equal to the Ge concentration in the second portion 704I, which is the original Ge concentration. The second Ge concentration in the first portion 704O is lower than the first Ge concentration in the first portion 704O and the Ge concentration in the second portion 704I. For example but not limited thereto, the first Ge concentration in the first portion 704O and the Ge concentration in the second portion 704I may be greater than approximately 30%, while the second Ge concentration in the first portion 704O may be less than approximately 25%. Accordingly, a Ge concentration in an interface 742 between the dielectric layer 730 and each nanowire 704 is reduced from greater than approximately 30% to less than approximately 25%, but the disclosure is not limited thereto.

Further, Ge atoms in the first dielectric layer 732a may also diffuse into the first sacrificial cap 740, and thus the first dielectric layer 732a including silicon germanium oxide layer may be transformed into a silicon oxide layer. Accordingly, a dielectric layer 730' including silicon oxide may be formed. In some embodiments, the dielectric layer 730' includes the original second dielectric layer 732b including silicon oxide and the first dielectric layer 732a previously including silicon oxide and now including silicon oxide. In some embodiments, the Ge concentration in the dielectric layer 730' is less than 3%. In some embodiments, the Ge concentration in the dielectric layer 730' is less than 1.5%.

Figure 17F:
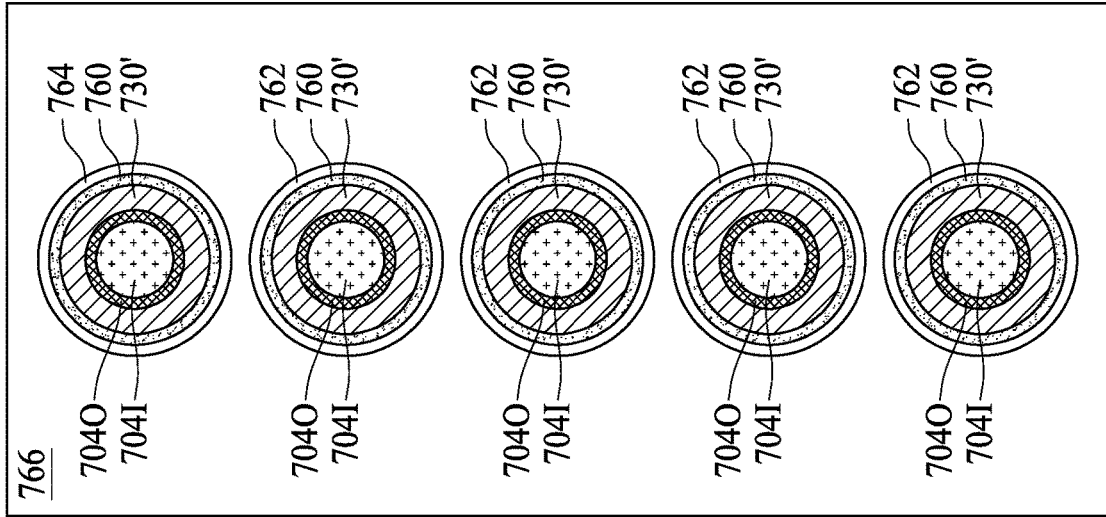
Figure 17E:
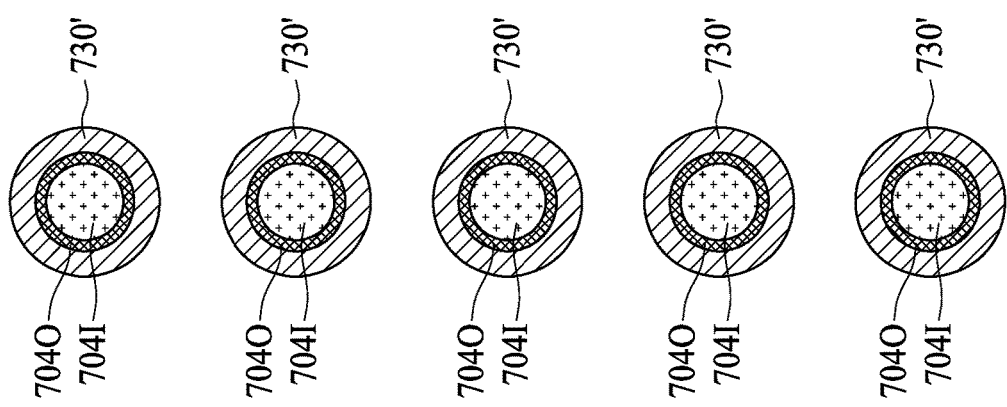

Referring to FIG. 17E, the second sacrificial cap 740' is removed to expose the dielectric layer 730'. In some embodiments, the dielectric layer 730' serves as an IL for a transistor device.

Referring to FIG. 17F, a high-k dielectric layer 760 is formed on the dielectric layer 730'. Materials used to form the high-k dielectric layer 760 can be similar to materials described above; therefore, similar details are omitted for brevity.

Referring to FIG. 17F, a metal gate structure 762 is formed over the high-k dielectric layer 760. In some embodiments, the metal gate structure 762 can include at least a barrier metal layer (not shown), a work function metal layer 764 and a gap-filling metal layer 766. Materials for forming the barrier layer, the work function metal layer 764 and the gap-filling layer 766 can be similar to materials described above; therefore, similar details are omitted for brevity.

Figure 18:
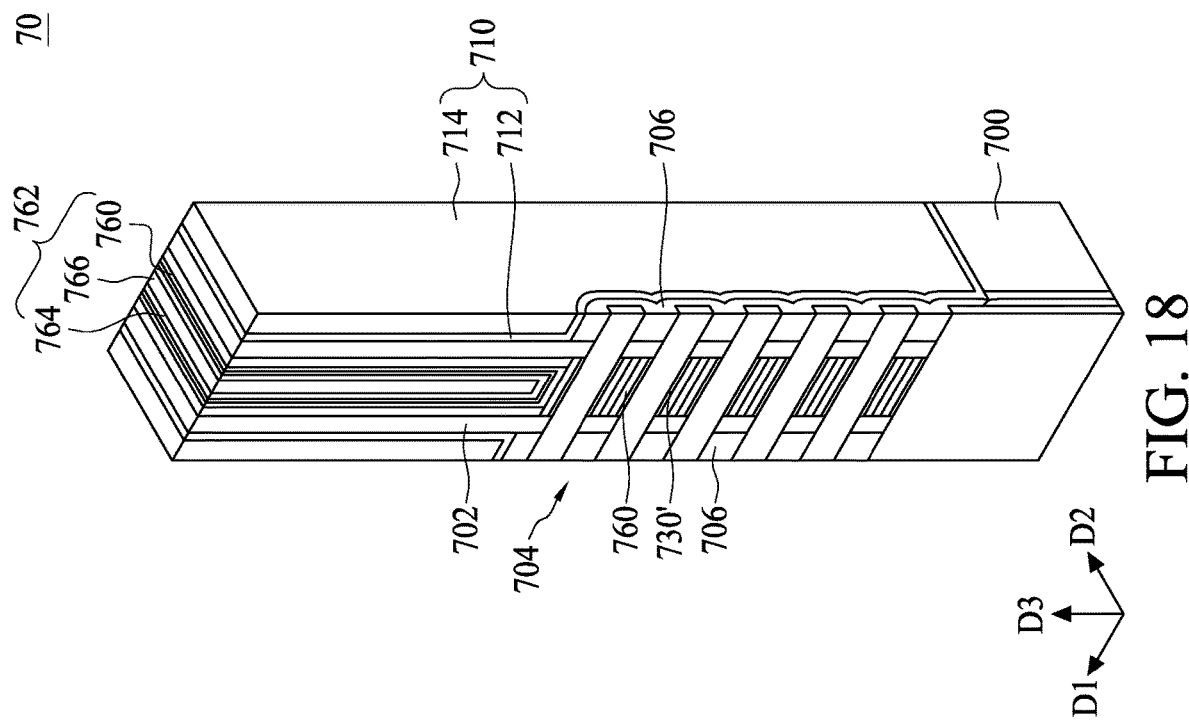
FIG. 18 is a schematic drawing illustrating a semiconductor structure according to aspects of the present disclosure in one or more embodiments.

Accordingly, a GAA FET device 70 with metal gate is obtained. The GAA FET device can be an n-type GAA FET device or a p-type GAA FET device. Referring to FIGS. 17F and 18, accordingly, a semiconductor structure such as the GAA FET device 70 is provided. The semiconductor structure includes a substrate 700 and a plurality of nanowires 704 suspended over the substrate 700. Each nanowire 704 includes the semiconductor layer where a channel region is to be formed. In some embodiments, each nanowire 704 includes a channel layer. Each nanowire 704 (i.e., the semiconductor layer, or the channel layer) includes Ge compound such as SiGe. In some embodiments, each nanowire 704 includes a first portion 704O and a second portion 704I, wherein the Ge concentration in the first portion 704O is less than that in the second portion 704I.

Still referring to FIGS. 17F and 18, the semiconductor structure 70 further includes a dielectric layer 730' serving as an IL, a high-k dielectric layer 760 disposed on the dielectric layer 730' and a metal gate layer 762 disposed on the high-k dielectric layer 760. Further, the metal gate layer 762 fills the gate trench 718, as shown in FIG. 18.

The Ge concentration in the dielectric layer 730' is less than 3% or even less than 1.5%. Consequently, gate leakage current (Jg) is reduced by the dielectric layer 730' and reliability of the GAA FET device 70 is improved. Further, interface trap density (Dit) and density of interface states are also reduced. Therefore the carrier mobility is improved by the silicon germanium channel layer in each nanowire 704 while carrier mobility degradation issue caused by high Dit and density of interface states is mitigated.

Accordingly, the present disclosure provides a cap-free design for the gate dielectric layer on a silicon germanium channel layer. According to the provided cap-free design, a dielectric layer is formed over a silicon germanium layer where a channel is to be formed, and a sacrificial semiconductor layer is formed on the dielectric layer. An anneal is subsequently performed. During the anneal, Ge atoms may diffuse from the silicon germanium layer, pass the first dielectric layer, and remain in the semiconductor sacrificial cap. The semiconductor sacrificial cap including the Ge atoms is then removed. Further, an interface between the silicon germanium layer and the dielectric layer can be improved during the anneal. Consequently, a dielectric layer having low interface trap density is obtained without SiGe loss. The dielectric layer used in a pMOS device including the silicon germanium layer where the channel is to be formed reduces gate leakage current and thus improves reliability. Accordingly, the cap-free design for the gate dielectric layer on a silicon germanium channel layer offers an opportunity to achieve high mobility and improve transistor performance.

According to one embodiment of the present disclosure, a semiconductor structure is provided. The semiconductor structure includes a substrate including a first region and a second region, a first channel layer disposed in the first region and a second channel layer disposed in the second region, a first dielectric layer disposed on the first channel layer and a second dielectric layer disposed on the second channel layer, and a first gate electrode disposed on the first dielectric layer and a second gate electrode disposed on the second dielectric layer. The first channel layer in the first region includes a Ge compound of a first Ge concentration, and the second channel layer in the second region includes a Ge compound of a second Ge concentration. The first Ge concentration in the first channel layer is greater than the second Ge concentration in the second channel layer.

According to one embodiment of the present disclosure, a semiconductor structure is provided. The semiconductor structure includes a fin structure, a high-k gate dielectric layer over the fin structure, a dielectric layer between the high-k gate dielectric layer and the fin structure, and a metal gate electrode over the high-k gate dielectric layer. The fin structure includes an outer portion and an inner portion inside the outer portion. The outer portion and the inner portion include a semiconductor material, and a concentration of the semiconductor material in the outer portion is less than a concentration of the semiconductor material in the inner portion.

According to one embodiment of the present disclosure, a semiconductor structure is provided. The semiconductor structure includes a first fin structure, a second fin structure, a high-k gate dielectric layer over the first fin structure and the second fin structure, a first dielectric layer between the high-k gate dielectric layer and the first fin structure, a second dielectric layer between the high-k gate dielectric layer and the second fin structure, a first metal gate electrode over the high-k gate dielectric layer, and a second metal gate electrode over the high-k gate dielectric layer. The first fin structure includes a first semiconductor material, and the second fin structure includes the first semiconductor material and a second semiconductor material. The second fin structure includes an outer portion and an inner portion inside the outer portion. A concentration of the second semiconductor material in the outer portion is less than a concentration of the second semiconductor material in the inner portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
   a substrate comprising a first region and a second region;
   a first channel layer disposed in the first region and a second channel layer disposed in the second region, wherein the first channel layer comprises germanium (Ge) compound of a first Ge concentration and the second channel layer comprises Ge compound of a second Ge concentration;
   a first dielectric layer disposed on the first channel layer and a second dielectric layer disposed on the second channel layer; and
   a first gate electrode disposed on the first dielectric layer and a second gate electrode disposed on the second dielectric layer,
   wherein the first Ge concentration in the first channel layer is greater than the second Ge concentration in the second channel layer, and a thickness of the first dielectric layer is greater than a thickness of the second dielectric layer.

2. The semiconductor structure of claim 1, wherein the first gate electrode and the second electrode comprise metal material.

3. The semiconductor structure of claim 1, further comprising:
   a first high-k dielectric layer between the first gate electrode and the first dielectric layer; and
   a second high-k dielectric layer between the second gate electrode and the second dielectric layer.

4. The semiconductor structure of claim 3, wherein a thickness of the first high-k dielectric layer and a thickness of the second high-k dielectric layer are similar.

5. The semiconductor structure of claim 3, wherein the first high-k dielectric layer and the second high-k dielectric layer comprise a same material.

6. The semiconductor structure of claim 1, wherein the first channel layer is formed in a first fin structure, and the second channel layer is formed in a second fin structure.

7. The semiconductor structure of claim 1, further comprising:
   a first source/drain disposed at two sides of the first gate electrode; and
   a second source/drain disposed at two sides of the second gate electrode.

8. The semiconductor structure of claim 1, wherein the first gate electrode comprises a first work function metal layer, the second gate electrode comprises a second work function metal layer.

9. The semiconductor structure of claim 8, wherein the first work function metal layer and the second work function metal layer comprise a same material.

10. A semiconductor structure comprising:
    a fin structure comprising:
      an outer portion comprising a semiconductor material; and
      an inner portion inside the outer portion and comprising the semiconductor material;
    a high-k dielectric layer over the fin structure;
    a dielectric layer between the high-k dielectric layer and the fin structure; and
    a metal gate electrode over the high-k dielectric layer,
    wherein a concentration of the semiconductor material in the outer portion is less than a concentration of the semiconductor material in the inner portion, the dielectric layer comprises the semiconductor material, and a concentration of the semiconductor material in the dielectric layer is less than approximately 3%.

11. The semiconductor structure of claim 10, wherein the concentration of the semiconductor material in the outer portion is less than approximately 25%.

12. The semiconductor structure of claim 10, wherein the concentration of the semiconductor material in the inner portion is greater than approximately 30%.

13. The semiconductor structure of claim 10, wherein the semiconductor material comprises germanium.

14. A semiconductor structure comprising:
    a first fin structure and a second fin structure, wherein the first fin structure comprises a first semiconductor material, and the second fin structure comprises the first semiconductor material and a second semiconductor material;
    a high-k dielectric layer over the first fin structure and the second fin structure;
    a first dielectric layer between the high-k dielectric layer and first fin structure, and a second dielectric layer between the high-k dielectric layer and the second fin structure; and
    a first metal gate electrode over the high-k dielectric layer and a second metal gate electrode over the high-k dielectric layer,
    wherein the second fin structure further comprises an outer portion and an inner portion inside the outer portion, and a concentration of the second semiconductor material in the outer portion is less than a concentration of the second semiconductor material in the inner portion.

15. The semiconductor structure of claim 14, wherein a lattice constant of the first semiconductor material is different from a lattice constant of the second semiconductor material.

16. The semiconductor structure of claim 14, wherein the concentration of the second semiconductor material in the outer portion is less than approximately 25%.

17. The semiconductor structure of claim 14, wherein the concentration of the second semiconductor material in the inner portion is greater than approximately 30%.

18. The semiconductor structure of claim 14, wherein the second dielectric layer comprises the second semiconductor material.

19. The semiconductor structure of claim 18, wherein a concentration of the second semiconductor material in the second dielectric layer is less than approximately 3%.

20. The semiconductor structure of claim 14, wherein a thickness of the first dielectric layer and a thickness of the second dielectric layer are similar.

* * * * *